(12) United States Patent
Kim et al.

(10) Patent No.: US 11,995,257 B2
(45) Date of Patent: May 28, 2024

(54) TRANSPARENT TOUCH DISPLAY DEVICE

(71) Applicant: LG Display Co., Ltd., Seoul (KR)

(72) Inventors: JuHong Kim, Incheon (KR); HwiDeuk Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/068,880

(22) Filed: Dec. 20, 2022

(65) Prior Publication Data

US 2023/0214039 A1    Jul. 6, 2023

(30) Foreign Application Priority Data

Dec. 31, 2021    (KR) .................. 10-2021-0194464

(51) Int. Cl.
*G06F 3/041* (2006.01)
*G06F 3/044* (2006.01)

(52) U.S. Cl.
CPC ............ *G06F 3/0412* (2013.01); *G06F 3/044* (2013.01)

(58) Field of Classification Search
CPC .............................. G06F 3/0412; G06F 3/044
See application file for complete search history.

(56) References Cited

U.S. PATENT DOCUMENTS

| | | | |
|---|---|---|---|
| 10,908,724 B2 * | 2/2021 | Nakanishi | ............. G06F 3/0446 |
| 2017/0293384 A1 | 10/2017 | Ryu et al. | |
| 2018/0143729 A1 * | 5/2018 | Lee | ................... H10K 59/1213 |
| 2018/0364845 A1 | 12/2018 | Lee | |
| 2020/0012374 A1 | 1/2020 | Nakanishi | |
| 2020/0020747 A1 | 1/2020 | Bok et al. | |
| 2022/0384531 A1 | 12/2022 | Xu et al. | |

FOREIGN PATENT DOCUMENTS

WO    WO 2021139660 A1    7/2021

* cited by examiner

*Primary Examiner* — Peter D McLoone
(74) *Attorney, Agent, or Firm* — Seed IP Law Group LLP

(57) ABSTRACT

The present disclosure relates to a transparent touch display device including: a substrate including a pixel area, a first transmission area located on a first side of the pixel area, and a second transmission area located on a second side of the pixel area; a display cathode electrode to which a base voltage for display driving is applied; a first touch cathode electrode located on a first side of the display cathode electrode and including a same material as the display cathode electrode; a second touch cathode electrode located on a second side of the display cathode electrode and including the same material as the display cathode electrode; a first touch bridge that runs across the pixel area and electrically connects the first touch cathode electrode and the second touch cathode electrode; a first touch line intersecting the first touch bridge and electrically connected to at least one of the first touch cathode electrode and the second touch cathode electrode; and a first upper touch shield disposed over the first touch line and overlapped with at least a portion of the first touch line, wherein the first upper touch shield has an equipotential with the first touch line.

20 Claims, 30 Drawing Sheets

TRANSPARENT TOUCH DISPLAY DEVICE

CROSS-REFERENCE TO RELATED APPLICATION

This application claims the priority benefit of Republic of Korea Patent Application No. 10-2021-0194464, filed on Dec. 31, 2021 in the Korean Intellectual Property Office, which is incorporated herein by reference in its entirety.

BACKGROUND

Technical Field

The present disclosure relates to electronic devices, and more specifically, to transparent display devices.

Description of the Related Art

In today's society, display devices are widely used and increasingly important for presenting visual information to users. As the technology of display devices advances and the necessity of providing a user-friendly environment increases, various functions are integrated into the display devices, and many of today's display devices tend to employ a touch-enabled input interface capable of receiving a touch-based input. Such touch display devices with the touch-enabled input interface allow users to input information or commands more intuitively and conveniently, compared with typical input devices, such as buttons, keyboards, mice, and the like.

In order to provide such a touch-based input function, the touch display device is needed to include a touch sensor structure and a touch circuit for sensing a touch. The touch sensor structure of the touch display device typically includes a plurality of touch electrodes and a plurality of touch lines for electrically connecting the touch electrodes to the touch circuit, and the touch sensing circuit is required to normally perform an intended operation in the touch sensor structure.

Presently, in order to reduce the thickness of the touch display device and improve image quality, work is progressing on developing a touch display device having a touch sensor including a plurality of touch electrodes integrated into a display panel. In addition, there is an increasingly need for a transparent touch display device that includes a display panel in which light emitting elements with a self-emissive capability such as organic light emitting diode (OLED) displays are disposed, and is capable of enabling light to transmit the front and back of the display panel.

BRIEF SUMMARY

In the field of touch and display technologies, although a touch display device having a display panel into which a touch sensor is integrated has been developed to reduce the thickness of the touch display device and improve image quality, in a case where such a touch sensor integrated touch display device has both the capability of a self-emission display device in which light emitting elements with the self-emissive capability such as OLEDs, and the like are disposed in the display panel, and the capability of a transparent touch display device enabling light to transmit the front and back thereof, it has been considerably challenging to design and manufacture the touch sensor integrated touch display device so that the display panel can satisfy the characteristics of both the self-emission and the transmittance. To address these issues, the inventors of the present disclosure have invented a transparent touch display device including a touch sensor integrated display panel having excellent self-emissive performance and high transmittance and enabling accurate touch sensing.

Embodiments of the present disclosure provide a transparent touch display device including a touch sensor integrated display panel having excellent self-emissive performance and high transmittance and enabling accurate touch sensing.

Embodiments of the present disclosure provide a transparent touch display device in which a touch sensor is configured to have two or more cathode electrodes separated from each other in a cathode electrode layer.

Embodiments of the present disclosure provide a transparent touch display device in which a touch sensor is integrated into a display panel without affecting the transmittance of the display panel.

Embodiments of the present disclosure provide a transparent touch display device capable of reducing the complexity of a panel manufacturing process and reducing the thickness of the display panel.

Embodiments of the present disclosure provide a transparent touch display device having a touch shield structure capable of reducing or eliminating coupling noise caused between one or more touch lines and one or more neighboring display driving related patterns.

According to aspects of the present disclosure, a transparent touch display device is provided that includes a display panel including a plurality of sub-pixels and a plurality of touch electrodes, and a touch driving circuit for driving the plurality of touch electrodes.

In some embodiments, the display panel of the transparent touch display device can include a substrate including a pixel area in which at least one of the plurality of sub-pixels is disposed, a first transmission area located on a first side of the pixel area, and a second transmission area located on a second side of the pixel area, a driving transistor disposed in the pixel area, an anode electrode disposed in the pixel area, and electrically connected to a source electrode or a drain electrode of the driving transistor, an emission layer located on the anode electrode, a display cathode electrode located on the emission layer, a first touch cathode electrode disposed in the first transmission area and located on a first side of the display cathode electrode, a second touch cathode electrode disposed in the second transmission area and located on a second side of the display cathode electrode, a first touch line electrically connected to at least one of the first touch cathode electrode and the second touch cathode electrode, and a first upper touch shield disposed over the first touch line and overlapped with at least a portion of the first touch line.

In some embodiments, the first upper touch shield included in the transparent touch display device may have an equipotential with the first touch line.

During a first period, a touch driving signal having a variable voltage level may be applied to the first touch line, and a shield driving signal having a variable voltage level may be applied to a connection line. In this case, the shield driving signal and the touch driving signal may be in phase.

During a second period different from the first period, a touch driving signal having a constant voltage level may be applied to the first touch line, and a shield driving signal having a constant voltage level may be applied to the connection line.

According to aspects of the present disclosure, a transparent touch display device is provided that includes a substrate including a pixel area, a first transmission area located on a first side of the pixel area, and a second transmission area located on a second side of the pixel area, a display cathode electrode to which a base voltage for display driving is applied, a first touch cathode electrode located on a first side of the display cathode electrode and including a same material as the display cathode electrode, a second touch cathode electrode located on a second side of the display cathode electrode and including the same material as the display cathode electrode, a first touch bridge running across the pixel area and electrically connecting the first touch cathode electrode and the second touch cathode electrode to each other, a first touch line crossing the first touch bridge and electrically connected to at least one of the first touch cathode electrode and the second touch cathode electrode, and a first upper touch shield disposed over the first touch line and overlapped with at least a portion of the first touch line.

In some embodiments, the first upper touch shield included in the transparent touch display device may have an equipotential with the first touch line.

According to aspects of the present disclosure, a transparent touch display device is provided that includes: a substrate including a pixel area, a first transmission area located on a first side of the pixel area, and a second transmission area located on a second side of the pixel area, a driving transistor disposed in the pixel area, an anode electrode disposed in the pixel area, located over the driving transistor. and electrically connected to a source electrode or a drain electrode of the driving transistor, an emission layer located on the anode electrode, a display cathode electrode located on the emission layer, a first touch cathode electrode disposed in the first transmission area and located on a first side of the display cathode electrode, a second touch cathode electrode disposed in the second transmission area and located on a second side of the display cathode electrode, a first touch line electrically connected to at least one of the first touch cathode electrode and the second touch cathode electrode, and a first upper touch shield disposed over, overlapped with, the first touch line, and having an equipotential with the first touch line.

According to embodiments of the present disclosure, a transparent touch display device can be provided that includes a touch sensor integrated display panel having excellent self-emissive performance and high transmittance and enabling accurate touch sensing.

According to embodiments of the present disclosure, a transparent touch display device can be provided in which a touch sensor is configured to have two or more cathode electrodes separated from each other in a cathode electrode layer.

According to embodiments of the present disclosure, a transparent touch display device can be provided in which a touch sensor is integrated into a display panel without affecting the transmittance of the display panel.

According to embodiments of the present disclosure, a transparent touch display device can be provided capable of reducing the complexity of a panel manufacturing process and reducing the thickness of the panel.

According to embodiments of the present disclosure, a transparent touch display device can be provided capable of reducing or eliminating influences between display driving and touch driving, and thereby enabling accurate touch sensing and producing high image quality, by having a touch shield structure capable of reducing or eliminating coupling noise caused between one or more touch lines and one or more neighboring display driving related patterns.

BRIEF DESCRIPTION OF THE SEVERAL VIEWS OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure. In the drawings.

DETAILED DESCRIPTION

Figure 1:
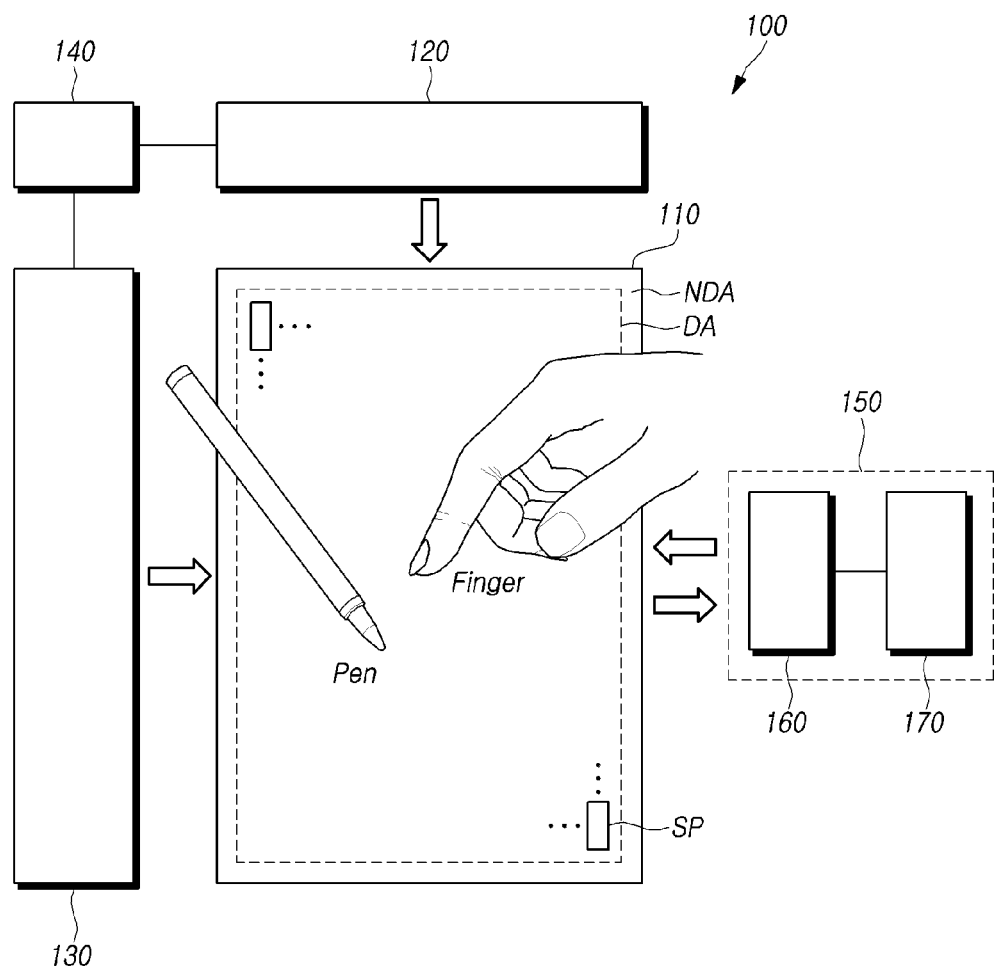
FIG. 1 illustrates a system configuration of a transparent touch display device according to aspects of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," and "constituting" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings.

FIG. 1 illustrates a system configuration of a transparent touch display device 100 according to aspects of the present disclosure.

Referring to FIG. 1, the transparent touch display device 100 includes a display panel 110 and a display driving circuit, as elements for display images.

The display driving circuit is a circuit for driving the display panel 110, and can include a data driving circuit 120, a gate driving circuit 130, a display controller 140, and the like.

The display panel 110 can include a display area DA in which an image is displayed and a non-display area NDA in which an image is not displayed. The non-display area NDA may be an area outside of the display area DA, and may also be referred to as an edge area or a bezel area.

The display panel 110 can include a plurality of subpixels SP. The display panel 110 can further include various types of signal lines to drive the plurality of sub-pixels SP.

Such various types of signal lines may include a plurality of data lines for transmitting data signals (also referred to as data voltages or image signals) and a plurality of gate lines for delivering gate signals (also referred to as scan signals). The plurality of data lines and the plurality of gate lines may overlap each other. Each of the plurality of data lines may be disposed such that it extends in a first direction. Each of the plurality of gate lines may be disposed such that it extends in a second direction different from the first direction. For example, the first direction may be a column or vertical direction, and the second direction may be a row or horizontal direction. In another example, the first direction may be the row or horizontal direction, and the second direction may be the column or vertical direction. In this specification, "overlap" may have the meaning of "intersect or cross over".

In some embodiments, the transparent touch display device 100 may be a liquid crystal display device or the like, or a self-emission display device in which the display panel 110 has the self-emissive capability. In some embodiments, in a case where the transparent touch display device 100 is a self-emission display device, each of the plurality of sub-pixels SP can include a light emitting element.

In one embodiment, the transparent touch display device 100 may be an organic light emitting display device to which an organic light emitting diode (OLED) is applied as the light emitting element. In another embodiment, the transparent touch display device 100 may be an inorganic light emitting display device to which an inorganic material-based light emitting diode is applied to as the light emitting element. In further another embodiment, the transparent touch display device 100 may be a quantum dot display device to which a quantum dot, which is a self-emission semiconductor crystal is applied as the light emitting element.

The structure of each of the plurality of subpixels SP may vary according to types of the transparent touch display devices 100. For example, in a case where the transparent touch display device 100 is a self-emission display device in which each sub-pixel SP has the self-emissive capability, each sub-pixel SP can include a self-emission light-emitting element, one or more transistors, and one or more capacitors.

The data driving circuit 120 is a circuit for driving a plurality of data lines, and can output data signals to the plurality of data lines. The gate driving circuit 130 is a circuit for driving a plurality of gate lines, and can output gate signals to the plurality of gate lines. The display controller 140 is a device for controlling the data driving circuit 120 and the gate driving circuit 130, and can control driving timings for the plurality of data lines and driving timings for the plurality of gate lines.

The display controller 140 can supply at least one data driving control signal to the data driving circuit 120 to control the data driving circuit 120, and supply at least one gate driving control signal to the gate driving circuit 130 to control the gate driving circuit 130.

The data driving circuit 120 can supply data signals to the plurality of data lines according to the driving timing control of the display controller 140. The data driving circuit 120 can receive digital image data from the display controller 140, convert the received image data into analog data signals, and output the resulting analog data signals to the plurality of data lines.

The gate driving circuit 130 can supply gate signals to the plurality of gate lines according to the driving timing control of the display controller 140. The gate driving circuit 130 can receive a first gate voltage corresponding to a turn-on level voltage and a second gate voltage corresponding to a turn-off level voltage along with several types of gate driving control signals (e.g., a start signal, a reset signal, and the like), generate gate signals, and supply the generated gate signals to the plurality of gate lines.

In some embodiments, the data driving circuit 120 may be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

In some embodiments, the gate driving circuit 130 may be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another embodiment, the gate driving circuit 130 may be disposed in the non-display area NDA of the display panel 110 in a gate in panel (GIP) type. The gate driving circuit 130 may be disposed on or over the substrate, or connected to the substrate. For example, in the case of the gate in panel (GIP) type, the gate driving circuit 130 may be disposed in the non-display area NDA of the substrate. The gate driving circuit 130 may be connected to the substrate in the case of the chip on glass (COG) type, the chip on film (COF) type, or the like.

At least one of the data driving circuit 120 and the gate driving circuit 130 may be disposed in the display area DA of the display panel 110. For example, at least one of the data driving circuit 120 and the gate driving circuit 130 may be disposed not to overlap subpixels SP, or disposed to be overlapped with one or more, or all, of the subpixels SP.

The data driving circuit 120 may be located on, but not limited to, only one side or portion (e.g., an upper edge or a lower edge) of the display panel 110. In some embodiments, the data driving circuit 120 may be located on, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 130 may be located on, but not limited to, only one side or portion (e.g., a left edge or a right edge) of the display panel 110. In some embodiments, the gate driving circuit 130 may be located on, but not limited to, two sides or portions (e.g., a left edge and a right edge) of the display panel 110 or at least two of four sides or portions (e.g., an upper edge, a lower edge, the left edge, and the right edge) of the display panel 110 according to driving schemes, panel design schemes, or the like.

The display controller 140 may be implemented in a separate component from the data driving circuit 120, or integrated with the data driving circuit 120 and thus implemented in an integrated circuit.

The display controller 140 may be a timing controller used in the typical display technology or a controller or a control device capable of additionally performing other control functions in addition to the function of the typical timing controller. In some embodiments, the display controller 140 may be a controller or a control device different from the timing controller, or a circuitry or a component included in the controller or the control device. The display controller 140 may be implemented with various circuits or electronic components such as an integrated circuit (IC), a field programmable gate array (FPGA), an application specific integrated circuit (ASIC), a processor, and/or the like.

The display controller 140 may be mounted on a printed circuit board, a flexible printed circuit, and/or the like and be electrically connected to the data driving circuit 120 and the gate driving circuit 130 through the printed circuit board, flexible printed circuit, and/or the like.

The display controller 140 may transmit signals to, and receive signals from, the data driving circuit 120 via one or more predefined or selected interfaces. In some embodiments, such interfaces may include a low voltage differential signaling (LVDS) interface, an EPI interface, a serial peripheral interface (SP), and the like.

In some embodiments, in order to further provide a touch sensing function, as well as an image display function, the transparent touch display device 100 can include a touch sensor, and a touch sensing circuit 150 capable of detecting whether a touch event occurs by a touch object such as a finger, a pen, or the like, or of detecting a corresponding touch position, by sensing the touch sensor.

The touch sensing circuit 150 can include a touch driving circuit 160 capable of generating and providing touch sensing data by driving and sensing the touch sensor, a touch controller 170 capable of detecting the occurrence of a touch event or detecting a touch position using the touch sensing data, and the like.

The touch sensor can include a plurality of touch electrodes. The touch sensor can further include a plurality of touch lines for electrically connecting the plurality of touch electrodes to the touch driving circuit 160. The touch sensor is sometimes referred to as a touch panel.

In some embodiments, the touch sensor included in the transparent touch display device 100 may be located inside of the display panel 110. In this case, the touch sensor is sometimes referred to as an integrated-type touch sensor or an in-cell touch sensor. During the process of manufacturing the display panel 110, the integrated-type touch sensor may be formed together with electrodes or signal lines related to the display driving.

The touch driving circuit 160 can supply a touch driving signal to at least one of the plurality of touch electrodes included in the touch sensor, and generate touch sensing data by sensing at least one of the plurality of touch electrodes.

The touch sensing circuit 150 can perform touch sensing using a self-capacitance sensing method or a mutual-capacitance sensing method.

When the touch sensing circuit 150 performs touch sensing in the self-capacitance sensing method, the touch sensing circuit 150 can perform touch sensing based on capacitance between each touch electrode and a touch object (e.g., a finger, a pen, etc.). According to the self-capacitance sensing method, each of the plurality of touch electrodes can serve as both a driving touch electrode and a sensing touch electrode. The touch driving circuit 160 can drive all, or one or some, of the plurality of touch electrodes and sense all, or one or some, of the plurality of touch electrodes.

When the touch sensing circuit 150 performs touch sensing in the mutual-capacitance sensing method, the touch sensing circuit 150 can perform touch sensing based on capacitance between touch electrodes. According to the mutual-capacitance sensing method, the plurality of touch electrodes are divided into driving touch electrodes and sensing touch electrodes. The touch driving circuit 160 can drive the driving touch electrodes and sense the sensing touch electrodes.

As described above, the touch sensing circuit 150 can perform touch sensing using the self-capacitance sensing method and/or the mutual-capacitance sensing method. Hereinafter, for convenience of description, it is assumed that the touch sensing circuit 150 performs touch sensing using the self-capacitance sensing method.

In one embodiment, each of the touch driving circuit 160 and the touch controller 170 may be implemented in a separate integrated circuit. In another embodiment, the touch driving circuit 160 and the touch controller 170 may be integrated into a single integrated circuit.

In one embodiment, each of the touch driving circuit 160 and the data driving circuit 120 may be implemented in a separate integrated circuit. In another embodiment, the touch driving circuit 160 and the data driving circuit 120 may be integrated into a single integrated circuit. In one embodiment, in a case where the transparent touch display device 100 includes one driving integrated circuit chip, this driving integrated circuit chip may include the touch driving circuit 160 and the data driving circuit 120. In another embodiment, in a case where the transparent touch display device 100 includes multiple driving integrated circuit chips, each of these driving integrated circuit chips may include a part of the touch driving circuit 160 and a part of the data driving circuit 120.

The transparent touch display device 100 may further include a power supply circuit for supplying various types of power to the display driving circuit and/or the touch sensing circuit.

In some embodiments, the transparent touch display device 100 herein may be a mobile terminal such as a smart phone, a tablet, or the like, or a monitor, a television (TV), or the like. Such devices may be of various types, sizes, and shapes. The transparent touch display device 100 according to embodiments of the present disclosure are not limited thereto, and includes displays of various types, sizes, and shapes for displaying information or images.

Figure 2:
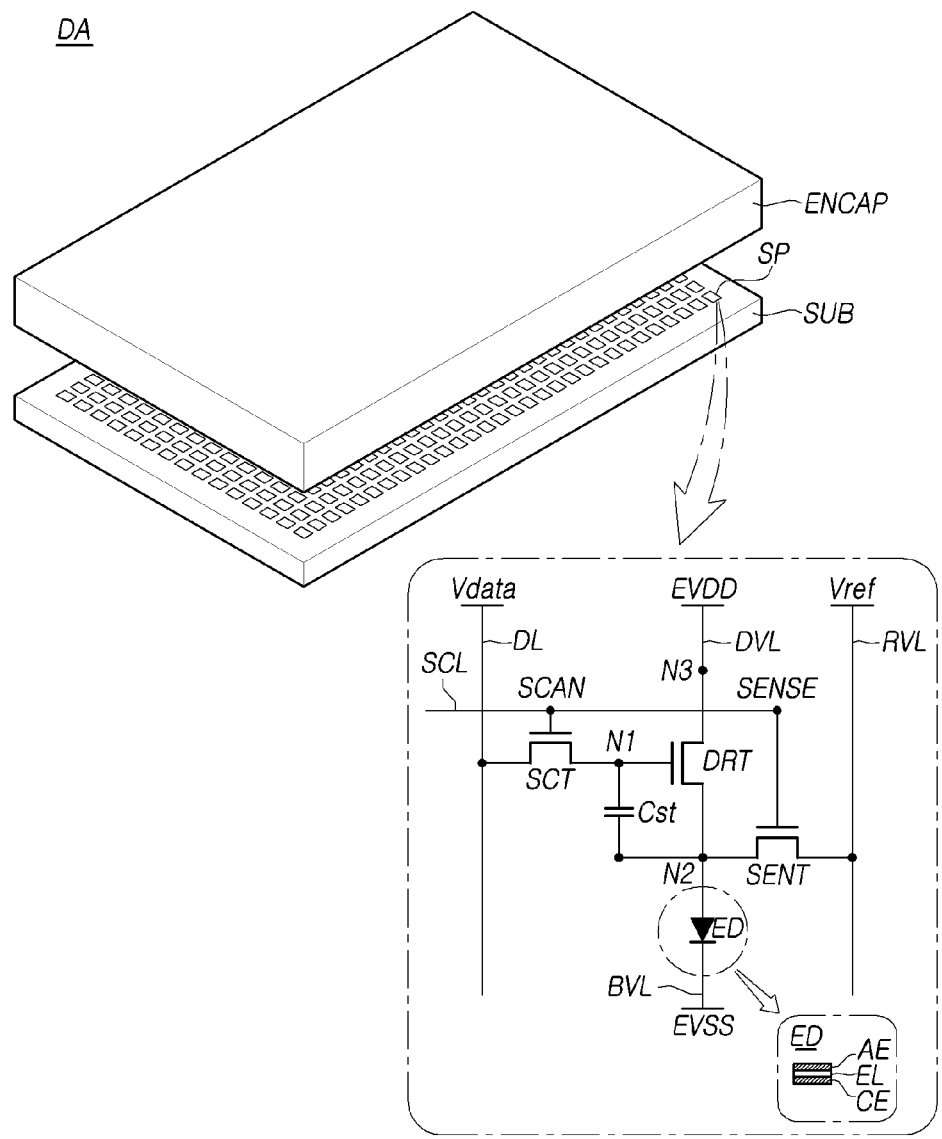
FIG. 2 illustrates an example structure of a display panel of the transparent touch display device according to aspects of the present disclosure.

FIG. 2 illustrates an example structure of the display panel 110 of the transparent touch display device 100 according to aspects of the present disclosure.

Referring to FIG. 2, each of subpixels SP disposed in the display area DA of the display panel 110 of the transparent touch display device 100 can include a light emitting element ED, a driving transistor DRT for driving the light emitting element ED, a scan transistor SCT for transmitting a data voltage Vdata to a first node N1 of the driving transistor DRT, a storage capacitor Cst for maintaining a voltage at an approximate constant level during one frame, and the like.

The driving transistor DRT can include the first node N1 to which a data voltage is applied, a second node N2 electrically connected to the light emitting element ED, and a third node N3 to which a driving voltage EVDD through a driving voltage line DVL is applied. In the driving transistor DRT, the first node N1 may be a gate node, the second node N2 may be a source node or a drain node, and the third node N3 may be the drain node or the source node. Hereinafter, for convenience of description, the first node N1 of the driving transistor DRT is also referred to as a gate node or a gate electrode, the second node N2 of the driving transistor DRT is also referred to as a source node or a source electrode, and the third node N3 of the driving transistor DRT is also referred to as a drain node or a drain electrode.

The light emitting element ED can include an anode electrode AE, an emission layer EL, and a cathode electrode CE. The anode electrode AE of the light emitting element ED may be electrically connected to the second node N2 of the driving transistor DRT of each sub-pixel SP. The cathode electrode CE of the light emitting element ED may be electrically connected to a base voltage line BVL to which a base voltage EVSS is applied.

The anode electrode AE may be a pixel electrode disposed in each sub-pixel SP. The cathode electrode CE may be a common electrode to which the base voltage EVSS, which is a type of common voltage commonly needed to drive the sub-pixels SP, is applied.

The light emitting element ED may be, for example, an organic light emitting diode (OLED), an inorganic light emitting diode, a quantum dot light emitting element, or the like. In a case where an organic light emitting diode (OLED) is applied as the light emitting element ED, the emission layer EL thereof may include an organic emission layer including an organic material.

The scan transistor SCT can be turned on and off by a scan signal SCAN, which is a gate signal applied through a scan signal line SCL, and be electrically connected between the first node N1 of the driving transistor DRT and a data line DL.

The storage capacitor Cst may be connected between the first node N1 and the second node N2 of the driving transistor DRT.

Referring to FIG. 2, each of the plurality of sub-pixels SP disposed in the display area DA of the display panel 110 of the transparent touch display device 100 can basically include a light emitting element ED, two transistors DRT and SCT, and one capacitor Cst.

Each of the plurality of sub-pixels SP disposed in the display area DA of the display panel 110 of the transparent touch display device 100 may further include one or more transistors or one or more capacitors.

For example, as shown in FIG. 2, each sub-pixel SP may further include a sensing transistor SENT for controlling a connection between the second node N2 of the driving transistor DRT and a reference voltage line RVL. The reference voltage line RVL may be a signal line for supplying a reference voltage Vref to the sub-pixel SP.

As shown in FIG. 2, in one embodiment, the gate node of the sensing transistor SENT may be electrically connected to the gate node of the scan transistor SCT. That is, the scan signal line SCL electrically connected to the gate node of the scan transistor SCT may also be electrically connected to the gate node of the sensing transistor SENT.

In another embodiment, the gate node of the sensing transistor SENT may be electrically connected to a sensing signal line or another sensing signal line other than the scan signal line SCL connected to the gate node of the scan transistor SCT.

The storage capacitor Cst may be an external capacitor intentionally designed to be located outside of the driving transistor DRT, other than an internal capacitor, such as a parasitic capacitor (e.g., a Cgs, a Cgd), that may be present between the first node N1 and the second node N2 of the driving transistor DRT.

Each of the driving transistor DRT, the scan transistor SCT, and the sensing transistor SENT may be an n-type transistor or a p-type transistor.

Since circuit elements (in particular, a light emitting element ED) in each subpixel SP are vulnerable to external moisture or oxygen, an encapsulation layer ENCAP may be disposed in the display panel 110 in order to prevent the external moisture or oxygen from penetrating into the circuit elements (in particular, the light emitting element ED).

The encapsulation layer ENCAP may be disposed to have various types or shapes.

In one embodiment, the encapsulation layer ENCAP may be disposed such that it covers the light emitting element ED. The encapsulation layer ENCAP may include one or more inorganic layers and one or more organic layers.

In another embodiment, the encapsulation layer ENCAP may include an encapsulation substrate, a dam located between a thin film transistor array substrate and the encapsulation substrate along an outer edge of the display area DA, and a filler filled in an inner space of the dam.

Figure 3:
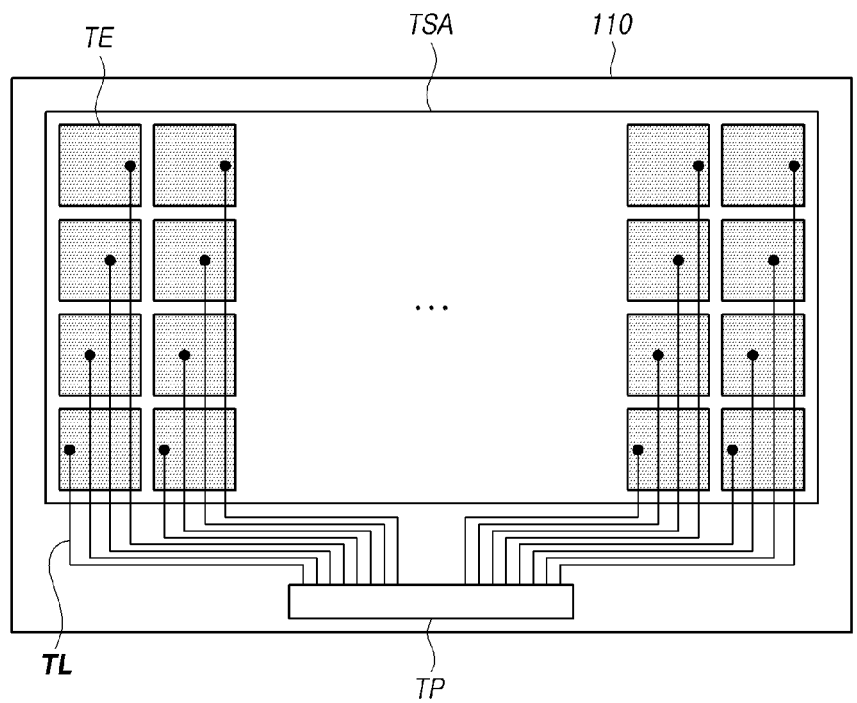
FIG. 3 illustrates an example touch sensor structure of the transparent touch display device according to aspects of the present disclosure.

FIG. 3 illustrates an example touch sensor structure of the transparent touch display device 100 according to aspects of the present disclosure.

Referring to FIG. 3, in some embodiments, the transparent touch display device 100 can include a touch sensor disposed in a touch sensing area TSA of the display panel 110.

In some embodiments, the touch sensor included in the transparent touch display device 100 can include a plurality of touch electrodes TE disposed in the touch sensing area TSA.

In some embodiments, the touch sensor included in the transparent touch display device 100 may be further include a plurality of touch lines TL for electrically connecting the plurality of touch electrodes TE to a plurality of touch pads TP to which the touch driving circuit 160 is electrically connected. Such touch lines TL are sometimes referred to as touch routing lines.

In some embodiments, when the touch sensor included in the transparent touch display device 100 is configured to operate using the self-capacitance sensing method, the plurality of touch electrodes TE do not electrically overlap and do not cross over one another. In the self-capacitance type touch sensor structure, each of the plurality of touch electrodes TE may be one touch node corresponding to a touch coordinate.

In some embodiments, when the transparent touch display device 100 is configured to sense a touch based on self-capacitance, the touch driving circuit 160 can supply a touch driving signal to at least one of the plurality of touch electrodes TE and sense the touch electrode TE to which the touch driving signal is supplied.

Each of the plurality of touch electrodes TE may be an electrode without an opening or a mesh-type electrode having a plurality of openings. Further, each of the plurality of touch electrodes TE may be a transparent electrode.

A value of obtained by sensing the touch electrode TE to which the touch driving signal is supplied may be a capacitance, or a value corresponding to a capacitance variance, in the touch electrode TE to which the touch driving signal is supplied. The capacitance at the touch electrode TE to which the touch driving signal is supplied may be a capacitance between the touch electrode TE to which the touch driving signal is supplied and a touch pointer such as a finger, a pen, or the like.

As described above, in some embodiments, the touch sensor including the touch electrodes TE may be integrated into the display panel 110 included in the transparent touch display device 100. Accordingly, during the process of manufacturing the display panel 110, when electrodes, lines, and patterns related to display driving are formed, the touch electrodes TE and the touch lines TL may also be formed together.

Figure 4:
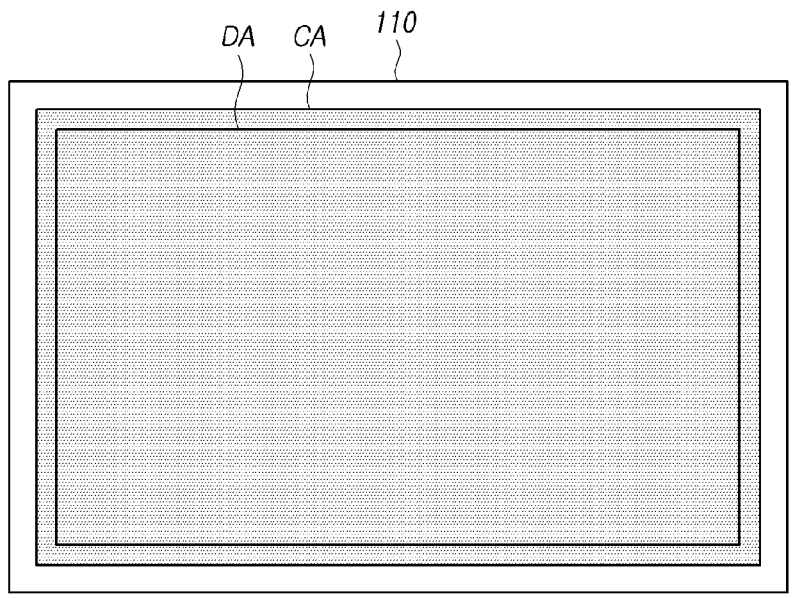
FIG. 4 is a plan view of the display panel of the transparent touch display device according to aspects of the present disclosure.

FIG. 4 is a plan view of the display panel 110 of the transparent touch display device 100 according to aspects of the present disclosure.

Referring to FIG. 4, in some embodiments, the display panel 110 included in the transparent touch display device 100 may include a cathode electrode area CA, in which a cathode electrode CE is disposed, that is overlapped with the display area DA.

In one embodiment, the cathode electrode area CA may have substantially the same area (size) as the display area DA. In this case, the whole of the cathode electrode area CA and the whole of the display area DA may overlap each other. In another embodiment, as shown in FIG. 4, the cathode electrode area CA may have a larger area (size) than the display area DA. In this case, the cathode electrode area CA may include an area overlapped with the whole of the display area DA and an area overlapped with the non-display area NDA.

Hereinafter, in the transparent touch display device 100 or example of the transparent touch display device 100 of the present disclosure, the cathode electrode CE to which the base voltage EVSS is applied will be referred to as a display cathode electrode.

In some embodiments, the transparent touch display device 100 may include one or more display cathode electrodes, and one or more touch cathode electrodes may be disposed together in a cathode electrode layer in which the one or more display cathode electrodes are disposed.

For example, the transparent touch display device 100 may include one or more display cathode electrodes and one or more touch cathode electrodes. One or more display cathode electrodes and one or more touch cathode electrodes may be disposed together in the cathode electrode area CA and disposed together in the cathode electrode layer.

In some embodiments, one or more display cathode electrodes and one or more touch cathode electrodes included in the transparent touch display device 100 are needed to be electrically disconnected to each other.

In some embodiments, one or more display cathode electrodes included in the transparent touch display device 100 may be cathode electrodes CE of the light emitting elements ED of the plurality of sub-pixels SP, and the base voltage EVSS may be applied to the one or more display cathode electrodes.

In some embodiments, one or more touch cathode electrodes included in the transparent touch display device 100 can serve as a touch sensor.

In some embodiments, the transparent touch display device 100 can include a cathode division structure including a first type, a second type, and a third type.

For example, in the first type of cathode division structure applied to the transparent touch display device 100, one display cathode electrode and a plurality of touch cathode electrodes, which are separated from each other, form the cathode electrode layer. In the second type of cathode division structure applied to the transparent touch display device 100, one touch cathode electrode and a plurality of display cathode electrodes, which are separated from each other, form the cathode electrode layer. In the third type of cathode division structure applied to the transparent touch display device 100, a plurality of display cathode electrodes and a plurality of touch cathode electrodes, which are separated from each other, form the cathode electrode layer.

Hereinafter, the first type will be described in further detail with reference to FIG. 5, the second type will be described in further detail with reference to FIG. 7, and the third type will be described in further detail with reference to FIG. 8.

Figure 5:
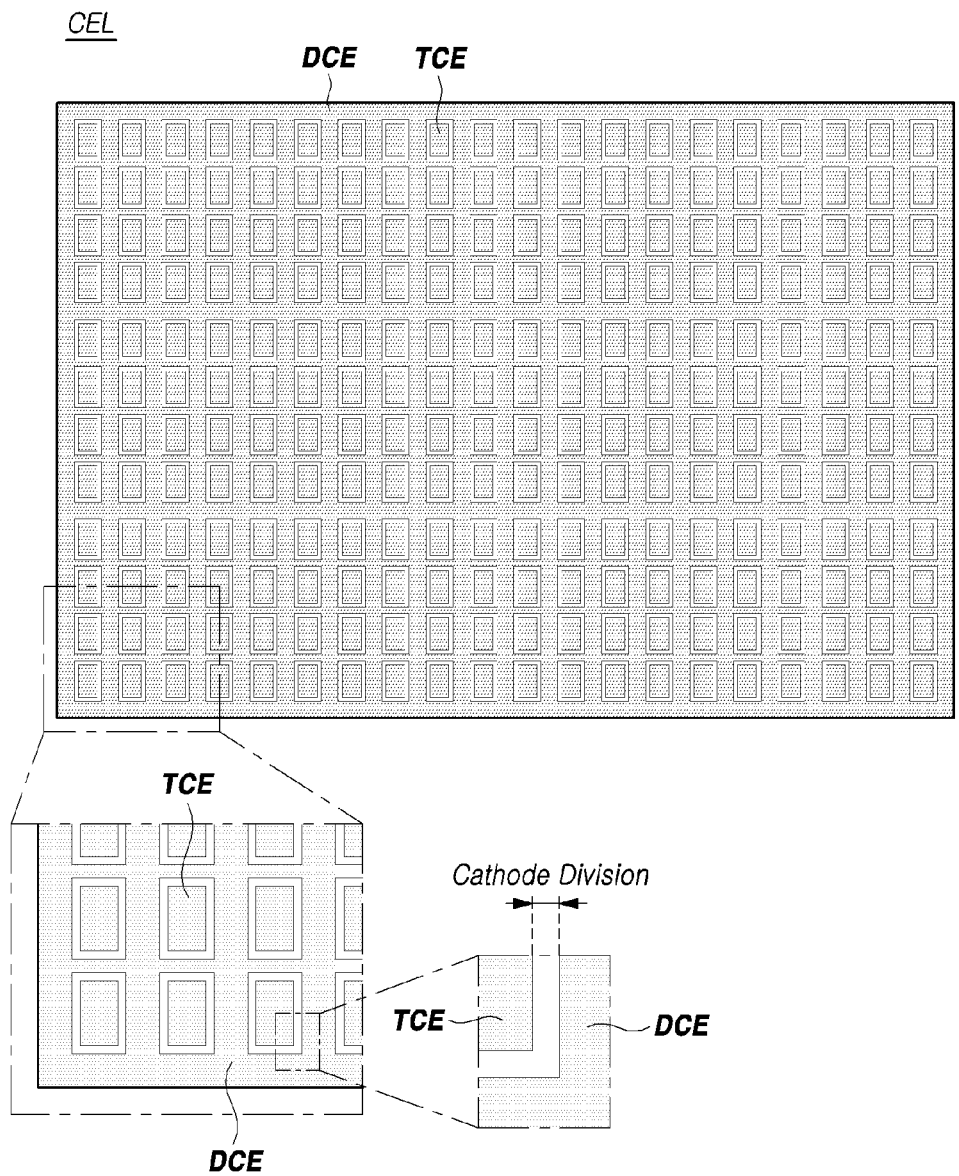
FIG. 5 illustrates an example cathode division structure of the display panel of the transparent touch display device according to aspects of the present disclosure.

FIG. 5 illustrates the first type of cathode division structure of the display panel 110 of the transparent touch display device 100 according to aspects of the present disclosure.

Referring to FIG. 5, in some embodiments, when the transparent touch display device 100 has the first type of cathode division structure, a single display cathode electrode DCE and a plurality of touch cathode electrodes may be disposed in the cathode electrode layer CEL. For example, the single display cathode electrode DCE and the plurality of touch cathode electrodes TCE may include the same material.

As a lower portion of at least one lower layer located under the cathode electrode layer CEL has an under-cut shape that is recessed inwardly (or downwardly, or inwardly and downwardly) (hereinafter, referred to as "under-cut portion" or "under-cut structure"), when a cathode electrode material is deposited on the at least one lower layer, the cathode electrode material becomes disconnected at the under-cut portion of the at least one lower layer. The cathode electrode materials separated along the under-cut portion correspond to the display cathode electrode DCE and the touch cathode electrode TCE. For example, the at least one lower layer to which the under-cut portion is formed may include a pixel electrode layer in which the anode electrode AE is formed, an overcoat layer, a bank, and/or the like.

The single display cathode electrode DCE may correspond to the cathode electrodes CE of the light emitting elements ED of the plurality of sub-pixels SP. In this case, the base voltage EVSS may be applied to the single display cathode electrode DCE.

The plurality of touch cathode electrodes TCE may be disposed to be spaced apart from one another. The plurality of touch cathode electrodes TCE may be disposed adjacent to the single display cathode electrode DCE, but embodiments of the present disclosure are not limited thereto. For example, the plurality of touch cathode electrodes TCE may be disposed spaced apart from the single display cathode electrode DCE. The plurality of touch cathode electrodes TCE may be electrically disconnected from the single display cathode electrode DCE.

Referring to FIG. 5, in some embodiments, when the transparent touch display device 100 has the first type of cathode division structure, the single display cathode electrode DCE may include a plurality of openings. The plurality of touch cathode electrodes TCE may be each disposed in the form of an island in an inner space of each of the plurality of openings formed in the single display cathode electrode DCE.

Referring to FIG. 5, the display cathode electrode DCE, which is one type of display driving electrodes, or at least a portion of the display cathode electrode DCE may be disposed between two touch cathode electrodes TCE adjacent to each other among the plurality of touch cathode electrodes TCE.

Referring to FIG. 5, one or more subpixels SP or one or more light emitting areas of the one or more subpixels SP may be disposed between two touch cathode electrodes TCE adjacent to each other among the plurality of touch cathode electrodes TCE.

In one embodiment, an area (size) of each of the plurality of touch cathode electrodes TCE may be the same as a size of one sub-pixel SP or an area corresponding the sub-pixel SP.

In another embodiment, an area (size) of each of the plurality of touch cathode electrodes TCE may be greater than a size of one sub-pixel SP or an area corresponding the sub-pixel SP. For example, an area (size) of each of the plurality of touch cathode electrodes TCE may correspond to a size of two or more sub-pixels SP or an area corresponding the two or more sub-pixels SP.

Figure 6A:
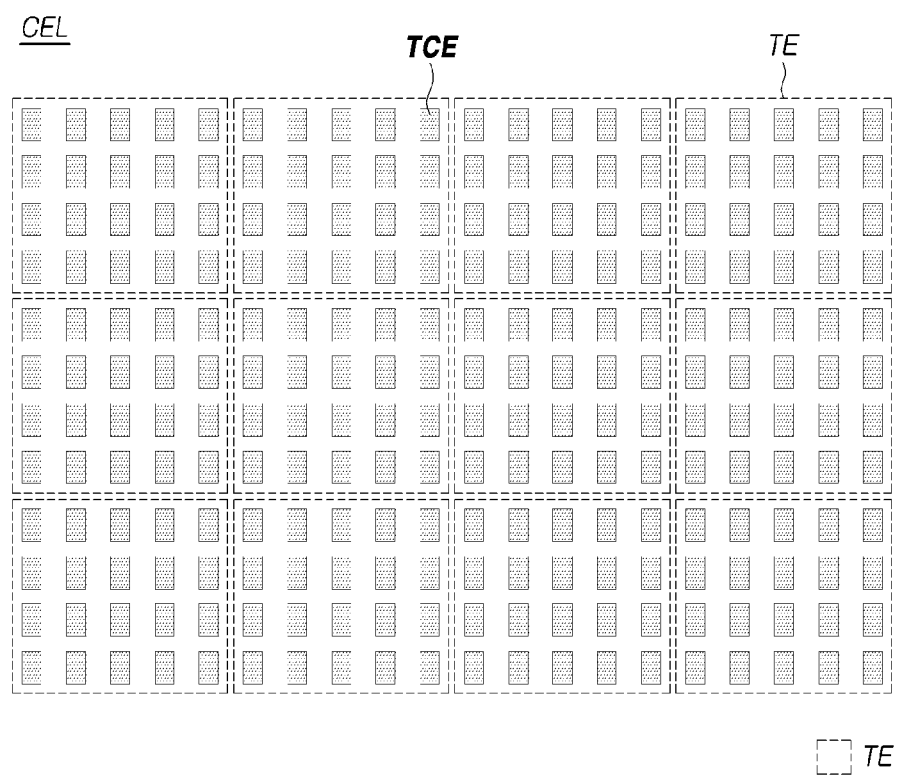
FIGS. 6A, 6B and 6C illustrate a touch sensor structure according to the cathode division structure of the display panel of the transparent touch display device according to aspects of the present disclosure.
Figure 6B:
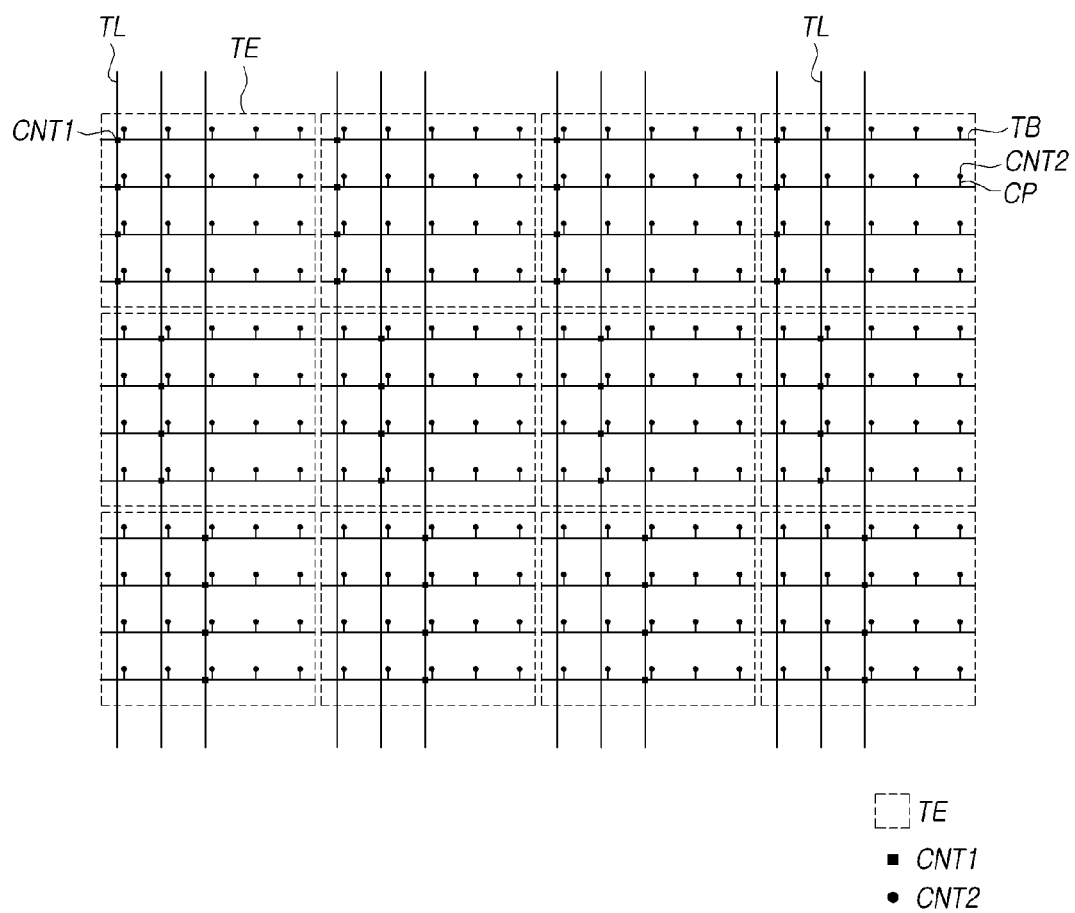
Figure 6C:
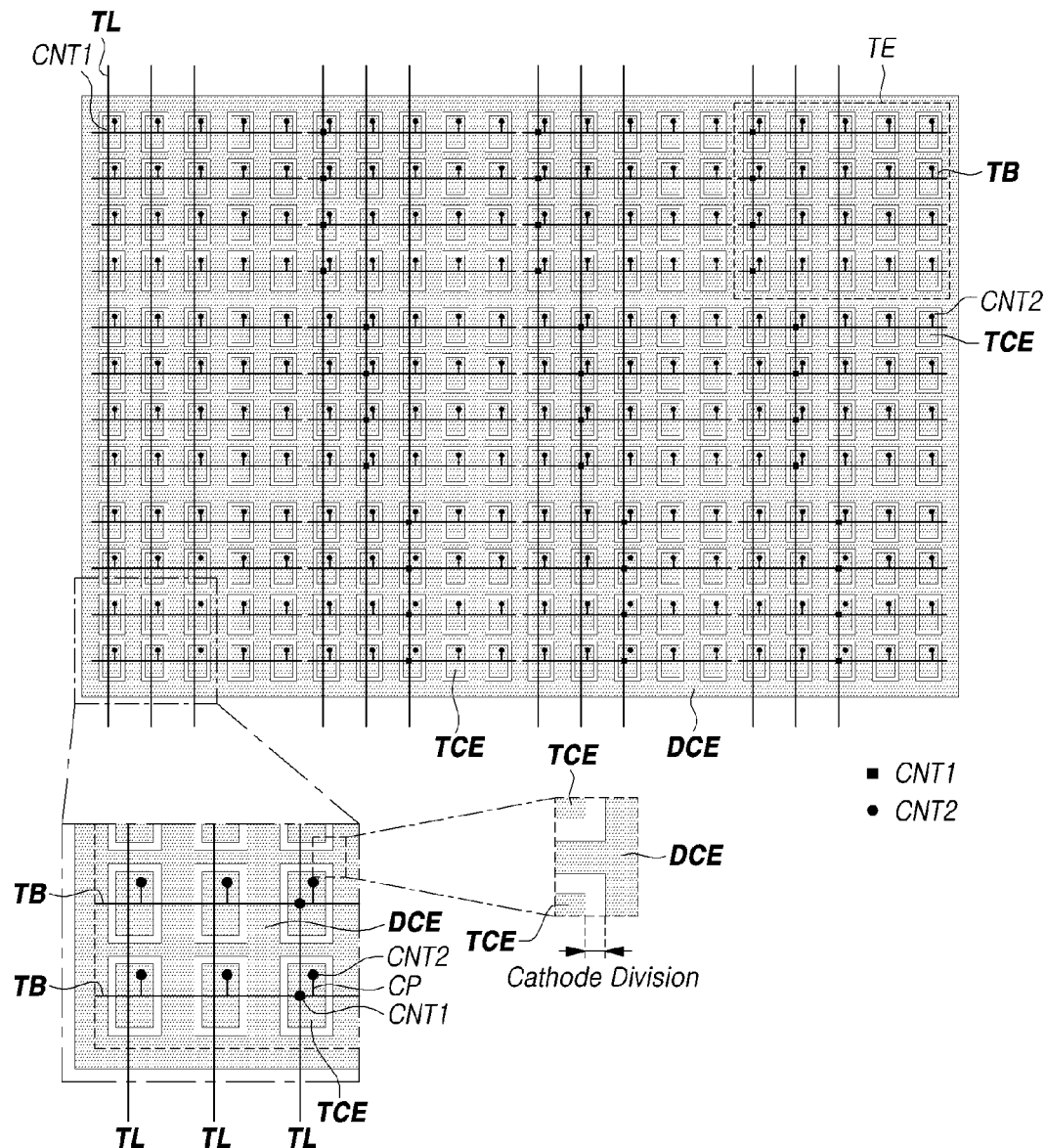

FIGS. 6A, 6B and 6C illustrate a touch sensor structure in a case where the transparent touch display device 100 according to aspects of the present disclosure has the first type of cathode division structure. For convenience of description, in FIG. 6A, the display cathode electrode DCE is omitted, and only the plurality of touch cathode electrodes TCE are illustrated.

Referring to FIG. 6A, the plurality of touch cathode electrodes TCE may be classified into a plurality of groups. The plurality of groups may correspond to a plurality of touch electrodes TE. For example, the transparent touch display device 100 may include the plurality of touch electrodes TE, and one touch electrode TE may include two or more touch cathode electrodes TCE.

In the example of FIG. 6A, the display panel 110 may include 12 touch electrodes TE arranged in 3 rows and 4 columns, and one touch electrode TE may include 20 touch cathode electrodes TCE arranged in 4 rows and 5 columns. The following description is given based on the configuration of this example.

To normally operate for touch sensing, the 20 touch cathode electrodes TCE are needed to be electrically connected to one another to operate as one touch electrode TE.

In one embodiment, for the normal touch sensing operation, the plurality of touch electrodes TE in the display panel 110 may be electrically disconnected from one another. In another embodiment, some of the plurality of touch electrodes TE may be electrically connected to one another inside of the touch driving circuit 160. This embodiment may be implemented in a group driving scheme (or a group sensing scheme) in which two or more touch electrodes TE are simultaneously sensed.

As described above, for the normal touch sensing operation, the plurality of touch electrodes TE are needed to be electrically disconnected from one another in the display panel 110, and each of the plurality of touch electrodes TE is needed to be electrically connected to the touch driving circuit 160.

This connection structure will be described as follows in terms of the touch cathode electrodes TCE. Two or more touch cathode electrodes TCE disposed in an area of one touch electrode TE are needed to be electrically connected to one another. Two or more touch cathode electrodes TCE disposed in an area of one touch electrode TE are needed to be electrically disconnected from two or more touch cathode electrodes TCE disposed in the area of another touch electrode TE. Further, two or more touch cathode electrodes TCE disposed in the area of each touch electrode TE are needed to be electrically connected to the touch driving circuit 160.

FIG. 6B illustrates only additional connection elements (TL, TB, CP, CNT1, and CNT2) disposed in the cathode electrode area CA to form the touch sensor structure. For convenience of description, the cathode electrode layer CEL is omitted in FIG. 6B. FIG. 6C illustrates the cathode electrode layer CEL of FIG. 5 and the connection elements (TL, TB, CP, CNT1, and CNT2) of FIG. 6B together in a plan view.

Referring to FIGS. 6B and 6C, in order for the touch sensor structure according to the above-described connection structure to normally operate, the display panel 110 can include a plurality of touch lines TL and a plurality of touch bridges TB.

Referring to FIGS. 6B and 6C, the plurality of touch lines TL may respectively correspond to the plurality of touch electrodes TE. The plurality of touch electrodes TE can be connected to the touch driving circuit 160 through the plurality of touch lines TL.

Referring to FIGS. 6B and 6C, at least one touch bridge TB may be disposed in each area of the plurality of touch electrodes TE. For example, at least one touch bridge TB may be disposed in an area of one touch electrode TE.

A touch sensor structure in one touch electrode TE will be described with reference to the examples of FIGS. 6B and 6C.

Referring to the examples of FIGS. 6B and 6C, one touch electrode TE may include 20 touch cathode electrodes TCE, and the 20 touch cathode electrodes TCE may be arranged in 4 rows and 5 columns. For example, one touch electrode TE may include first to fourth touch cathode electrode rows, and each of the first to fourth touch cathode electrode rows may include five touch cathode electrodes TCE.

Referring to FIGS. 6B and 6C, four touch bridges TB may be disposed in an area of one touch electrode TE. The four touch bridges TB may correspond to the first to fourth touch cathode electrode rows, respectively. The five touch cathode electrodes TCE included in each of the first to fourth touch cathode electrode rows may be electrically connected to one another through one touch bridge TB.

Referring to FIGS. 6B and 6C, a plurality of touch lines TL may be disposed across an area in which one touch electrode TE is formed. One touch line TL of the plurality of touch lines TL may be electrically connected to the first to fourth touch cathode electrode rows through four first contact holes CNT1.

Referring to the examples of FIGS. 6B and 6C, each of the four touch bridges TB disposed in an area of one touch electrode TE may correspond to five protruding connection patterns CP. Thus, one touch bridge TB can be electrically connected to the five touch cathode electrodes TCE through the five protruding connection patterns CP.

Referring to FIGS. 6B and 6C, the five protruding connection patterns CP in one touch bridge TB may be respectively connected to the five touch cathode electrodes TCE through five second contact holes CNT2.

Referring to FIGS. 6B and 6C, the first contact hole CNT1 may serve as a point connecting the touch line TL and the touch bridge TB, and the second contact hole CNT2 may serve as a point connecting the touch bridge TB and the touch cathode electrode TCE. All of the 20 touch cathode electrodes TCE can be electrically connected to one touch line TL through four first contact holes CNT1 and the 20 second contact holes CNT2.

Figure 7:
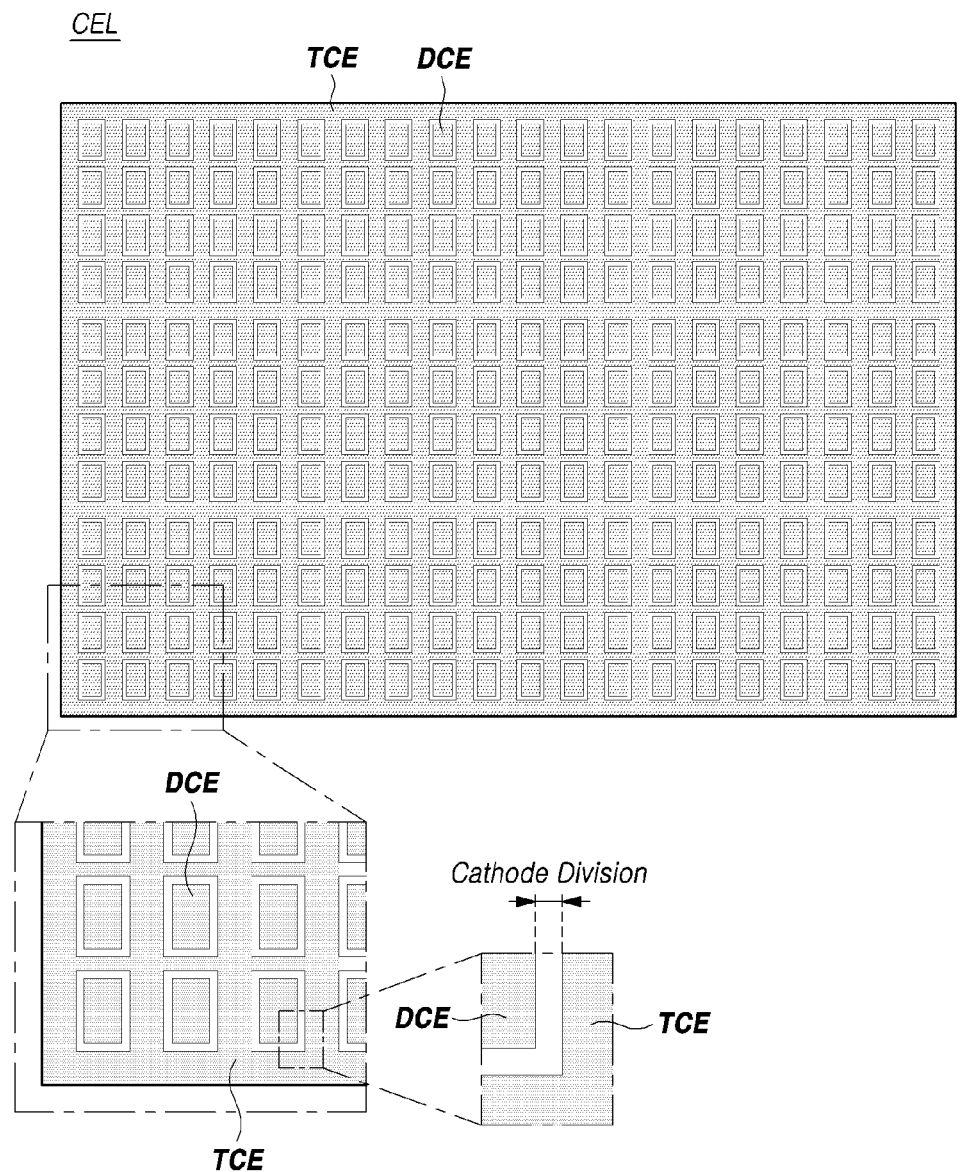
FIGS. 7 and 8 illustrate other example cathode division structures of the display panel of the transparent touch display device according to aspects of the present disclosure.

FIG. 7 illustrates the second type of cathode division structure of the display panel 110 of the transparent touch display device 100 according to aspects of the present disclosure.

Referring to FIG. 7, in some embodiments, in the second type of cathode division structure applied to the transparent touch display device 100, a single touch cathode electrode TCE and a plurality of display cathode electrodes DCE, which are separated from each other, may be formed in the cathode electrode layer CEL.

Referring to FIG. 7, in some embodiments, when the transparent touch display device 100 has the second type of cathode division structure, a single touch cathode electrode TCE and a plurality of display cathode electrodes DCE can be disposed in the cathode electrode layer CEL. For example, the single touch cathode electrode TCE and the plurality of display cathode electrodes DCE may include the same material (cathode electrode material).

The plurality of display cathode electrodes DCE may correspond to the cathode electrodes CE of the light emitting elements ED of the plurality of sub-pixels SP. In this case, the base voltage EVSS may be applied to the plurality of display cathode electrodes DCE.

The plurality of display cathode electrodes DCE may be disposed adjacent to the single touch cathode electrode TCE, but embodiments of the present disclosure are not limited thereto. For example, the plurality of display cathode electrodes DCE may be disposed spaced apart from the single touch cathode electrode TCE. The plurality of display cathode electrodes DCE may be electrically disconnected from the single touch cathode electrode TCE.

Referring to FIG. 7, in some embodiments, when the transparent touch display device 100 has the second type of cathode division structure, the single touch cathode electrode TCE may include a plurality of openings. The plurality of display cathode electrodes DCE may be each disposed in the form of an island in an inner space of each of the plurality of openings formed in the single touch cathode electrode TCE.

Figure 8:
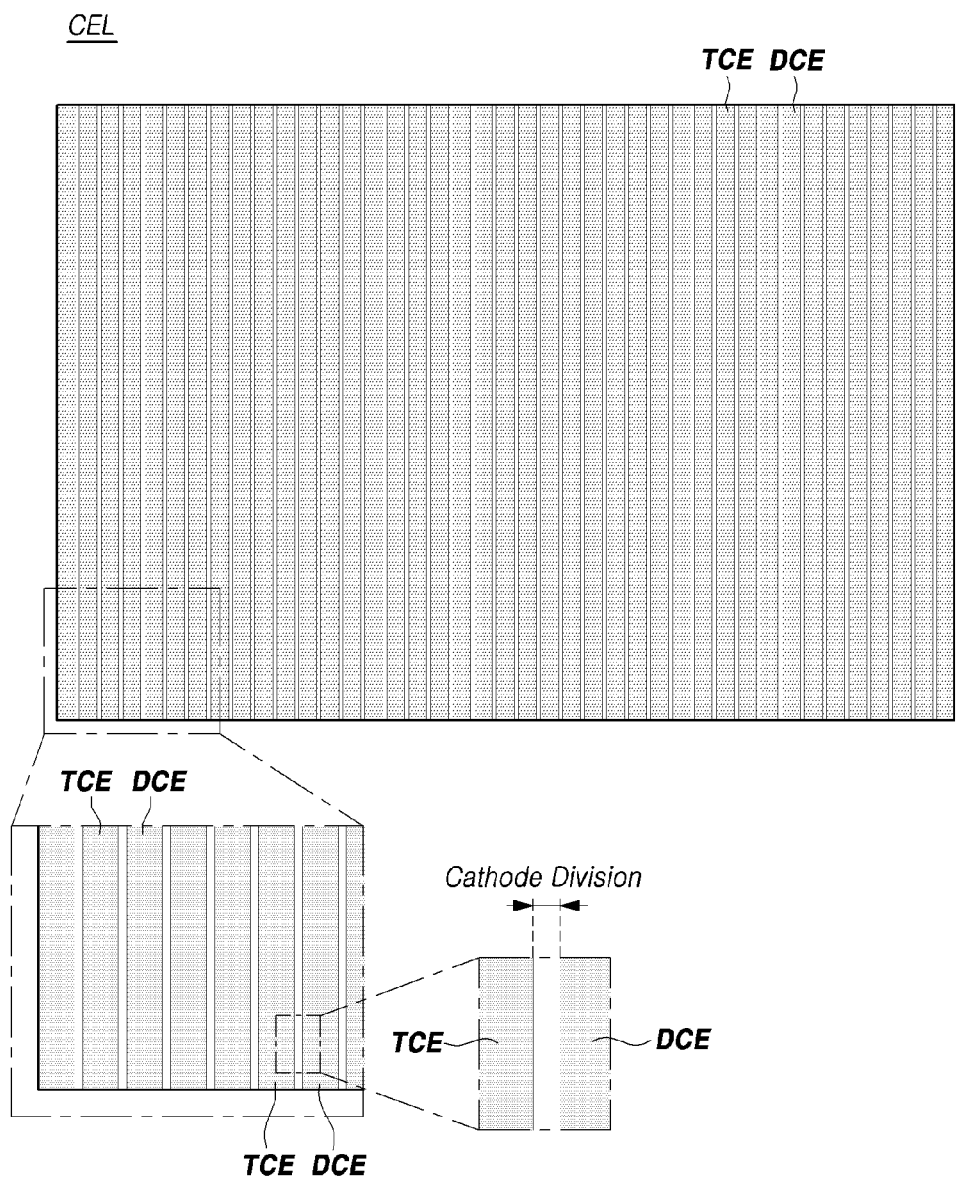

FIG. 8 illustrates the third type of cathode division structure of the display panel 110 of the transparent touch display device 100 according to aspects of the present disclosure.

Referring to FIG. 8, in some embodiments, in the third type of cathode division structure applied to the transparent touch display device 100, a plurality of touch cathode electrodes TCE and a plurality of display cathode electrodes DCE, which are separated from each other, may be formed in the cathode electrode layer CEL.

Referring to FIG. 8, in some embodiments, when the transparent touch display device 100 has the third type of cathode division structure, a plurality of touch cathode electrodes TCE and a plurality of display cathode electrodes DCE can be disposed alternately in the cathode electrode layer CEL.

Referring to FIG. 8, each of the plurality of touch cathode electrodes TCE and the plurality of display cathode electrodes DCE may have a bar shape. The plurality of touch cathode electrodes TCE and the plurality of display cathode electrodes DCE may include, for example, the same material (cathode electrode material).

The plurality of display cathode electrodes DCE may correspond to the cathode electrodes CE of the light emitting elements ED of the plurality of sub-pixels SP. In this case, the base voltage EVSS may be applied to the plurality of display cathode electrodes DCE.

Each of the plurality of display cathode electrodes DCE may be adjacent to touch cathode electrodes TCE on both sides of the corresponding display cathode electrode DCE, but is needed to be spaced apart from the touch cathode electrodes TCE. For example, the plurality of display cathode electrodes DCE may be electrically disconnect from the plurality of touch cathode electrodes TCE.

In some embodiments, when the transparent touch display device 100 has the first type of cathode division structure of FIG. 5, since one display cathode electrode DCE is used for display driving, the base voltage EVSS, which is a type of common voltage, may be uniformly supplied to all sub-pixels SP. Thereby, image quality can be improved.

In some embodiments, when the transparent touch display device 100 has the second type of cathode division structure of FIG. 7, since one touch cathode electrode TCE is used for touch driving, touch bridges TB need not be disposed in the display panel 110. Accordingly, the display panel 110 may have a more simple structure.

In some embodiments, when the transparent touch display device 100 has the third type of cathode division structure of FIG. 8, a boundary between the touch cathode electrodes TCE and the display cathode electrodes DCE is formed in a straight line, and thus, the process of forming the under-cut portion can be simplified.

Figure 9:
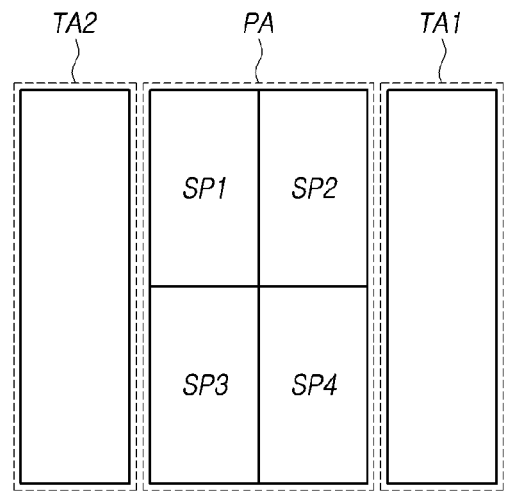
FIG. 9 illustrates a pixel area and a transmission area in a portion of the display panel of the transparent touch display device according to aspects of the present disclosure.

FIG. 9 illustrates a pixel area PA and transmission areas (TA1, TA2) in a portion of the display panel 110 of the transparent touch display device 100 according to aspects of the present disclosure.

Referring to FIG. 9, in some embodiments, a portion of the display panel 110 of the transparent touch display device 100 may include a pixel area PA, a first transmission area TA1, and a second transmission area TA2.

Referring to FIG. 9, the first transmission area TA1 may be located on a first side of the pixel area PA, and the second transmission area TA2 may be located on a second side of the pixel area PA.

Referring to FIG. 9, two or more sub-pixels (SP1, SP2, SP3, SP4) may be disposed in the pixel area PA between the first transmission area TA1 and the second transmission area TA2.

Referring to FIG. 9, four sub-pixels SP1, SP2, SP3, and SP4 may be disposed in the pixel area PA between the first transmission area TA1 and the second transmission area TA2. The four sub-pixels SP1, SP2, SP3, and SP4 may include a sub-pixel emitting red light, a sub-pixel emitting green light, a sub-pixel emitting blue light, and a sub-pixel emitting white light.

Figure 10:
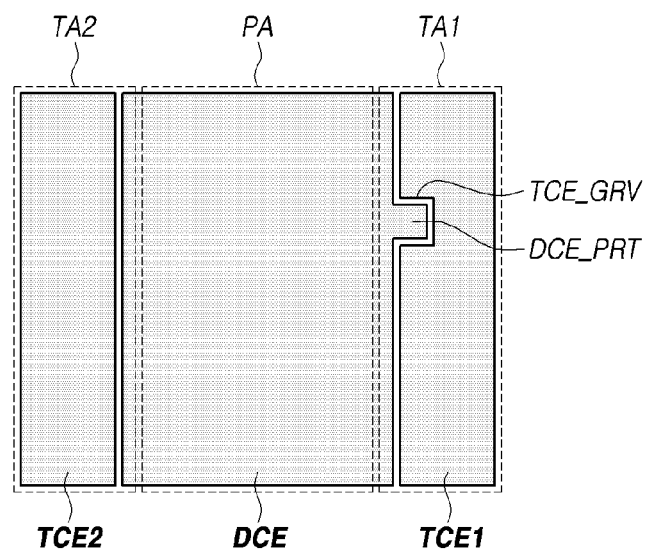
FIG. 10 illustrates a display cathode electrode and a touch cathode electrode disposed in each of the pixel area and the transmission area in the portion of the display panel of the transparent touch display device according to aspects of the present disclosure.

FIG. 10 illustrates a display cathode electrode DCE and touch cathode electrodes (TCE1, TCE2) respectively disposed in the pixel area PA and the transmission areas (TA1, TA2) that are located in a portion of the display panel 110 of the transparent touch display device 100 according to aspects of the present disclosure.

Referring to FIG. 10, the display cathode electrode DCE to which the base voltage EVSS for display driving is applied may be disposed in the pixel area PA. A first touch cathode electrode TCE1 may be disposed in the first transmission area TA1, and a second touch cathode electrode TCE2 may be disposed in the second transmission area TA2.

In one embodiment, the first touch cathode electrode TCE1 and the second touch cathode electrode TCE2 may have the same shape or the same area.

In another embodiment, one of the first touch cathode electrode TCE1 and the second touch cathode electrode TCE2 may have a different shape or a different area from the other.

Referring to FIG. 10, for example, the display cathode electrode DCE may include an electrode protrusion DCE_PRT. In this case, the first touch cathode electrode TCE1 may include an electrode groove TCE_GRV in which the electrode protrusion DCE_PRT of the display cathode electrode DCE is inserted.

The electrode protrusion DCE_PRT of the display cathode electrode DCE and the electrode groove TCE_GRV of the first touch cathode electrode TCE1 may be electrically disconnected from each other.

The display cathode electrode DCE may be disposed such that the electrode protrusion DCE_PRT thereof extends up to an inside space of the first transmission area TA1.

In one embodiment, referring to FIG. 10, a portion of a first edge of the display cathode electrode DCE may be disposed to extend up to an inside space of the first transmission area TA1. A portion of a second edge of the display cathode electrode DCE may be disposed to extend up to an inside space of the second transmission area TA2.

Figure 11:
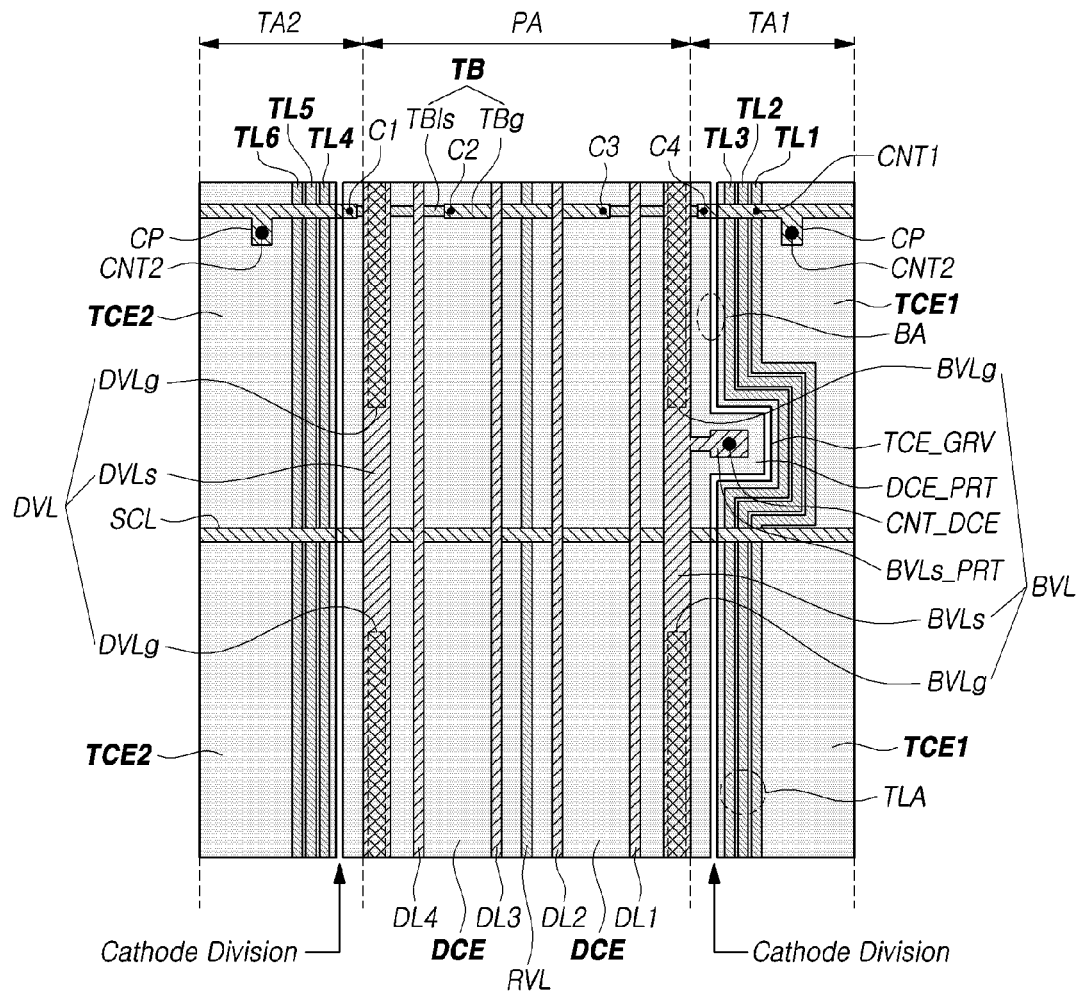
FIG. 11 is a plan view of the display panel of the transparent touch display device according to aspects of the present disclosure.

FIG. 11 illustrates an example touch sensor structure of the transparent touch display device 100 according to aspects of the present disclosure in a plan view.

Referring to FIG. 11, in some embodiments, the display panel 110 of the transparent touch display device 100 may include the display cathode electrode DCE disposed in the pixel area PA, the first touch cathode electrode TCE1 disposed in the first transmission area TA1, and the second touch cathode electrode TCE2 disposed in the second transmission area TA2, which may be equal, substantially equal, or similar, to the configuration of FIGS. 9 and 10.

Referring to FIG. 11, a portion of a first edge of the display cathode electrode DCE may be disposed to extend up to an inside space of the first transmission area TA1. A portion of a second edge of the display cathode electrode DCE may be disposed to extend up to an inside space of the second transmission area TA2.

Referring to FIG. 11, in some embodiments, the display panel 110 of the transparent touch display device 100 may include a plurality of touch lines (TL1, TL2, TL3) overlapping the first touch cathode electrode TCE1, and a plurality of touch lines (TL4, TL5, TL6) overlapping the second touch cathode electrode TCE2.

Referring to FIG. 11, the first touch cathode electrode TCE1 and the second touch cathode electrode TCE2 may be included in one first touch electrode TE, to which a touch driving signal is simultaneously applied.

Referring to FIG. 11, the one first touch electrode TE may be electrically connected to a touch pad TP through one first touch line TL1 of the plurality of touch lines (TL1, TL2, TL3) overlapping the first touch cathode electrode TCE1. That is, the first touch cathode electrode TCE1 and the second touch cathode electrode TCE2 may be electrically connected to the touch pad TP through the first touch line TL1 of the plurality of touch lines (TL1, TL2, TL3) overlapping the first touch cathode electrode TCE1.

Referring to FIG. 11, the remaining touch lines (TL2, TL3) except for the first touch line TL1 of the plurality of touch lines (TL1, TL2, TL3) overlapping the first touch cathode electrode TCE1 may not be electrically connected to the first touch cathode electrode TCE1 and instead, may be electrically connected to another touch cathode electrode TCE electrically disconnected from the first touch cathode electrode TCE1 and the second touch cathode electrode TCE2.

Referring to FIG. 11, all of the plurality of touch lines (TL4, TL5, TL6) overlapping the second touch cathode electrode TCE2 may not be electrically connected to the second touch cathode electrode TCE2 and instead, may be electrically connected to another touch cathode electrode TCE electrically disconnected from the first touch cathode electrode TCE1 and the second touch cathode electrode TCE2.

The display cathode electrode DCE, the first touch cathode electrode TCE1, and the second touch cathode electrode TCE2 may be cathode electrode materials that are disconnected by an under-cut portion formed in at least one lower layer located under the cathode electrode layer CEL. Accordingly, the display cathode electrode DCE, the first touch cathode electrode TCE1, and the second touch cathode electrode TCE2 may include the same cathode electrode material. For example, the cathode electrode material may include a transparent conductive material.

Referring to FIG. 11, the first touch line TL1 may be electrically connected to the first touch cathode electrode TCE1 or the second touch cathode electrode TCE2.

For example, the first touch line TL1 may be electrically connected to the first touch cathode electrode TCE1 through a first touch bridge TB. More specifically, the first touch line TL1 may be electrically connected to the first touch bridge TB through a first contact hole CNT1, and electrically connected to the first touch cathode electrode TCE1 through the first touch bridge TB as a protruding connection pattern CP of the first touch bridge TB is electrically connected to the first touch bridge TB through a second contact hole CNT2.

In some embodiments, when the transparent touch display device 100 has the first type of cathode division structure of FIG. 5, the display cathode electrode DCE may include a plurality of openings; the first touch cathode electrode TCE1 may be disposed in an inner space of a first opening of the plurality of openings of the display cathode electrode DCE; and the second touch cathode electrode TCE2 may be disposed in an inner space of a second opening of the plurality of openings of the display cathode electrode DCE.

In some embodiments, when the transparent touch display device 100 has the second type of cathode division structure of FIG. 7, the first touch cathode electrode TCE1 and the second touch cathode electrode TCE2 may be respective portions of a touch cathode electrode TCE forming one body; the touch cathode electrode TCE may include a plurality of openings; and the display cathode electrode DCE may be disposed in an inner space of one of a plurality of openings of the touch cathode electrode TCE.

In some embodiments, when the transparent touch display device 100 has the third type of cathode division structure of FIG. 8, the display cathode electrode DCE may be disposed in a first edge of the first touch cathode electrode TCE1; another display cathode electrode DCE may be disposed in a second edge opposite to the first edge of the first touch cathode electrode TCE1; and the another display cathode electrode DCE may be disposed separately from the display cathode electrode DCE.

Referring to FIG. 11, in some embodiments, the display panel 110 of the transparent touch display device 100 may further include a first scan signal line SCL disposed across the first transmission area TA1, the pixel area PA, and the second transmission area TA2.

Referring to FIG. 11, in some embodiments, the display panel 110 of the transparent touch display device 100 may further include a first touch bridge TB running across the pixel area PA and electrically connecting the first touch cathode electrode TCE1 and the second touch cathode electrode TCE2.

Referring to FIG. 11, in some embodiments, in the display panel 110 of the transparent touch display device 100, the first touch bridge TB may overlap the first touch line TL1, and the first touch line TL1 may be electrically connected to the first touch bridge TB through the first contact hole CNT1.

Referring to FIG. 11, the first touch bridge TB may include a first partial bridge TB1s including a first metal, and a second partial bridge TBg including a second metal different from the first metal.

For example, the first metal may be the same metal as a light shield (hereinafter, referred to as a light shield metal) located under the driving transistor DRT disposed in the pixel area PA. The second metal may constitute the gate electrode of the driving transistor DRT or the first scan signal line SCL, or be a gate metal constituting various signal lines. The second metal may be located in a vertically higher layer than the first metal. For example, the second metal may be located farther away from the substrate than the first metal.

Referring to FIG. 11, the first partial bridge TB1s and the second partial bridge TBg included in the first touch bridge TB may be located in different layers, and be electrically connected to each other through a plurality of contact holes (C1, C2, C3, C4).

Referring to FIG. 11, the first touch line TL1 may include the first metal, and the first scan signal line SCL may include the second metal. The first touch line TL1 may be located in a vertically lower layer than the first scan signal line SCL. For example, the first touch line TL1 may be located closer to the substrate than the first scan signal line SCL.

In some embodiments, the first touch line TL1 may be located in any of the remaining layers except for a layer in which the first touch bridge TB is located, among a first metal layer (e.g., a light shield metal layer) in which an electrode or line including the first metal is disposed, a second metal layer (e.g., a gate metal layer) in which an electrode or line including the second metal is disposed, a third metal layer (e.g., a source-drain metal layer) in which an electrode or line including a third metal is disposed, and a fourth metal layer (e.g., a metal layer located between the third metal layer and the pixel electrode layer (anode electrode layer)) in which an electrode or line including a fourth metal is disposed. Here, the first metal layer, the second metal layer, the third metal layer, and the fourth metal layer may be located in the upward order of the first metal layer, the second metal layer, the third metal layer, and the fourth metal layer. For example, among the first metal layer, the second metal layer, the third metal layer, and the fourth metal layer, the first metal layer is the lowest layer closest to the substrate SUB, and the fourth metal layer is the highest layer farthest away from the substrate SUB.

Referring to FIG. 11, the first touch line TL1 may not overlap the first partial bridge TB1s of the first touch bridge TB. The first touch line TL1 may overlap the second partial bridge TBg of the first touch bridge TB.

Referring to FIG. 11, in some embodiments, the display panel 110 of the transparent touch display device 100 may further include a first data line DL1, a second data line DL2, a third data line DL3, and a fourth data line DL4 disposed in the pixel area PA.

Referring to FIG. 11, each of the first data line DL1, the second data line DL2, the third data line DL3, and the fourth data line DL4 may include a third metal different from the first metal and the second metal.

For example, the first metal may be the same light shield metal as the light shield located under the driving transistor DRT disposed in the pixel area PA. The second metal may constitute the gate electrode of the driving transistor DRT or the first scan signal line SCL, or be the gate metal constituting several types of signal lines. The third metal may constitute the source electrode and the drain electrode of the driving transistor DRT or be a source-drain metal constituting several types of signal lines. The third metal layer in which the third metal is disposed may be located in a vertically higher layer than the second metal layer in which the second metal is disposed, and the second metal layer may be located in a vertically higher layer than the first metal layer in which the first metal is disposed. For example, the third metal layer may be located farther away from the substrate SUB than the second metal layer, and the second metal layer may be located farther away from the substrate SUB than the first metal layer.

Referring to FIG. 11, each of the first data line DL1, the second data line DL2, the third data line DL3, and the fourth data line DL4 may overlap the first partial bridge TB's or the second partial bridge TBg of the first touch bridge TB.

Referring to FIG. 11, in some embodiments, the display panel 110 of the transparent touch display device 100 may further include a reference voltage line RVL disposed in the pixel area PA.

The reference voltage line RVL may be disposed in a center area (in the vertical or column direction) of the pixel area PA. The reference voltage line RVL may overlap the display cathode electrode DCE and be disposed in the center area (in the vertical or column direction) of the display cathode electrode DCE.

The reference voltage line RVL may include the first metal, and the reference voltage line RVL may overlap the second partial bridge TBg of the first touch bridge TB.

Referring to FIG. 11, in some embodiments, the display panel 110 of the transparent touch display device 100 may further include a base voltage line BVL disposed in the pixel area PA and overlapping the display cathode electrode DCE.

Referring to FIG. 11, the base voltage line BVL may include a first partial base voltage line BVLg including the second metal, and a second partial base voltage lines BVLs including the third metal different from the first metal and the second metal.

Referring to FIG. 11, the second partial base voltage line BVLs may include a double layer part overlapping the first partial base voltage line BVLg and a single layer part not overlapping the first partial base voltage line BVLg.

Referring to FIG. 11, the first partial base voltage line BVLg may at least partially overlap the first partial bridge TB1s of the first touch bridge TB. The double layer part of the second partial base voltage line BVLs may overlap the first partial bridge TB1s of the first touch bridge TB.

Referring to FIG. 11, the first partial base voltage line BVLg may not overlap the first scan signal line SCL, and the second partial basis voltage line BVLs may overlap the first scan signal line SCL.

Referring to FIG. 11, the base voltage line BVL may be disposed between a first side or edge of the display cathode electrode DCE and the reference voltage line RVL.

Referring to FIG. 11, in some embodiments, the display panel 110 of the transparent touch display device 100 may further include a driving voltage line DVL disposed in the pixel area PA and overlapping the display cathode electrode DCE.

Referring to FIG. 11, the driving voltage line DVL may include a first partial driving voltage line DVLg including the second metal, and a second partial driving voltage line DVLs including the third metal different from the first metal and the second metal.

Referring to FIG. 11, the second partial driving voltage line DVLs may include a double layer part overlapping the first partial driving voltage line DVLg and a single layer part not overlapping the first partial driving voltage line DVLg.

Referring to FIG. 11, the first partial driving voltage line DVLg may overlap the first partial bridge TB1s of the first touch bridge TB. The double layer part of the second partial driving voltage line DVLs may overlap the first partial bridge TB1s of the first touch bridge TB.

Instead, the first partial driving voltage line DVLg may not overlap the second partial bridge TBg of the first touch bridge TB, and the double layer part of the second partial driving voltage line DVLs may not overlap the second partial bridge TBg of the first touch bridge TB.

Referring to FIG. 11, the driving voltage line DVL may be disposed between a second side or edge of the display cathode electrode DCE and the reference voltage line RVL.

Referring to FIG. 11, in some embodiments, the display panel 110 of the transparent touch display device 100 may further include a base voltage line BVL disposed in the pixel area PA and overlapped with the display cathode electrode DCE, and electrically connected to the display cathode electrode DCE.

Referring to FIG. 11, the display cathode electrode DCE may include an electrode protrusion DCE_PRT. The first touch cathode electrode TCE1 may include an electrode groove TCE_GRV in which the electrode protrusion DCE_PRT of the display cathode electrode DCE is inserted. The electrode protrusion DCE_PRT of the display cathode electrode DCE and the electrode groove TCE_GRV of the first touch cathode electrode may be electrically disconnected from each other.

Referring to FIG. 11, the base voltage line BVL may include a line protrusion BVLs_PRT overlapping the electrode protrusion DCE_PRT of the display cathode electrode DCE. The line protrusion BVLs_PRT of the base voltage line BVL may be electrically connected to the electrode protrusion DCE_PRT of the display cathode electrode DCE through a display cathode contact pattern CNT_DCE.

Referring to FIG. 11, the first touch line TL1 may overlap the first touch cathode electrode TCE1 and may be bent along the electrode groove TCE_GRV of the first touch cathode electrode TCE1.

Referring to FIG. 11, in some embodiments, the display panel 110 of the transparent touch display device 100 may be further include other touch lines (TL4, TL5, TL6) disposed in the second transmission area TA2, overlapping the first touch bridge TB, and overlapping the second touch cathode electrode TCE2.

Figure 12:
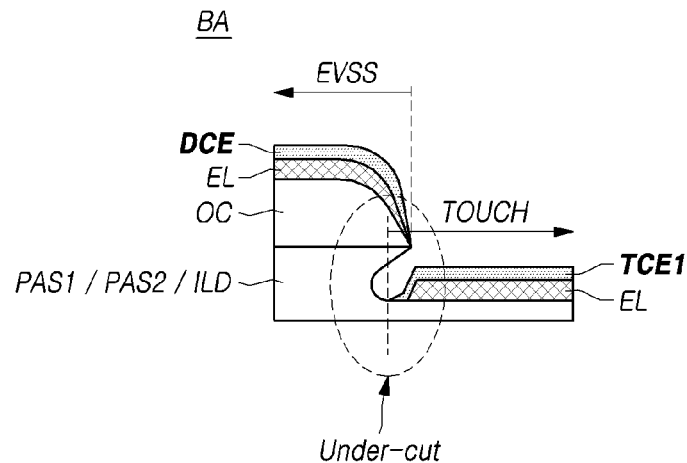
FIG. 12 illustrates a cross-sectional view of a cathode division boundary area in the display panel of the transparent touch display device according to aspects of the present disclosure.

FIG. 12 illustrates a cross-sectional view of a cathode division boundary area BA of FIG. 11 in the display panel of the transparent touch display device according to aspects of the present disclosure.

In some embodiments, in a case where the display panel 110 of the transparent touch display device 100 has the cathode division structure, the display cathode electrode DCE, the first touch cathode electrode TCE1, and the second touch cathode electrode TCE2 may be cathode electrode materials that are disconnected by an under-cut portion of at least one lower layer located under the cathode electrode layer CEL.

For example, at least one lower layer to which the under-cut portion is formed may include the pixel electrode layer in which the anode electrode AE is formed, the overcoat layer, the bank, and/or the like, and in some instances, may include at least one of a first passivation layer PAS1, a second passivation layer PAS2, and an interlayer insulating layer ILD.

According to such an under-cut structure configured in a lower layer described above, the display cathode electrode DCE, the first touch cathode electrode TCE1, and the second touch cathode electrode TCE2 may include the same cathode electrode material. For example, the cathode electrode material may include a transparent conductive material.

In other words, as shown in FIG. 12, in the cathode division boundary area BA of FIG. 11, a lower layer located under the display cathode electrode DCE may have an under-cut portion in which a lower portion of the lower layer is recessed (e.g., inwardly and/or downwardly recessed). The cathode division boundary area BA may be a boundary area BA between the display cathode electrode DCE and the first touch cathode electrode TCE1.

Likewise, even in a boundary area between the display cathode electrode DCE and the second touch cathode electrode TCE2, a lower layer located under the display cathode electrode DCE may have an under-cut portion in which a lower portion of the lower layer is recessed (e.g., inwardly and/or downwardly recessed).

In some embodiments, when the display panel 110 of the transparent touch display device 100 has the cathode division structure, the display panel 110 may further include a lower layer located under the display cathode electrode DCE.

The lower layer may have an under-cut structure in which the lower portion thereof is recessed inwardly (or, inwardly and downwardly). At a point BA where the lower layer has an under-cut structure, the display cathode electrode DCE and the first touch cathode electrode TCE1 may be electrically disconnected, and at another point BA where the lower layer or another lower layer has another under-cut structure, the display cathode electrode DCE and the second touch cathode electrode TCE2 may be electrically disconnected.

Figure 13:
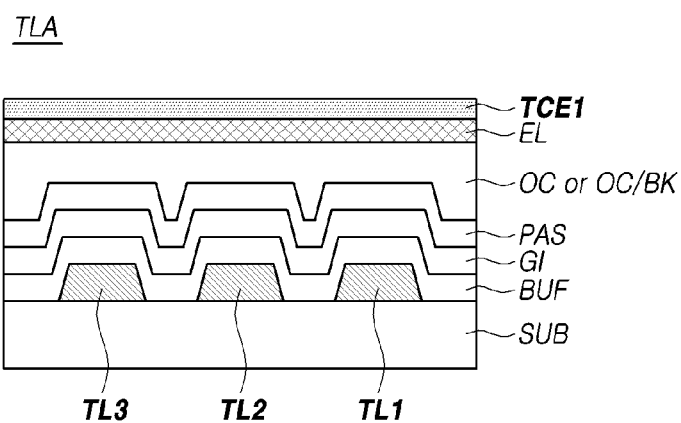
FIG. 13 illustrates a cross-sectional view of a touch line area in the display panel of the transparent touch display device according to aspects of the present disclosure.

FIG. 13 illustrates a cross-sectional view of a touch line area TLA in the display panel 110 of the transparent touch display device 100 according to aspects of the present disclosure.

Referring to FIGS. 11 and 13, the first touch cathode electrode TCE1 and the second touch cathode electrode TCE2 may be electrically connected by the first touch bridge TB, and thus, form one first touch electrode TE.

Referring to FIGS. 11 and 13, in the first transmission area TA1, the first touch line TL1, the second touch line TL2, and the third touch line TL3 may overlap the first touch cathode electrode TCE1.

Referring to FIGS. 11 and 13, only the first touch line TL1 of the first touch line TL1, the second touch line TL2, and the third touch line TL3 overlapping the first touch cathode electrode TCE1 may be electrically connected to the first touch cathode electrode TCE1. The second and third touch lines TL2 and TL3 of the first touch line TL1, the second touch line TL2, and the third touch line TL3 overlapping the first touch cathode electrode TCE1 may not be electrically connected to the first touch cathode electrode TCE1.

Referring to FIGS. 11 and 13, the first to third touch lines TL1, TL2, and TL3 may be located in the light shield metal layer on the substrate SUB, and a buffer layer BUF may be disposed on the substrate SUB such that the buffer layer BUF covers the first to third touch lines TL1, TL2, and TL3. The buffer layer BUF may be a single layer or multilayer.

Referring to FIG. 13, a gate insulating layer GI may be disposed on the buffer layer BUF, and a passivation layer PAS may be disposed on the gate insulating layer GI. The passivation layer PAS may be a single layer or a multilayer. An overcoat layer OC may be disposed on the passivation layer PAS, and a bank BK may be further disposed on the overcoat layer OC.

Referring to FIG. 13, an emission layer EL may be disposed on the overcoat layer OC or the bank BK on the overcoat layer OC. The first touch cathode electrode TCE1 may be located on the emission layer EL.

Referring to FIG. 13, the portion of the emission layer EL overlapping the first to third touch lines TL1, TL2, and TL3 may correspond to a portion extending from the pixel area PA, and may not emit a desired amount of light because there is no anode electrode AE under this portion of the emission layer EL.

Figure 14:
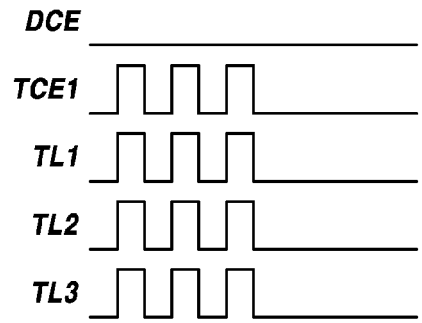
FIG. 14 illustrates signals applied to a touch cathode electrode and a touch line in the display panel of the transparent touch display device according to aspects of the present disclosure.

FIG. 14 illustrates signals applied to the first touch cathode electrode TCE1 and first to third touch lines TL1, TL2, and TL3, e.g., as illustrated in FIG. 11, in the display panel 110 of the transparent touch display device 100 according to aspects of the present disclosure.

Referring to FIG. 14, the first touch line TL1 and the first touch cathode electrode TCE1 can have the same electrical state. In addition, the second touch line TL2 and the third touch line TL3 may also have the same electrical state as the first touch cathode electrode TCE1.

The reason is as follows: in the first transmission area TA1, the first touch line TL1, the second touch line TL2, and the third touch line TL3 can overlap the first touch cathode electrode TCE1, and signals having at least one equal signal characteristic can be applied to all of the first touch line TL1, the second touch line TL2, the third touch line TL3, and the first touch cathode electrode TCE1. Here, the at least one equal signal characteristic may mean that at least one of a frequency, a phase, an amplitude, and the like is equal.

In further detail, as a touch driving signal output from the touch driving circuit 160 is applied to the first touch cathode electrode TCE1 through the first touch line TL1, the first touch line TL1 and the first touch cathode electrode TCE1 can have the same electrical state. Further, a touch driving signal for touch sensing or a load-free driving signal corresponding to the touch driving signal for reducing parasitic capacitance may be applied to the second touch line TL2 and the third touch line TL3. Here, the load-free driving signal may have at least one of signal characteristics equal to signal characteristics of the touch driving signal. Here, the equivalence of the at least one signal characteristic may mean that at least one of a frequency, a phase, an amplitude, and the like is equal. Accordingly, all of the first touch line TL1, the second touch line TL2, the third touch line TL3, and the first touch cathode electrode TCE1 may have an electrical state resulting from the application of signals having an equal signal characteristic.

Referring to FIG. 14, the display cathode electrode DCE may have an electrical state different from the first touch line TL1, the second touch line TL2, the third touch line TL3, and the first touch cathode electrode TCE1. For example, a base voltage EVSS having a constant voltage level may be applied to the display cathode electrode DCE. A touch driving signal or load-free driving signal, which has a voltage level varying over time, may be applied to the first touch line TL1, the second touch line TL2, the third touch line TL3, and the first touch cathode electrode TCE1.

As shown in FIG. 14, as the first touch line TL1 and the first touch cathode electrode TCE1 have the same electrical state, unnecessary parasitic capacitance between the first touch line TL1 and the first touch cathode electrode TCE1 can be prevented, this resulting in touch sensitivity improving.

Figure 15:
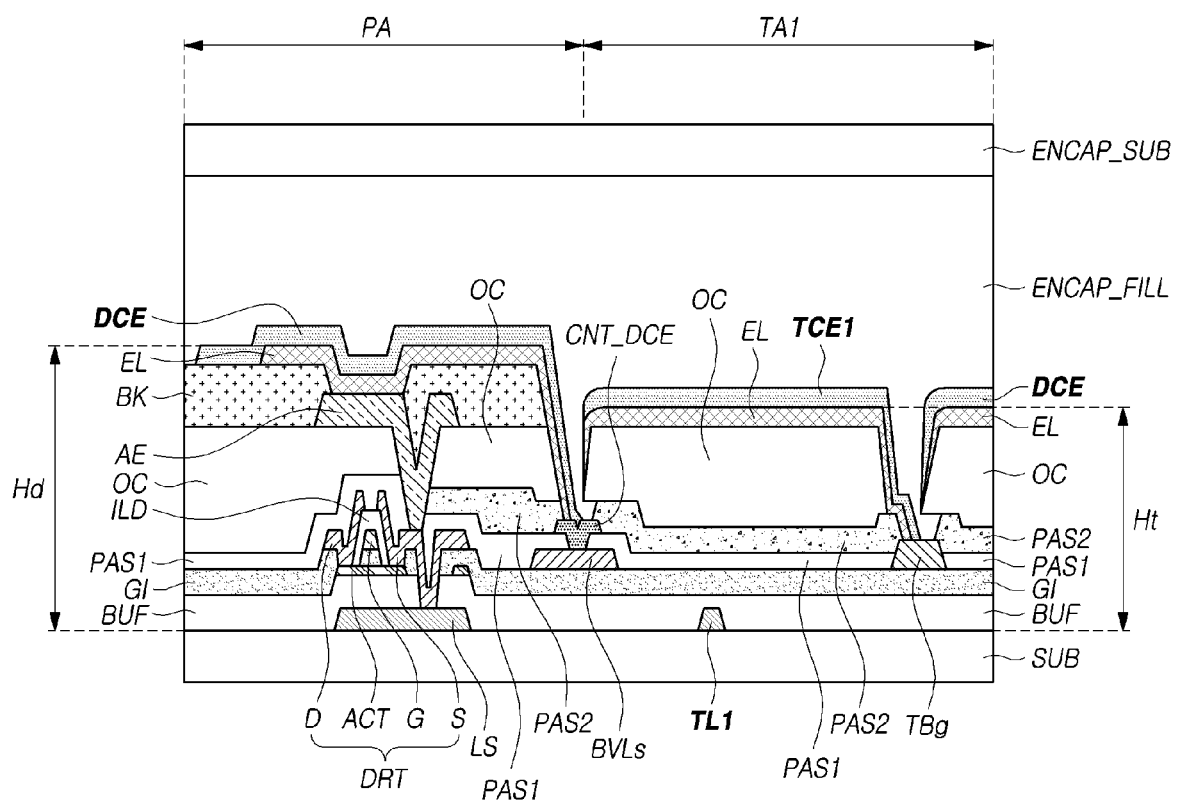
FIG. 15 is a cross-sectional view of the display panel of the transparent touch display device according to aspects of the present disclosure.

FIG. 15 is a cross-sectional view of the display panel 110 described above in the transparent touch display device 100 according to aspects of the present disclosure. For convenience of description, FIG. 15 briefly illustrates a cross-sectional structure of a partial area of the pixel area PA and the first transmission area TA1 in the configurations of the foregoing figures. Further, for convenience of description, FIG. 15 illustrates only the first touch line TL1 of the first to third touch lines TL1, TL2, and TL3 overlapping the first touch cathode electrode TCE1.

Referring to FIG. 15, a driving transistor DRT, an anode electrode AE, the display cathode electrode DCE, and the like may be disposed in the pixel area PA. The first touch cathode electrode TCE1, the first touch line TL1, the first touch bridge TB, and the like may be disposed in the first transmission area TA1.

Referring to FIG. 15, the anode electrode AE may be disposed in a pixel electrode layer (anode electrode layer) in the pixel area PA, located over the driving transistor DRT, and electrically connected to the source electrode S or the drain electrode D of the driving transistor DRT. The emission layer EL may be located between the anode electrode AE and the display cathode electrode DCE.

Referring to FIG. 15, in some embodiments, the display panel 110 of the transparent touch display device 100 may further include a light shield LS located under the driving transistor DRT, and overlapping the active layer ACT of the driving transistor DRT. A layer in which the light shield LS is located may be referred to as the light shield metal layer.

The light shield LS may be disposed in the pixel area PA.

The first touch line TL1 overlapping the first touch cathode electrode TCE1 may be located in the light shield metal layer. Accordingly, the light shield LS and the first touch line TL1 may include the same material (the light shield metal).

Although FIG. 15 illustrates that the first touch line TL1 is located in the first metal layer (the light shield metal layer), embodiments of the present disclosure are not limited thereto. For example, the first touch line TL1 may be located in or on different layers from the first metal layer. For example, the first touch line TL1 may be located in any of the remaining layers except for a layer in which the first touch bridge TB is located among the first metal layer (the light shield metal layer), the second metal layer (the gate metal layer), the third metal layer (the source-drain metal layer), and the fourth metal layer (a metal layer located between the third metal layer and the pixel electrode layer (the anode electrode layer).

Referring to FIG. 15, in some embodiments, the display panel 110 of the transparent touch display device 100 may have a top emission structure in which light for image display is emitted to the upper surface of an encapsulation substrate ENCAP_SUB. To this end, the display cathode electrode DCE, the first touch cathode electrode TCE1, and the second touch cathode electrode TCE2 may include the same transparent conductive material, and the anode electrode AE may include a reflective metal material.

A vertical structure of the display panel 110 will be described in more detail with reference to FIG. 15.

Referring to FIG. 15, the light shield metal layer, which is the first metal layer, may be disposed on the substrate SUB. Here, the light shield metal layer, which is the first metal layer, may be a layer in which the light shield metal, which is a first metal, is disposed, and be located closest to the substrate SUB.

Referring to FIG. 15, the light shield LS and the first touch line TL1 may be disposed in the light shield metal layer, which is the first metal layer. Further, the first partial bridge TB's of the first touch bridge TB may be disposed in the light shield metal layer. The light shield LS, the first touch line TL1, and the first partial bridge TB1s of the first touch bridge TB may include the light shield metal.

Referring to FIG. 15, the buffer layer BUF may be disposed such that the buffer layer BUF covers the light shield LS and the first touch line TL1. The buffer layer BUF may be a single layer or multilayer.

Referring to FIG. 15, an active layer ACT may be disposed on the buffer layer BUF, and the gate insulating layer GI may be disposed such that the gate insulating layer GI covers the active layer ACT.

Referring to FIG. 15, a gate electrode G and the second partial bridge TBg of the first touch bridge TB may be disposed on the gate insulating layer GI. A layer in which the gate electrode G and the second partial bridge TBg of the first touch bridge TB are located is referred to as the gate metal layer, which is the second metal layer. The gate electrode G and the second partial bridge TBg of the first touch bridge TB may include the gate metal, which is the second metal. In addition, the first partial base voltage line BVLg of the base voltage line BVL and the first partial driving voltage line DVLg of the driving voltage line DVL may be further disposed in the gate metal layer.

Referring to FIG. 15, an interlayer insulating layer ILD may be disposed on the gate electrode G, and a source electrode S and a drain electrode D including the source-drain metal, which is the third metal, may be disposed on the interlayer insulating layer ILD. In addition, the second partial base voltage line BVLs of the base voltage line BVL and the second partial driving voltage line DVLs of the driving voltage line DVL may be further disposed in the source-drain metal layer, which is the third metal layer.

Referring to FIG. 15, the source electrode S may be connected to one side or edge of the active layer ACT through a through hole of the gate insulating layer GI. The drain electrode D may be connected to the other side or edge of the active layer ACT through a through hole of the gate insulating layer GI.

Referring to FIG. 15, the source electrode S may be connected to the light shield LS using through holes formed in the gate insulating layer GI and the buffer layer BUF. Accordingly, a stable operation of the driving transistor DRT in relation to a body effect can be performed.

Referring to FIG. 15, a first passivation layer PAS1 may be disposed on the source-drain metal layer. A display cathode contact pattern CNT_DCE may be disposed on the first passivation layer PAS1. A layer in which the display cathode contact pattern CNT_DCE is located is referred to as the fourth metal layer. The display cathode contact pattern CNT_DCE may be connected to the second partial base voltage line BVLs of the base voltage line BVL through a through hole of the first passivation layer PAS1. Referring to FIGS. 11 and 15 together, a portion of the second partial base voltage line BVLs of the base voltage line BVL, which contacts, or is connected to, the display cathode contact pattern CNT_DCE, may be a line protrusion BVLs_PRT of the base voltage line BVL.

Referring to FIG. 15, a second passivation layer PAS2 may be disposed such that the second passivation layer PAS2 covers the display cathode contact pattern CNT_DCE on the first passivation layer PAS1. A metal layer between the first passivation layer PAS1 and the second passivation layer PAS2 may be the fourth metal layer including the fourth metal, and the display cathode contact pattern CNT_DCE may be located in the fourth metal layer.

Referring to FIG. 15, the overcoat layer OC may be disposed on the first passivation layer PAS1 and the second passivation layer PAS2. A lower portion of the overcoat layer OC may have an under-cut structure.

Referring to FIG. 15, the anode electrode AE may be disposed on the overcoat layer OC, and the anode electrode AE may be connected to the source electrode S of the driving transistor DRT using through holes formed in the overcoat layer OC and the first passivation layer PAS1.

Referring to FIG. 15, a bank BK may be disposed on the anode electrode AE. The bank BK may have an opening, and the top surface of a portion of the anode electrode AE may be exposed through the opening of the bank BK. The bank BK may be located in the pixel area PA and not disposed in the first transmission area TA1.

Referring to FIG. 15, the emission layer EL may be disposed in both the pixel area PA and the first transmission area TA1. In the pixel area PA, the emission layer EL may be disposed on the bank BK, and may be disposed in contact with the top surface of at least a portion of the anode electrode AE in the opening of the bank BK. In the first transmission area TA1, the emission layer EL may be disposed on the overcoat layer OC.

However, the emission layer EL in the pixel area PA and the emission layer EL in the first transmission area TA1 may not be connected to each other. For example, the emission layer EL in the pixel area PA and the emission layer EL in the first transmission area TA1 may be disconnected to each other at a boundary area between the pixel area PA and the first transmission area TA1. For example, the emission layer EL may be disconnected by the under-cut structure of the overcoat layer OC in the boundary area between the pixel area PA and the first transmission area TA1.

Referring to FIG. 15, a cathode electrode material in a cathode electrode layer CEL may be located on the emission layer EL, and may be disconnected in the boundary area between the pixel area PA and the first transmission area TA1 by the under-cut structure of the overcoat layer OC. As a result, the cathode electrode material located on the emission layer EL in the pixel area PA may be referred to as the display cathode electrode DCE, and the cathode electrode material located on the emission layer EL in the first transmission area TA1 may be referred to as the first touch cathode electrode TCE1.

Referring to FIG. 15, in the boundary area between the pixel area PA and the first transmission area TA1, the display cathode electrode DCE may be electrically connected to the display cathode contact pattern CNT_DCE using through holes formed in the overcoat layer OC and the second passivation layer PAS2. Accordingly, the display cathode electrode DCE may be electrically connected to the second partial base voltage line BVLs of the base voltage line BVL through the display cathode contact pattern CNT_DCE.

Referring to FIG. 15, in another boundary area between the pixel area PA and the first transmission area TA1, the first touch cathode electrode TCE1 may be electrically connected to the second partial bridge TBg of the first touch bridge TB using through holes formed in the overcoat layer OC and the second passivation layer PAS2.

Referring to FIG. 15, the display cathode electrode DCE, the first touch cathode electrode TCE1, and the second touch cathode electrode TCE2 may be located in the cathode electrode layer CEL, and an encapsulation layer ENCAP may be disposed on the cathode electrode DCE, the first touch cathode electrode TCE1, and the second touch cathode electrode TCE2, which are located in the cathode electrode layer CEL.

Referring to FIG. 15, the encapsulation layer ENCAP may include an encapsulation substrate, a dam located between the thin film transistor array substrate SUB and the encapsulation substrate ENCAP_SUB along an outer edge of the display area DA, and a filler ENCAP_FILL filled in an inner space of the dam.

The encapsulation layer ENCAP may be disposed to have various types or shapes. Unlike the configuration of the encapsulation layer ENCAP of FIG. 15, in some embodiments, the encapsulation layer ENCAP may be formed to include one or more inorganic layers and one or more organic layers.

Meanwhile, referring to FIG. 15, a maximum separation distance Ht between the first touch cathode electrode TCE1 and the substrate SUB and a maximum separation distance Ht between the second touch cathode electrode TCE2 and the substrate SUB may each be shorter than a maximum separation distance Hd between the display cathode electrode DCE and the substrate SUB.

Figure 16:
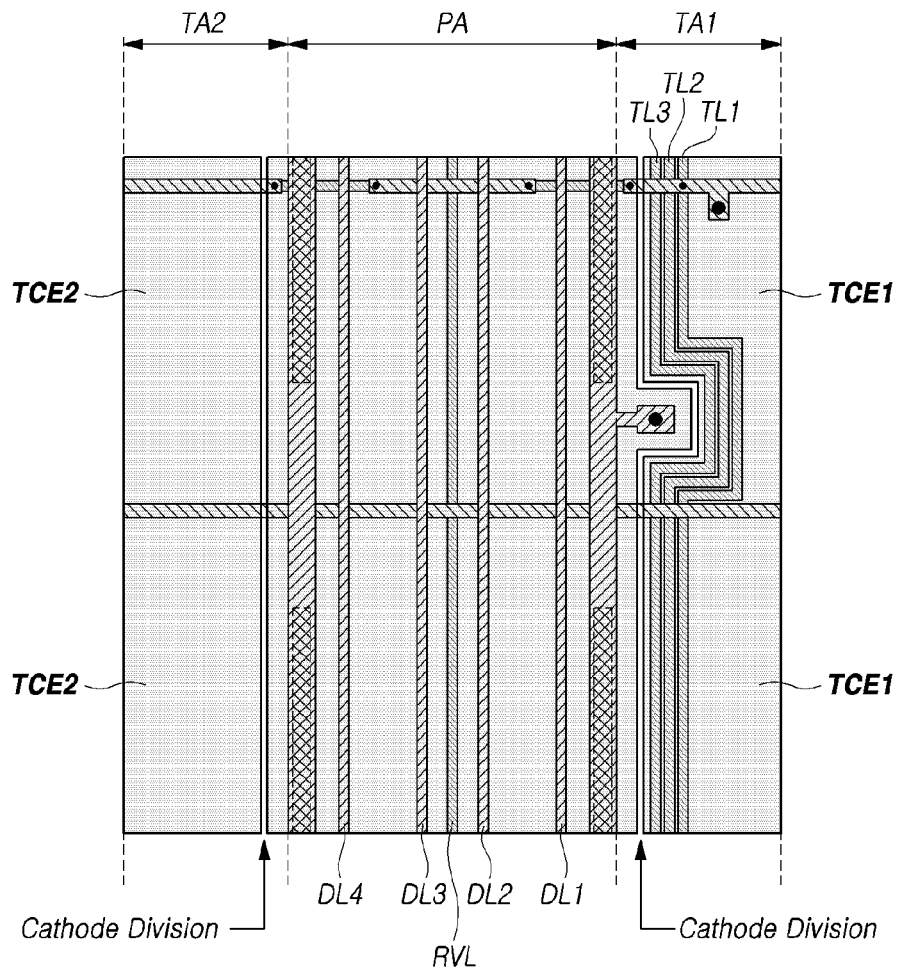
FIGS. 16 and 17 are plan views of the display panel of the transparent touch display device according to aspects of the present disclosure.
Figure 17:
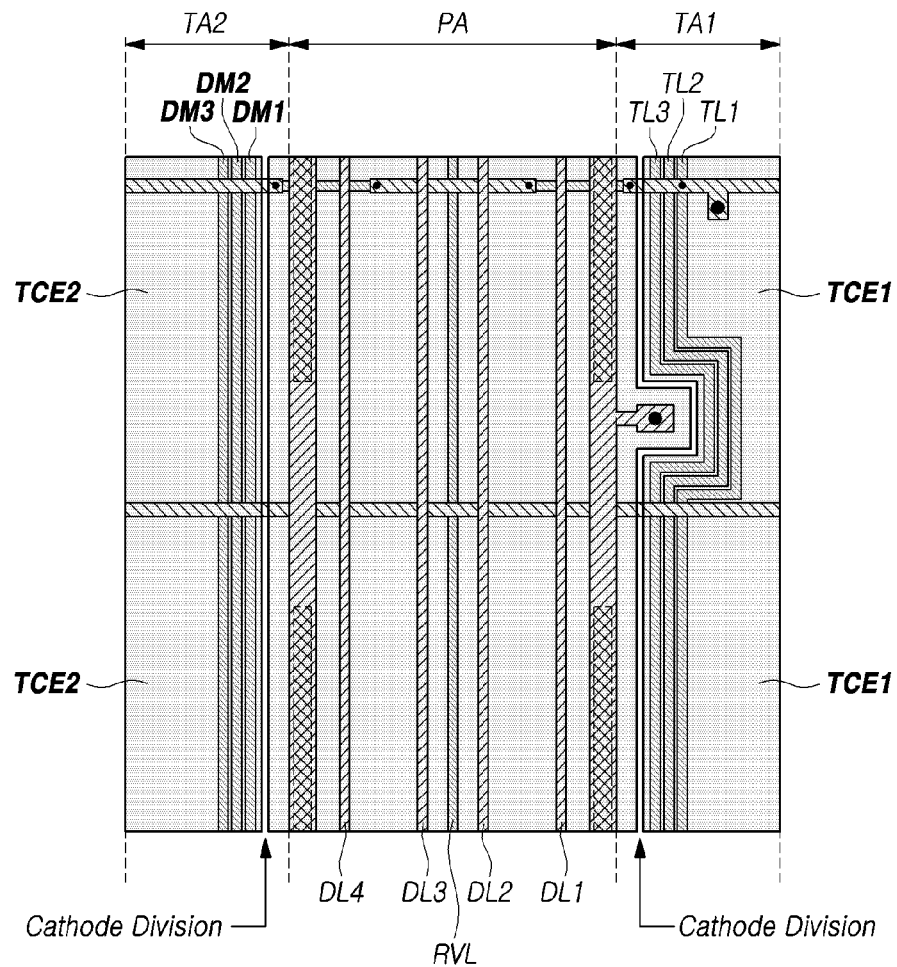

FIGS. 16 and 17 are plan views of the display panel 110 of the transparent touch display device 100 according to aspects of the present disclosure.

Referring to FIG. 16, in relation to the first transmission area TA1, the display panel 110 may include the plurality of touch lines (TL1, TL2, TL3) overlapping the first touch cathode electrode TCE1, as shown in FIG. 11. In contrast, in relation to the second transmission area TA2, the display panel 110 may not include the plurality of touch lines (TL4, TL5, TL6) overlapping the second touch cathode electrode TCE2.

Since the number of touch lines is determined according to the number of touch electrodes, an imbalance in respective arrangements of touch lines in the first transmission area TA1 and the second transmission area TA2 may occur as shown in FIG. 16. This may cause touch sensitivity to be poor.

Referring to FIG. 17, dummy lines (DM1, DM2, DM3) overlapping the second touch cathode electrode TCE2 may be further disposed in order to resolve an imbalance in respective arrangements of touch lines of the first transmission area TA1 and the second transmission area TA2.

The number of dummy lines (DM1, DM2, DM3) overlapping the second touch cathode electrode TCE2 may be equal to the number of touch lines (TL1, TL2, TL3) overlapping the first touch cathode electrode TCE1.

The dummy lines (DM1, DM2, DM3) overlapping the second touch cathode electrode TCE2 may have a different electrical state from the first touch line TL1 or have a floating state, or may not be sensed by the touch driving circuit 160 sensing the first touch line TL1.

Figure 18:
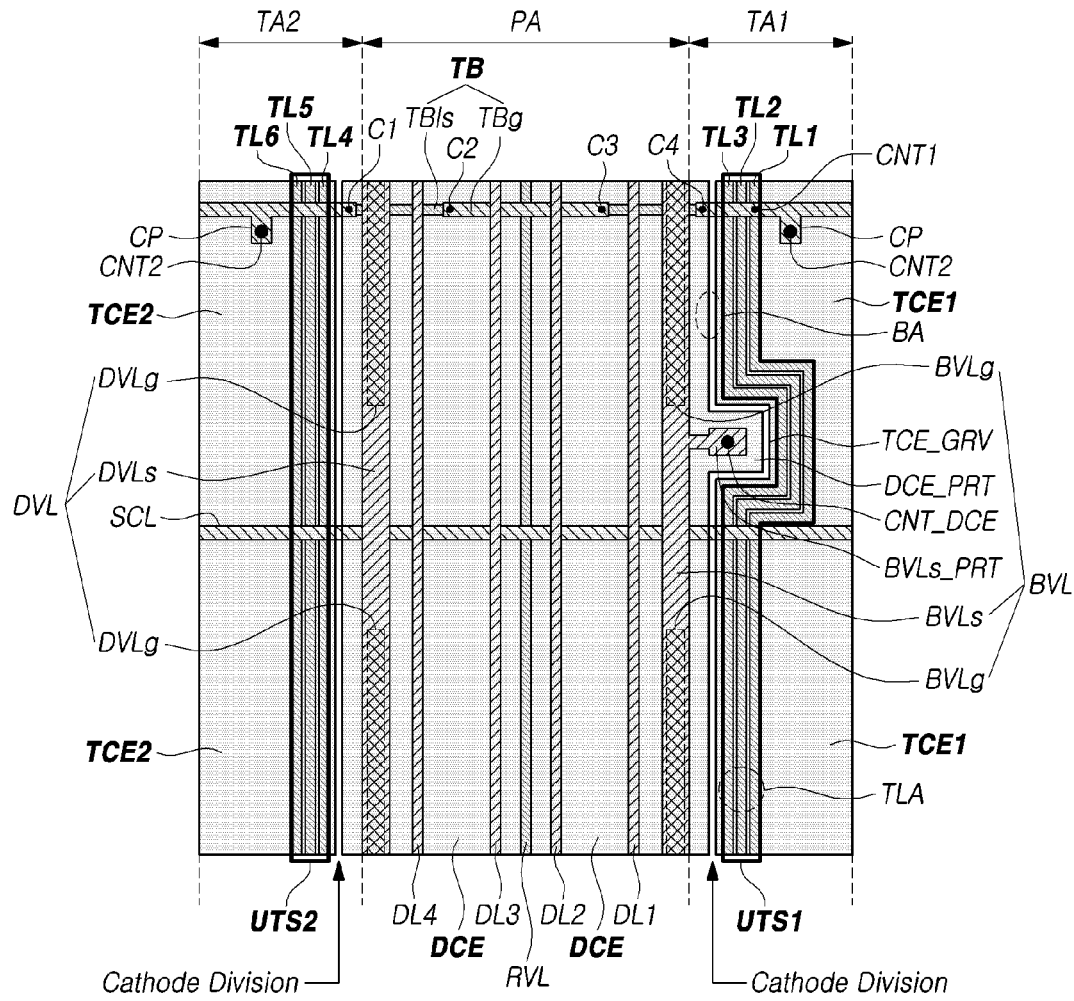
FIG. 18 is a plan view of the display panel in a case where a touch shield structure is applied to the display panel of the transparent touch display device according to aspects of the present disclosure.
Figure 19:
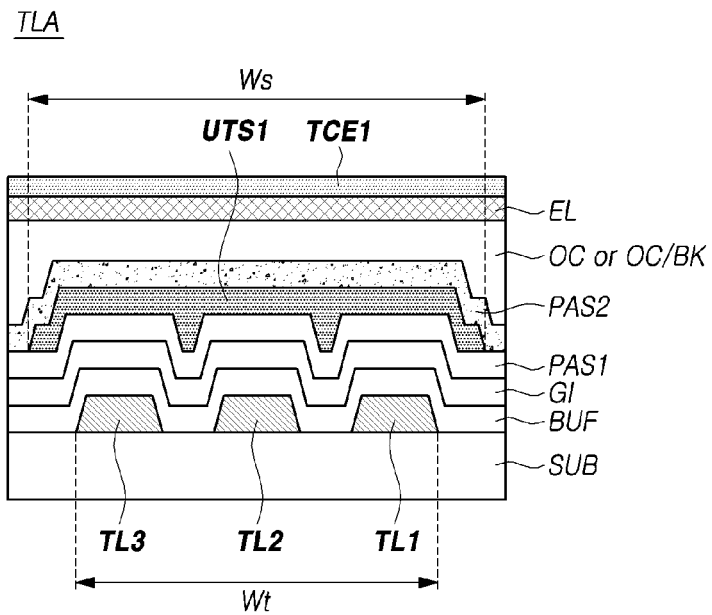
FIG. 19 is a cross-sectional view of a touch line area in FIG. 18.
Figure 20:
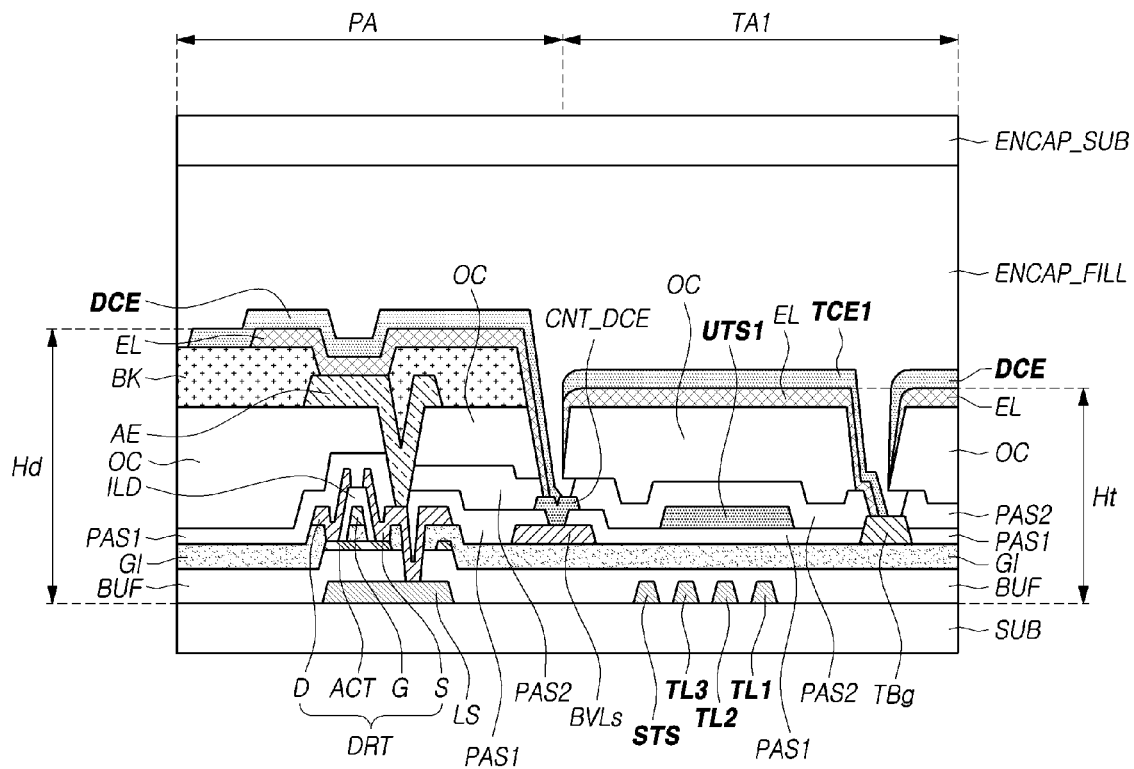
FIG. 20 is a cross-sectional view of the display panel in FIG. 18.

FIG. 18 is a plan view of the display panel 110 in a case where a touch shield structure is applied to the display panel 110 of FIG. 11. FIG. 19 is a cross-sectional view of a touch line area TLA in FIG. 18. FIG. 20 is a cross-sectional view of the display panel 110 of FIG. 18. In discussions that follow, for convenience of description, the first to third touch lines TL1 to TL3 overlapping the first touch cathode electrode TCE1 will be described as an example.

Referring to FIG. 18, in some embodiments, in the display panel 110 of the transparent touch display device 100, the first touch line TL1 may be electrically connected to at least one of the first touch cathode electrode TCE1 and the second touch cathode electrode TCE2.

Referring to FIG. 18, in some embodiments, in the display panel 110 of the transparent touch display device 100, since the first to third touch lines TL1 to TL3 are disposed adjacent to other electrodes or lines related to display driving, there may occur coupling noise between the first to third touch lines TL1 to TL3 and neighboring display driving related patterns. The neighboring display driving related patterns may include display driving related electrodes such as the anode electrode AE, etc., or several types of display lines such as the data lines DL1 to DL4, the base voltage line BVL, the reference voltage line RVL, the driving voltage line DVL, and/or the like.

For example, at least one of the first to third touch lines TL1 to TL3 and the neighboring display driving related patterns may be coupled in a capacitive manner. An electrical state of at least one of the first to third touch lines TL1 to TL3 may affect an electrical state of at least one of the neighboring display driving related patterns. Further, an electrical state of at least one of the neighboring display driving related patterns may affect an electrical state of at least one of the first to third touch lines TL1 to TL3.

As such, when coupling noise between the first to third touch lines TL1 to TL3 and the neighboring display driving related patterns is caused, display driving can affect touch sensing to degrade touch sensitivity, or touch driving can affect display driving to degrade the image quality.

Accordingly, in some embodiments, the display panel 110 of the transparent touch display device 100 may include a touch shield structure for reducing or preventing influences between display driving and touch driving.

Referring to FIGS. 18 to 20, the touch shield structure included in the display panel 110 of the transparent touch display device 100 according to aspects of the present disclosure may further include a first upper touch shield UTS1 disposed over, and overlapping at least a portion of, the first touch line TL1.

Referring to FIGS. 18 to 20, the first upper touch shield UTS1 may be disposed in the fourth metal layer between the source-drain metal layer (the third metal layer) in which the source electrode or the drain electrode of the driving transistor DRT is disposed and the pixel electrode layer in which the anode electrode AE is disposed.

Referring to FIGS. 18 to 20, the fourth metal layer in which the first upper touch shield UTS1 is disposed may be a metal layer located between the source-drain metal layer, which is the third metal layer, and the pixel electrode layer. The fourth metal layer may be a metal layer located between the first passivation layer PAS1 and the second passivation layer PAS2. The first passivation layer PAS1 may be an insulating layer located on the source-drain metal layer, which is the third metal layer. The fourth metal layer may be located on the first passivation layer PAS1, and the second passivation layer PAS2 may be located on the fourth metal layer.

Referring to FIGS. 18 to 20, in some embodiments, in the display panel 110 of the transparent touch display device 100, the first touch line TL1 and the first upper touch shield UTS1 may overlap at least a portion of the first touch cathode electrode TCE1.

Referring to FIGS. 18 to 20, the display panel 110 may include the plurality of touch lines (TL1, TL2, TL3) overlapping the first touch cathode electrode TCE1. The plurality of touch lines (TL1, TL2, TL3) may include the first touch line TL1.

Referring to FIGS. 18 to 20, the first upper touch shield UTS1 may overlap all of the plurality of touch lines (TL1, TL2, TL3) overlapping the first touch cathode electrode TCE1. A line width Ws of the first upper touch shield UTS1 may be greater than a width Wt of an area in which the plurality of touch lines (TL1, TL2, TL3) are disposed.

Referring to FIG. 18, in some embodiments, the display panel 110 of the transparent touch display device 100 may further include a second upper touch shield UTS2 overlapping all of the plurality of touch lines (TL4, TL5, TL6) overlapping the second touch cathode electrode TCE2.

Referring to FIG. 18, in some embodiments, in the display panel 110 of the transparent touch display device 100, the plurality of touch lines (TL1, TL2, TL3) overlapping the first touch cathode electrode TCE1 may be disposed such that the plurality of touch lines (TL1, TL2, TL3) are bent along an electrode groove TCE_GRV of the first touch cathode electrode TCE1. Accordingly, the first upper touch shield UTS1 overlapping the plurality of touch lines (TL1, TL2, TL3) overlapping the first touch cathode electrode TCE1 can be disposed to be bent along the electrode groove TCE_GRV of the first touch cathode electrode TCE1.

Referring to FIG. 18, the second upper touch shield UTS2 may be disposed in a straight line without a bent portion.

Referring to FIG. 20, in some embodiments, the display panel 110 of the transparent touch display device 100 may further include a side touch shield STS to be disposed adjacent to the first touch line TL1.

Referring to FIG. 20, in some embodiments, in the display panel 110 of the transparent touch display device 100, the side touch shield STS may include the same material as the first touch line TL1. For example, the side touch shield STS and the first touch line TL1 may be disposed in the light shield metal layer, which is the first metal layer.

Referring to FIG. 20, the side touch shield STS may be located, among a first side (or first side surface) or edge of the first touch line TL1 and a second side (or second side surface) or edge opposite to the first side or edge, to be adjacent to the second side or edge closer to the anode electrode AE than the first side or edge. As such, as the side touch shield STS is disposed between the anode electrode AE and the first touch line TL1, coupling noise that may be formed between the anode electrode AE and the touch lines TL1 to TL3 can be prevented by the side touch shield STS.

Figure 21:
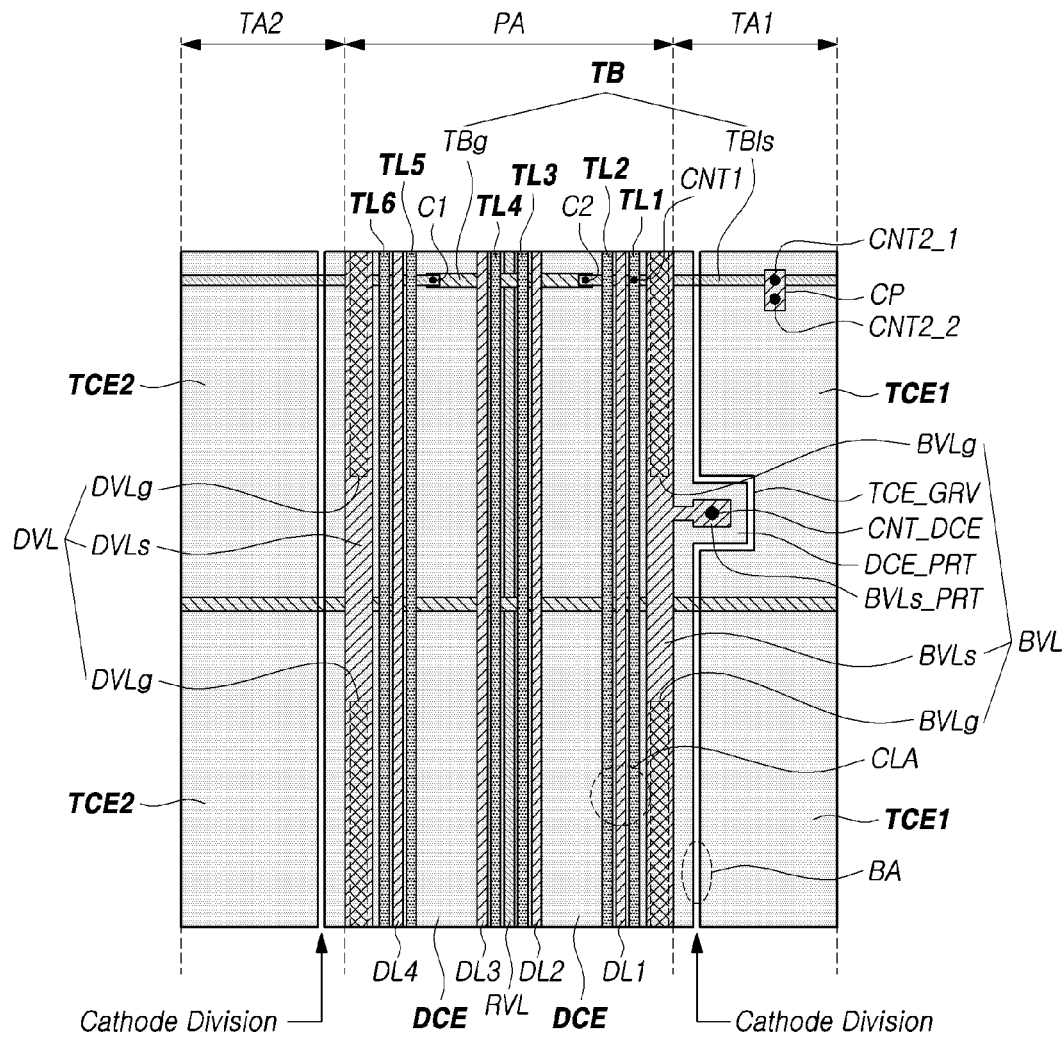
FIG. 21 is a plan view of the display panel of the transparent touch display device according to aspects of the present disclosure.

FIG. 21 is a plan view of the display panel 110 of the transparent touch display device 100 according to aspects of the present disclosure.

Referring to FIG. 21, in some embodiments, the display panel 110 of the transparent touch display device 100 may include the display cathode electrode DCE disposed in the pixel area PA, the first touch cathode electrode TCE1 disposed in the first transmission area TA1, and the second touch cathode electrode TCE2 disposed in the second transmission area TA2.

Referring to FIG. 21, a portion of a first edge of the display cathode electrode DCE may be disposed to extend up to an inside space of the first transmission area TA1. A portion of a second edge of the display cathode electrode DCE may be disposed to extend up to an inside space of the second transmission area TA2.

Referring to FIG. 21, in some embodiments, the display panel 110 of the transparent touch display device 100 may further include a plurality of touch lines (TL1, TL2, TL3, TL4, TL5) overlapping the display cathode electrode DCE.

Referring to FIG. 21, the first touch cathode electrode TCE1 and the second touch cathode electrode TCE2 may be included in one first touch electrode TE, to which a touch driving signal is simultaneously applied.

Referring to FIG. 21, the one first touch electrode TE may be electrically connected to a touch pad TP through one first touch line TL1 of the plurality of touch lines (TL1, TL2, TL3, TL4, TL5) overlapping the display cathode electrode DCE. That is, the first touch cathode electrode TCE1 and the second touch cathode electrode TCE2 may be electrically connected to the touch pad TP through the one first touch line TL1 of the plurality of touch lines (TL1, TL2, TL3, TL4, TL5) overlapping the display cathode electrode DCE.

Referring to FIG. 21, the remaining touch lines (TL2, TL3, TL4, TL5) except for the one first touch line TL1 of the plurality of touch lines (TL1, TL2, TL3, TL4, TL5) overlapping the display cathode electrode DCE may not be electrically connected to the first touch cathode electrode TCE1 and/or the second touch cathode electrode TCE2, and instead, may be electrically connected to another touch cathode electrode TCE electrically disconnected from the first touch cathode electrode TCE1 and the second touch cathode electrode TCE2.

The display cathode electrode DCE, the first touch cathode electrode TCE1, and the second touch cathode electrode TCE2 may be cathode electrode materials that are disconnected by an under-cut portion formed in at least one lower layer located under the cathode electrode layer CEL. Thus, the display cathode electrode DCE, the first touch cathode electrode TCE1, and the second touch cathode electrode TCE2 may include the same cathode electrode material. For example, the cathode electrode material may include a transparent conductive material.

Referring to FIG. 21, the first touch line TL1 may be electrically connected to at least one of the first touch cathode electrode TCE1 and the second touch cathode electrode TCE2.

For example, the first touch line TL1 may be electrically connected to the first touch cathode electrode TCE1 or the second touch cathode electrode TCE2 through the first touch bridge TB. More specifically, as the first touch line TL1 is be electrically connected to the first touch bridge TB through a first contact hole CNT1, and a connection pattern CP, which protrudes from the first touch bridge TB or is connected to the first touch bridge TB, is electrically connected to the first touch cathode electrode TCE1 through second contact holes (CNT2_1, CNT2_2), the first touch line TL1 can be electrically connected to the first touch cathode electrode TCE1 through the first touch bridge TB.

For example, the first touch line TL1 can be electrically connected to the first touch cathode electrode TCE1 as follows: the first touch line TL1 may be electrically connected to the first touch bridge TB through the first contact hole CNT1; the first touch bridge TB may be electrically connected to the connection pattern CP through one second contact hole CNT2_1; and the connection pattern CP may be electrically connected to the first touch cathode electrode TCE1 through another second contact hole CNT2_2.

In some embodiments, when the transparent touch display device 100 has the first type of cathode division structure of FIG. 5, the display cathode electrode DCE may include a plurality of openings; the first touch cathode electrode TCE1 may be disposed in an inner space of a first opening of the plurality of openings of the display cathode electrode DCE; and the second touch cathode electrode TCE2 may be disposed in an inner space of a second opening of the plurality of openings of the display cathode electrode DCE.

In some embodiments, when the transparent touch display device 100 has the second type of cathode division structure of FIG. 7, the first touch cathode electrode TCE1 and the second touch cathode electrode TCE2 may be respective portions of a touch cathode electrode TCE forming one body; the touch cathode electrode TCE may include a plurality of openings; and the display cathode electrode DCE may be disposed in an inner space of one of a plurality of openings of the touch cathode electrode TCE.

In some embodiments, when the transparent touch display device 100 has the third type of cathode division structure of FIG. 8, the display cathode electrode DCE may be disposed in a first edge of the first touch cathode electrode TCE1; another display cathode electrode DCE may be disposed in a second edge opposite to the first edge of the first touch cathode electrode TCE1; and the another display cathode electrode DCE may be disposed to be separated from the display cathode electrode DCE.

Referring to FIG. 21, in some embodiments, the display panel 110 of the transparent touch display device 100 may further include the first scan signal line SCL disposed across the first transmission area TA1, the pixel area PA, and the second transmission area TA2.

Referring to FIG. 21, in some embodiments, the display panel 110 of the transparent touch display device 100 may further include the first touch bridge TB running across the pixel area PA and electrically connecting the first touch cathode electrode TCE1 and the second touch cathode electrode TCE2.

Referring to FIG. 21, in some embodiments, in the display panel 110 of the transparent touch display device 100, the first touch bridge TB may overlap the first touch line TL1, and the first touch line TL1 may be electrically connected to the first touch bridge TB through the first contact hole CNT1.

Referring to FIG. 21, the first touch bridge TB may include the first partial bridge TB1s including the first metal, and the second partial bridge TBg including the second metal different from the first metal.

For example, the first metal may be the same metal as the light shield (the light shield metal) located under the driving transistor DRT disposed in the pixel area PA. The second metal may constitute the gate electrode of the driving transistor DRT or the first scan signal line SCL, or be the gate metal constituting several types of signal lines. The second metal may be located in a vertically higher layer than the first metal. For example, the second metal may be located farther away from the substrate than the first metal.

Referring to FIG. 21, the first partial bridge TB1s and the second partial bridge TBg included in the first touch bridge TB may be located in different layers, and be electrically connected to each other through a plurality of contact holes (C1, C2).

Referring to FIG. 21, the first touch line TL1 may include a metal (e.g., the fourth metal) different from the first metal and the second metal. For example, the first touch line TL1 may be disposed in the fourth metal layer. The fourth metal layer may be a metal layer located between the third metal layer (e.g., the source-drain metal layer) in which the source electrode or drain electrode of the driving transistor DRT is located and the pixel electrode layer in which the anode electrode AE is located.

Thus, when the first touch line TL1 is disposed in the fourth metal layer, the first touch line TL1 may overlap at least one of the first partial bridge TB1s of the first touch bridge TB disposed in the first metal layer and the second partial bridge TBg of the first touch bridge TB disposed in the second metal layer.

The first touch line TL1 may include the first metal. For example, the first touch line TL1 may be disposed in the first metal layer.

Thus, when the first touch line TL1 is disposed in the first metal layer, the first touch line TL1 may overlap the second partial bridge TBg of the first touch bridge TB among the first partial bridge TB1s of the first touch bridge TB disposed in the first metal layer and the second partial bridge TBg of the first touch bridge TB disposed in the second metal layer.

In some embodiments, the first touch line TL1 may be located in any of the remaining layers except for a layer in which the first touch bridge TB is located, among the first metal layer (e.g., the light shield metal layer) in which an electrode or line including the first metal is disposed, the second metal layer (e.g., the gate metal layer) in which an electrode or line including the second metal is disposed, the third metal layer (e.g., the source-drain metal layer) in which an electrode or line including the third metal is disposed, and the fourth metal layer (e.g., a metal layer located between the third metal layer and the pixel electrode layer (anode electrode layer) in which an electrode or line including the fourth metal is disposed. Here, the first metal layer, the second metal layer, the third metal layer, and the fourth metal layer may be located in the upward order of the first metal layer, the second metal layer, the third metal layer, and the fourth metal layer. For example, among the first metal layer, the second metal layer, the third metal layer, and the fourth metal layer, the first metal layer may be vertically the lowest layer closest to the substrate SUB, and the fourth metal layer may be vertically the highest layer farthest away from the substrate SUB.

Referring to FIG. 21, in some embodiments, the display panel 110 of the transparent touch display device 100 may further include the first data line DL1, the second data line DL2, the third data line DL3, and the fourth data line DL4, which are disposed in the pixel area PA.

Referring to FIG. 21, each of the first data line DL1, the second data line DL2, the third data line DL3, and the fourth data line DL4 may include the third metal different from the first metal and the second metal.

For example, the first metal may be the same metal as the light shield located under the driving transistor DRT disposed in the pixel area PA. The second metal may constitute the gate electrode of the driving transistor DRT or the first scan signal line SCL, or be the gate metal constituting several types of signal lines. The third metal may constitute the source electrode and the drain electrode of the driving transistor DRT or be a source-drain metal constituting several types of signal lines. The third metal layer in which the third metal is disposed may be located in a vertically higher layer than the second metal layer in which the second metal is disposed, and the second metal layer may be located in a vertically higher layer than the first metal layer in which the first metal is disposed. For example, the third metal layer may be located farther away from the substrate SUB than the second metal layer, and the second metal layer may be located farther away from the substrate SUB than the first metal layer.

Referring to FIG. 21, each of the first data line DL1, the second data line DL2, the third data line DL3, and the fourth data line DL4 may overlap the first partial bridge TB's or the second partial bridge TBg of the first touch bridge TB.

Referring to FIG. 21, in some embodiments, the display panel 110 of the transparent touch display device 100 may further include the reference voltage line RVL disposed in the pixel area PA.

The reference voltage line RVL may be disposed in a center area (in the vertical or column direction) of the pixel area PA. The reference voltage line RVL may overlap the display cathode electrode DCE and be disposed in the center area (in the vertical or column direction) of the display cathode electrode DCE.

The reference voltage line RVL may include the first metal, and the reference voltage line RVL may overlap the second partial bridge TBg of the first touch bridge TB.

Referring to FIG. 21, in some embodiments, the display panel 110 of the transparent touch display device 100 may further include the base voltage line BVL disposed in the pixel area PA and overlapping the display cathode electrode DCE.

Referring to FIG. 21, the base voltage line BVL may include the first partial base voltage line BVLg including the second metal, and the second partial base voltage lines BVLs including the third metal different from the first metal and the second metal.

Referring to FIG. 21, the second partial base voltage line BVLs may include a double layer part overlapping the first partial base voltage line BVLg and a single layer part not overlapping the first partial base voltage line BVLg.

Referring to FIG. 21, the first partial base voltage line BVLg may at least partially overlap the first partial bridge TB1s of the first touch bridge TB. The double layer part of the second partial base voltage line BVLs may at least partially overlap the first partial bridge TB1s of the first touch bridge TB.

Referring to FIG. 21, the first partial base voltage line BVLg may not overlap the first scan signal line SCL, and the second partial basis voltage line BVLs may overlap the first scan signal line SCL.

Referring to FIG. 21, the base voltage line BVL may be disposed between a first side or edge of the display cathode electrode DCE and the reference voltage line RVL.

Referring to FIG. 21, in some embodiments, the display panel 110 of the transparent touch display device 100 may further include the driving voltage line DVL disposed in the pixel area PA and overlapping the display cathode electrode DCE.

Referring to FIG. 21, the driving voltage line DVL may include the first partial driving voltage line DVLg including the second metal, and the second partial driving voltage line DVLs including the third metal different from the first metal and the second metal.

Referring to FIG. 21, the second partial driving voltage line DVLs may include a double layer part overlapping the first partial driving voltage line DVLg and a single layer part not overlapping the first partial driving voltage line DVLg.

Referring to FIG. 21, the first partial driving voltage line DVLg may at least partially overlap the first partial bridge TB1s of the first touch bridge TB. The double layer part of the second partial driving voltage line DVLs may at least partially overlap the first partial bridge TB1s of the first touch bridge TB.

However, the first partial driving voltage line DVLg may not overlap the second partial bridge TBg of the first touch bridge TB, and the double layer part of the second partial driving voltage line DVLs may not overlap the second partial bridge TBg of the first touch bridge TB.

Referring to FIG. 21, the driving voltage line DVL may be disposed between a second side or edge of the display cathode electrode DCE and the reference voltage line RVL.

Referring to FIG. 21, in some embodiments, the display panel 110 of the transparent touch display device 100 may further include the base voltage line BVL disposed in the pixel area PA, overlapping the display cathode electrode DCE, and electrically connected to the display cathode electrode DCE.

Referring to FIG. 21, the display cathode electrode DCE may include the electrode protrusion DCE_PRT. The first touch cathode electrode TCE1 may include the electrode groove TCE_GRV in which the electrode protrusion DCE_PRT of the display cathode electrode DCE is inserted. The electrode protrusion DCE_PRT of the display cathode electrode DCE and the electrode groove TCE_GRV of the first touch cathode electrode may be electrically disconnected from each other.

Referring to FIG. 21, the base voltage line BVL may include the line protrusion BVLs_PRT overlapping the electrode protrusion DCE_PRT of the display cathode electrode DCE. The line protrusion BVLs_PRT of the base voltage line BVL may be electrically connected to the electrode protrusion DCE_PRT of the display cathode electrode DCE through the display cathode contact pattern CNT_DCE.

Referring to FIG. 21, the driving voltage line DVL may be disposed in the pixel area PA and overlap the display cathode electrode DCE, and the base voltage line BVL may be disposed in the pixel area PA, overlap the display cathode electrode DCE, and be electrically connected to the display cathode electrode DCE.

Referring to FIG. 21, the first touch line TL1 may overlap the display cathode electrode DCE and be disposed between the driving voltage line DVL and the base voltage line BVL.

Referring to FIG. 21, the first data line DL1 may overlap the display cathode electrode DCE and be disposed in the pixel area PA.

Referring to FIG. 21, the first touch line TL1 may be disposed between the first data line DL1 and the base voltage line BVL or between the first data line DL1 and the driving voltage line DVL.

Figure 22:
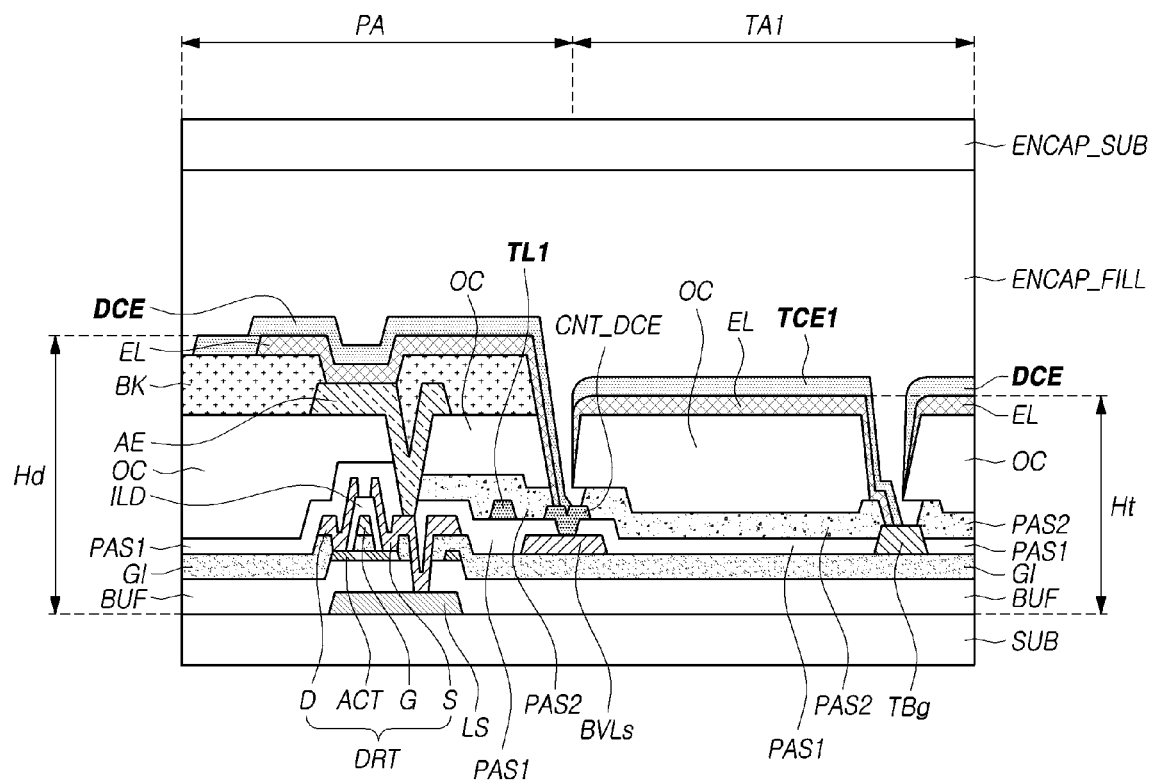
FIG. 22 is a cross-sectional view of the display panel of the transparent touch display device according to aspects of the present disclosure.
Figure 23:
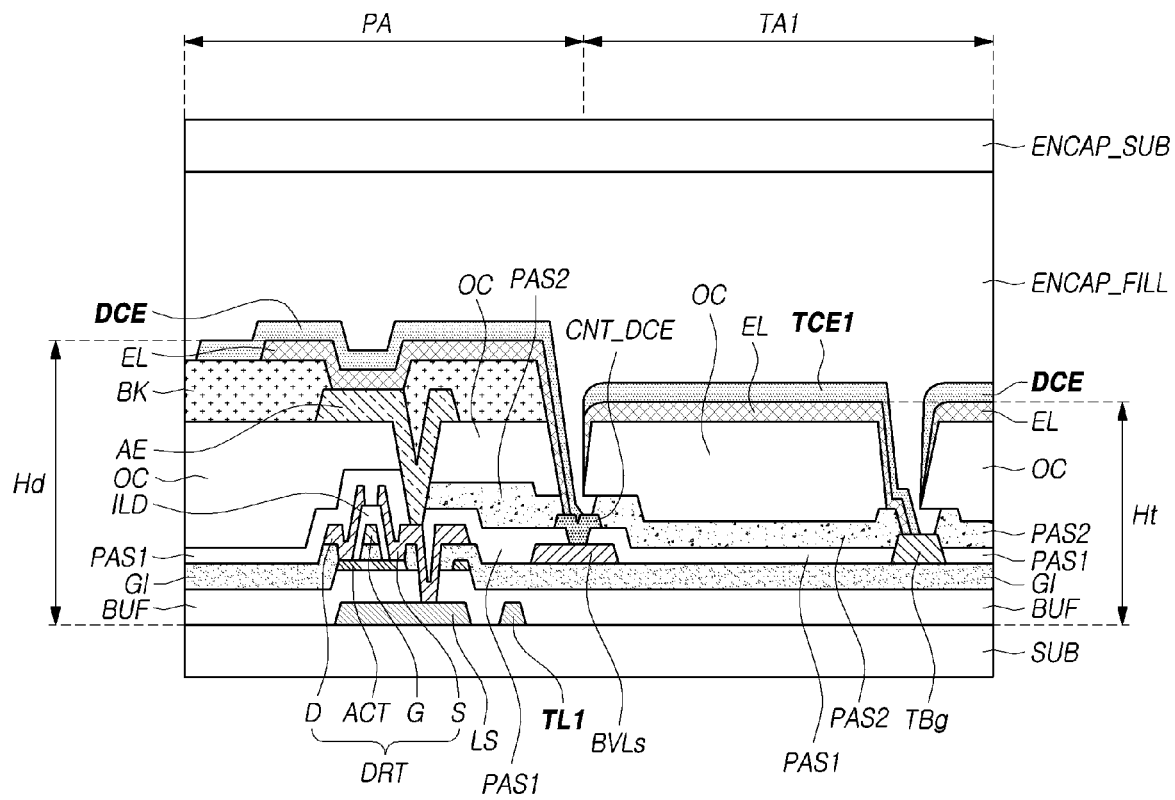
FIG. 23 is another cross-sectional view of the display panel of the transparent touch display device according to aspects of the present disclosure.

FIGS. 22 and 23 are cross-sectional views of the display panel 110 of the transparent touch display device 100 according to aspects of the present disclosure. For convenience of description, FIGS. 22 and 23 briefly illustrates a vertical structure of a partial area of the pixel area PA and the first transmission area TA1 in the configurations of the foregoing figures. The vertical structure of FIGS. 22 and 23 is basically the same as the vertical structure of FIG. 15, and only in a location of the touch line, has some differences compared with the configuration of FIG. 15. Hereinafter, in describing the vertical structure of FIGS. 22 and 23, discussions will be conducted with respect to configurations or portions different from the vertical structure of FIG. 15.

For convenience of description, FIGS. 22 and 23 illustrate only a first touch line TL1 of first to sixth touch lines (TL1, TL2, TL3, TL4, TL5, and TL6) overlapping the display cathode electrode DCE. The vertical structure of FIG. 22 and the vertical structure of FIG. 23 are different from each other only in a vertical location of the first touch line TL1, and that is, are equal in the remaining portions or configurations.

Referring to FIGS. 22 and 23, a portion of the display cathode electrode DCE may be disposed to extend up to an inner space formed in a portion of the first transmission area TA1. The first touch cathode electrode TCE1, the first touch line TL1, the first touch bridge TB, and the like may be disposed in the first transmission area TA1.

Referring to FIGS. 22 and 23, in some embodiments, the display panel 110 of the transparent touch display device 100 may further include the light shield LS located under the driving transistor DRT, and overlapping the active layer ACT of the driving transistor DRT. When the active layer ACT of the driving transistor DRT is exposed to light, a channel characteristic of a channel region of the active layer ACT may change. By disposing the light shield LS under the active layer ACT, as light upwardly traveling from under the light shield LS is blocked by the light shield LS, thus, the active layer ACT of the driving transistor DRT can be prevented from being exposed to light. The light shield LS may include the first metal. Hereinafter, the first metal is referred to as the light shield metal. A layer in which the light shield LS is located may be referred to as the light shield metal layer. The light shield LS may be disposed in the pixel area PA.

Referring to FIGS. 22 and 23, the first touch line TL1 may overlap the display cathode electrode DCE. The first touch line TL1 may be disposed in the first metal layer (the light shield metal layer) in which the light shield LS is disposed, or in the fourth metal layer disposed between the third metal layer and the pixel electrode layer.

Referring to FIGS. 22 and 23, in some embodiments, the display panel 110 of the transparent touch display device 100 may have a top emission structure in which light for image display is emitted to the upper surface of the encapsulation substrate ENCAP_SUB. To this end, the display cathode electrode DCE, the first touch cathode electrode TCE1, and the second touch cathode electrode TCE2 may include the same transparent conductive material, and the anode electrode AE may include a reflective metal material.

Hereinafter, the vertical structure of the display panel 110 will be described in further detail with reference to FIGS. 22 and 23.

Referring to FIGS. 22 and 23, the light shield metal layer, which is the first metal layer, may be disposed on the substrate SUB. Here, the light shield metal layer, which is the first metal layer, may be a layer in which the light shield metal, which is the first metal, is disposed, and be located closest to the substrate SUB.

Referring to FIGS. 22 and 23, the light shield LS or the like may be disposed in the light shield metal layer, which is the first metal layer. Further, the first partial bridge TB's of the first touch bridge TB and reference voltage line RVL may be disposed in the light shield metal layer. That is, the light shield LS, the first partial bridge TB1s of the first touch bridge TB, and the reference voltage line RVL may include the light shield metal.

Referring to FIGS. 22 and 23, the buffer layer BUF may be disposed to cover the light shield LS. The buffer layer BUF may be a single layer or multilayer.

Referring to FIGS. 22 and 23, the active layer ACT may be disposed on the buffer layer BUF, and the gate insulating layer GI may be disposed such that the gate insulating layer GI covers the active layer ACT.

Referring to FIGS. 22 and 23, the gate electrode G and the second partial bridge TBg of the first touch bridge TB may be disposed on the gate insulating layer GI. The gate electrode G and the second partial bridge TBg of the first touch bridge TB may include the gate metal. The gate electrode G and the second partial bridge TBg of the first touch bridge TB may be located in the gate metal layer, which is the second metal layer. In addition, the first partial base voltage line BVLg of the base voltage line BVL and the first partial driving voltage line DVLg of the driving voltage line DVL may be further disposed in the gate metal layer.

Referring to FIGS. 22 and 23, the interlayer insulating layer ILD may be disposed on the gate electrode G, and the source electrode S and the drain electrode D including the source-drain metal, which is the third metal, may be disposed on the interlayer insulating layer ILD. That is, the source electrode S and the drain electrode D of the driving transistor DRT may be located in the source-drain metal layer, which is the third metal layer. In addition, the second partial base voltage line BVLs of the base voltage line BVL and the second partial driving voltage line DVLs of the driving voltage line DVL may be further disposed in the source-drain metal layer.

Referring to FIGS. 22 and 23, the source electrode S may be connected to one side or edge of the active layer ACT through a through hole of the gate insulating layer GI, and the drain electrode D may be connected to the other side or edge of the active layer ACT through a through hole of the gate insulating layer GI.

Referring to FIGS. 22 and 23, the source electrode S may be connected to the light shield LS using through holes formed in the gate insulating layer GI and the buffer layer BUF. Accordingly, a stable operation of the driving transistor DRT in relation to a body effect can be performed.

Referring to FIGS. 22 and 23, the first passivation layer PAS1 may be disposed on the source-drain metal layer. The display cathode contact pattern CNT_DCE may be disposed on the first passivation layer PAS1. A layer in which the display cathode contact pattern CNT_DCE is located is referred to as the fourth metal layer. That is, the display cathode contact pattern CNT_DCE may include the fourth metal.

The display cathode contact pattern CNT_DCE may be connected to the second partial base voltage line BVLs of the base voltage line BVL through a through hole of the first passivation layer PAS1. Referring to FIGS. 21 to 23 together, a portion of the second partial base voltage line BVLs of the base voltage line BVL, which contacts, or is connected to, the display cathode contact pattern CNT_DCE, may be a line protrusion BVLs_PRT of the base voltage line BVL.

Referring to FIGS. 22 and 23, the second passivation layer PAS2 may be disposed such that the second passivation layer PAS2 covers the display cathode contact pattern CNT_DCE on the first passivation layer PAS1. A metal layer between the first passivation layer PAS1 and the second passivation layer PAS2 may be the fourth metal layer including the fourth metal, and the display cathode contact pattern CNT_DCE may be located in the fourth metal layer.

Referring to FIG. 22, the first touch line TL1 may overlap the display cathode electrode DCE and be located in the fourth metal layer. That is, the first touch line TL1 may be disposed in the fourth metal layer.

The fourth metal layer may be a metal layer located between the third metal layer (e.g., the source-drain metal layer) in which the source electrode or drain electrode of the driving transistor DRT is located and the pixel electrode layer in which the anode electrode AE is located. The fourth metal layer may be a metal layer located between the first passivation layer PAS1 and the second passivation layer PAS2.

Referring to FIG. 23, the first touch line TL1 may not be disposed in the fourth metal layer and instead, may be disposed in the first metal layer (the light shield metal layer) in which the light shield LS is disposed.

As described above, the first touch line TL1 may be located in the fourth metal layer as shown in FIG. 22 or located in the first metal layer as shown in FIG. 23. This is merely for convenience of description, and the layer in which the first touch line TL1 is disposed may be variously changed. For example, the first touch line TL1 may be located in any of the remaining layers except for a layer in which the first touch bridge TB is located among the first metal layer (the light shield metal layer), the second metal layer (the gate metal layer), the third metal layer (the source-drain metal layer), and the fourth metal layer (a metal layer located between the third metal layer and the pixel electrode layer).

Referring to FIGS. 22 and 23, the overcoat layer OC may be disposed on the first passivation layer PAS1 and the second passivation layer PAS2. A lower portion of the overcoat layer OC may have an under-cut structure.

Referring to FIGS. 22 and 23, the anode electrode AE may be disposed in the pixel electrode layer on the overcoat layer OC, and the anode electrode AE may be connected to the source electrode S of the driving transistor DRT using through holes formed in the overcoat layer OC and the first passivation layer PAS1.

Referring to FIGS. 22 and 23, the bank BK may be disposed on the anode electrode AE. The bank BK may have an opening, and the top surface of a portion of the anode electrode AE may be exposed through the opening of the bank BK. The bank BK may be located in the pixel area PA and not disposed in the first transmission area TA1.

Referring to FIGS. 22 and 23, the emission layer EL may be disposed in both the pixel area PA and the first transmission area TA1. In the pixel area PA, the emission layer EL may be disposed on the bank BK, and may be disposed in contact with the top surface of at least a portion of the anode electrode AE in the opening of the bank BK. In the first transmission area TA1, the emission layer EL may be disposed on the overcoat layer OC.

However, the emission layer EL in the pixel area PA and the emission layer EL in the first transmission area TA1 may not connected to each other. For example, the emission layer EL in the pixel area PA and the emission layer EL in the first transmission area TA1 may be disconnected to each other at a boundary area between the pixel area PA and the first transmission area TA1. That is, the emission layer EL may be disconnected by the under-cut structure of the overcoat layer OC in the boundary area between the pixel area PA and the first transmission area TA1.

Referring to FIGS. 22 and 23, a cathode electrode material in the cathode electrode layer CEL may be located on the emission layer EL, and may be disconnected in the boundary area between the pixel area PA and the first transmission area TA1 by the under-cut structure of the overcoat layer OC. As a result, the cathode electrode material located on the emission layer EL in the pixel area PA may be referred to as the display cathode electrode DCE, and the cathode electrode material located on the emission layer EL in the first transmission area TA1 may be referred to as the first touch cathode electrode TCE1.

Referring to FIGS. 22 and 23, in the boundary area between the pixel area PA and the first transmission area TA1, the display cathode electrode DCE may be electrically connected to the display cathode contact pattern CNT_DCE using through holes formed in the overcoat layer OC and the second passivation layer PAS2. Accordingly, the display cathode electrode DCE may be electrically connected to the second partial base voltage line BVLs of the base voltage line BVL through the display cathode contact pattern CNT_DCE.

Referring to FIGS. 22 and 23, in another boundary area between the pixel area PA and the first transmission area TA1, the first touch cathode electrode TCE1 may be electrically connected to the second partial bridge TBg of the first touch bridge TB using through holes formed in the overcoat layer OC and the second passivation layer PAS2.

Although the first touch line TL1 and the display cathode electrode DCE overlap each other, the first touch line TL1 and the display cathode electrode DCE may have different electrical states. For example, a voltage having a constant voltage level (e.g., a base voltage EVSS) may be applied to the display cathode electrode DCE. A signal (e.g., a touch driving signal) having a variable voltage level may be applied to the first touch line TL1.

Figure 24:
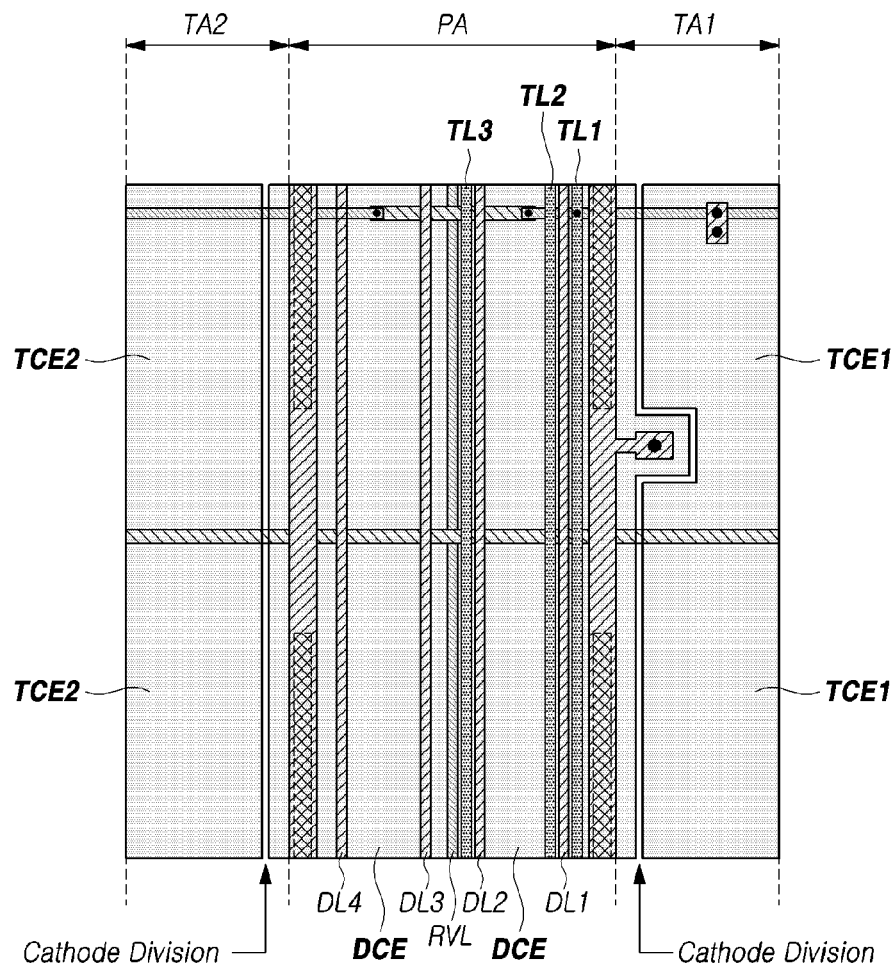
FIGS. 24 and 25 are plan views of the display panel of the transparent touch display device according to aspects of the present disclosure.
Figure 25:
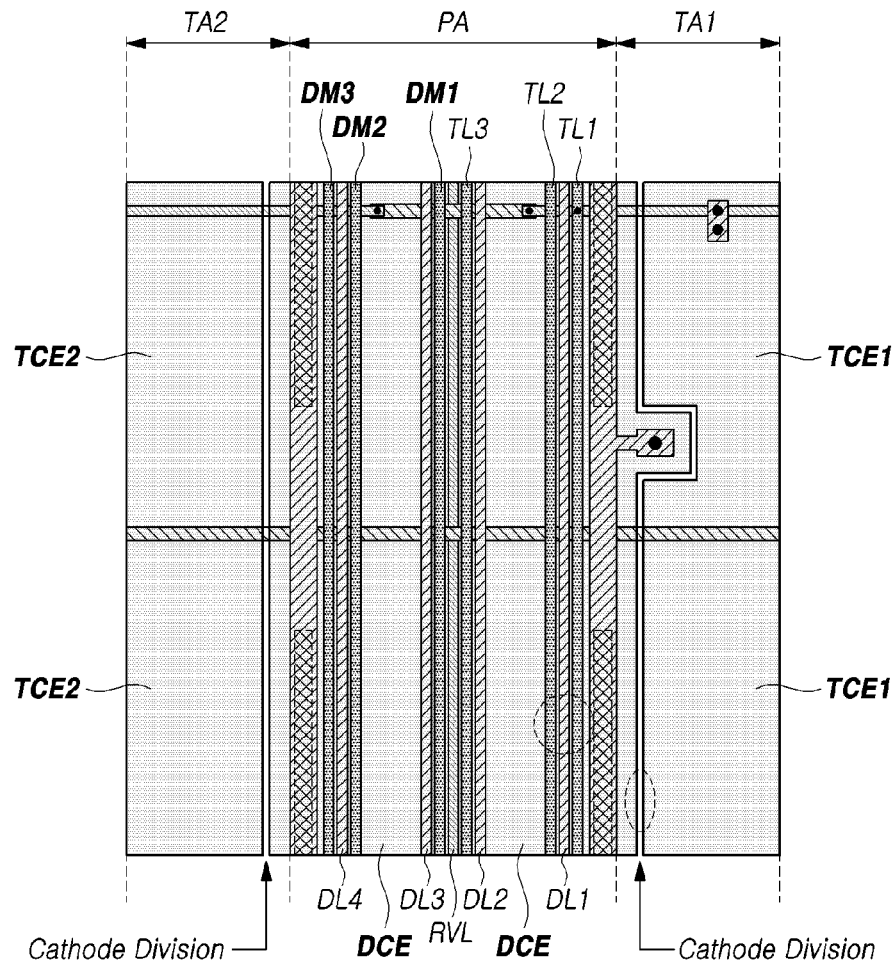

FIGS. 24 and 25 are plan views of the display panel 110 of the transparent touch display device 100 according to aspects of the present disclosure.

Referring to FIGS. 24 and 25, in some embodiments, the display panel 110 of the transparent touch display device 100 may include the reference voltage line RVL overlapping the display cathode electrode DCE, and disposed in a center area of the display cathode electrode DCE.

Referring to FIGS. 24 and 25, in some embodiments, the display panel 110 of the transparent touch display device 100 may include a first touch line TL1, a second touch line TL2, and a third touch line TL3, which overlap the display cathode electrode DCE.

Referring to FIGS. 24 and 25, the first touch line TL1, the second touch line TL2, and the third touch line TL3 may be disposed between a first side or edge of the display cathode electrode DCE and the reference voltage line RVL.

As illustrated in FIG. 24, the first touch line TL1, the second touch line TL2, and the third touch line TL3 may be disposed between the first side or edge of the display cathode electrode DCE and the reference voltage line RVL, and in contrast, no touch line may be disposed between a second side or edge of the display cathode electrode DCE and the reference voltage line RVL.

As illustrated in FIG. 24, the plurality of touch lines (TL1, TL2, TL3) overlapping the display cathode electrode DCE may be disposed to be located in one side or one half of the entire area overlapping the display cathode electrode DCE. Such an imbalanced line arrangement may cause an imbalance in the panel structure, cause an imbalance in capacitor coupling, and cause a decrease in touch sensitivity or a decrease in display performance.

As illustrated in FIG. 25, in some embodiments, the display panel 110 of the transparent touch display device 100 may further include a first dummy line DM1, a second dummy line DM2, and a third dummy line DM3, which overlap the display cathode electrode DCE.

Referring to FIG. 25, the first touch line TL1, the second touch line TL2, and the third touch line TL3 may be disposed between a first side or edge of the display cathode electrode DCE and the reference voltage line RVL, and the first dummy line DM1, the second dummy line DM2, and the third dummy line DM3 may be disposed between a second side or edge of the display cathode electrode DCE and the reference voltage line RVL.

The first dummy line DM1, the second dummy line DM2, and the third dummy line DM3 may have a different electrical state from the first touch line TL1, the second touch line TL2, and the third touch line TL3 or have a floating state, or may not be sensed by the touch driving circuit 160 sensing the first touch line TL1, the second touch line TL2, and the third touch line TL3.

As illustrated in FIG. 25, the number of touch lines between the first side or edge of the display cathode electrode DCE and the reference voltage line RVL may be equal to the number of dummy lines between the second side or edge of the display cathode electrode DCE and the reference voltage line RVL.

As illustrated in FIG. 25, as the first dummy line DM1, the second dummy line DM2, and the third dummy line DM3 are additionally disposed, an imbalance in the line arrangement can be eliminated.

Figure 26:
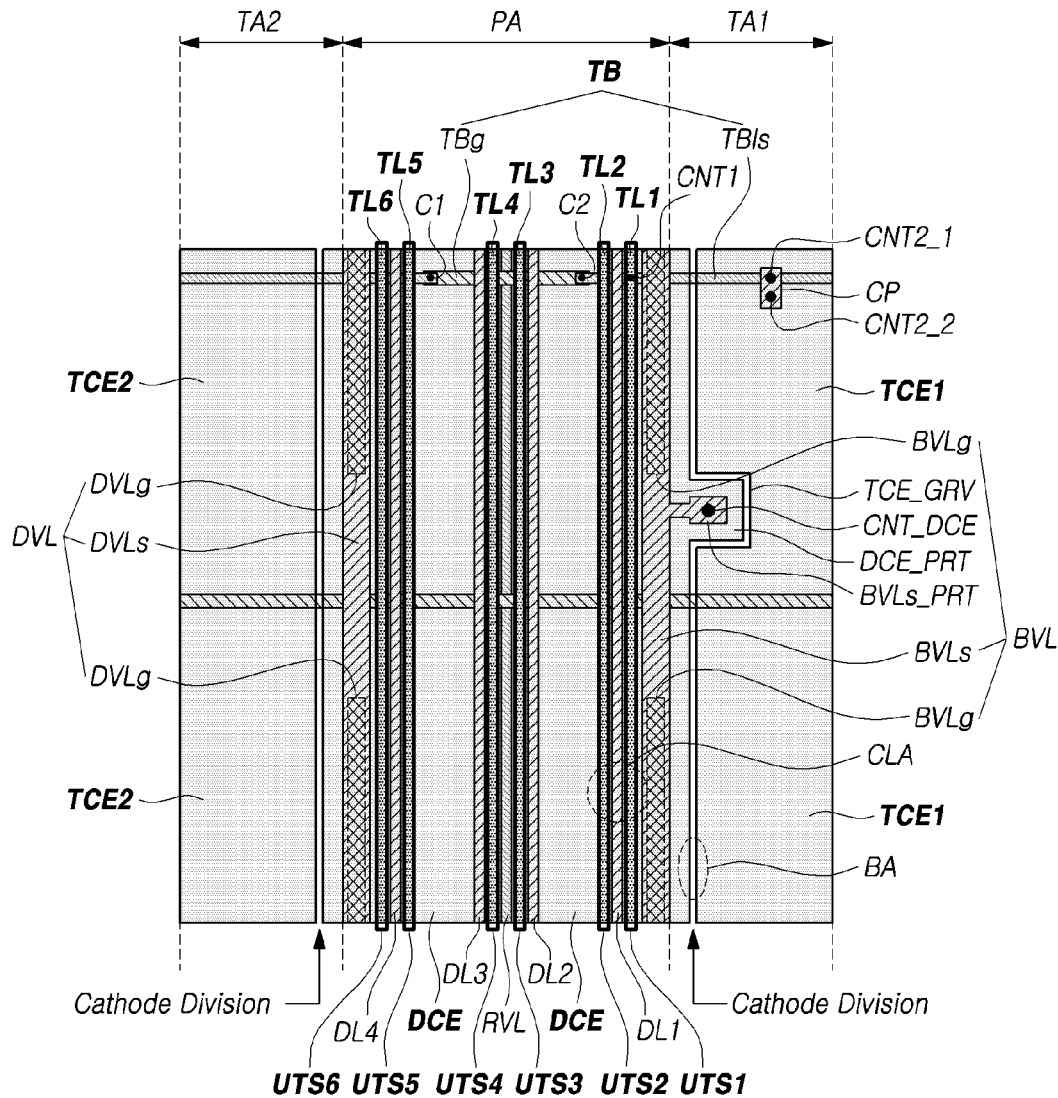
FIG. 26 is a plan view of the display panel in a case where a touch shield structure is applied to the display panel of FIG. 21.
Figure 27:
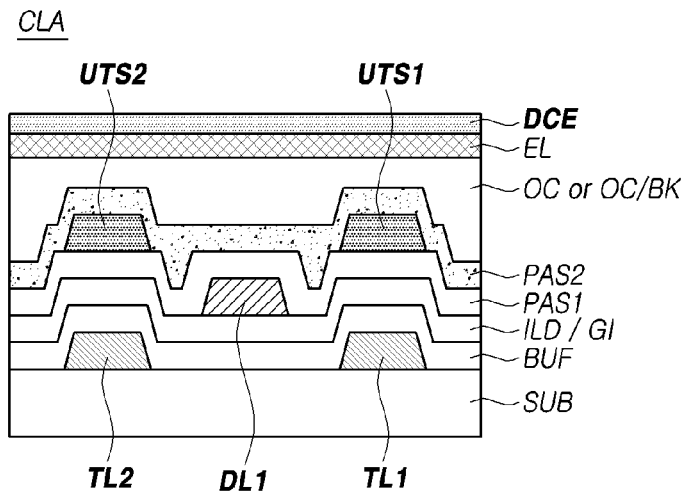
FIG. 27 is a cross-sectional view of a column line area of the display panel of FIG. 26.
Figure 28:
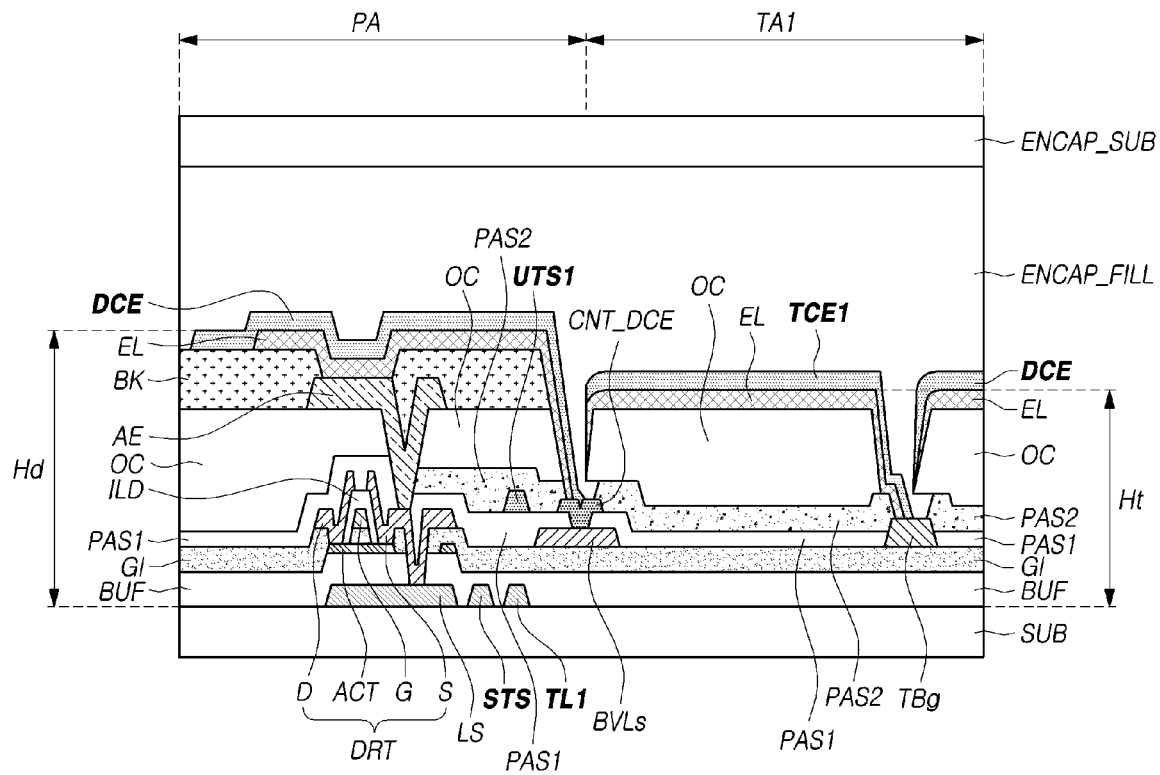
FIG. 28 is a cross-sectional view of the display panel of FIG. 26.

FIG. 26 is a plan view of the display panel 110 in a case where a touch shield structure is applied to the display panel 110 of FIG. 21. FIG. 27 is a cross-sectional view of a column line area CLA of the display panel 110 of FIG. 26. FIG. 28 is a cross-sectional view of the display panel of FIG. 26.

Referring to FIGS. 26 to 28, in some embodiments, the touch shield structure included in the display panel 110 of the transparent touch display device 100 may further include a first upper touch shield UTS1 disposed over, and overlapping at least a portion of, the first touch line TL1.

Referring to FIGS. 26 to 28, the first touch line TL1 and the first upper touch shield UTS1 may overlap the display cathode electrode DCE.

Referring to FIGS. 26 to 28, in some embodiments, the touch shield structure included in the display panel 110 of the transparent touch display device 100 may further include the driving voltage line DVL disposed in the pixel area PA and overlapping the display cathode electrode DCE, and the base voltage line BVL disposed in the pixel area PA, overlapping the display cathode electrode DCE, and electrically connected to the display cathode electrode DCE.

Referring to FIGS. 26 to 28, in some embodiments, the display panel 110 of the transparent touch display device 100 may further include the reference voltage line RVL disposed in the pixel area PA, overlapping the display cathode electrode DCE, and located in a center area (in the vertical or column direction) of the display cathode electrode DCE.

Referring to FIGS. 26 to 28, the first touch line TL1 and the first upper touch shield UTS1 may be disposed between the driving voltage line DVL and the base voltage line BVL. The first touch line TL1 and the first upper touch shield UTS1 may be positioned between the base voltage line BVL and the reference voltage line RVL.

Referring to FIGS. 26 to 28, in some embodiments, the display panel 110 of the transparent touch display device 100 may further include the second touch line TL2, or the like, which at least partially overlaps the display cathode electrode DCE.

Referring to FIGS. 26 to 28, in some embodiments, the display panel 110 of the transparent touch display device 100 may further include a display line disposed between the first touch line TL1 and the second touch line TL1 overlapping the display cathode electrode DCE, and located in a different layer from the first and second touch lines TL1 and TL2. For example, the display line may be the first data line DL1 of FIG. 26, and in some cases, may be the reference voltage line RVL, the base voltage line BVL, or the driving voltage line DVL.

Referring to FIGS. 26 to 28, the first touch line TL1 and the second touch line TL2 may be located in the light shield metal layer, which is the first metal layer closest to the substrate SUB, and the first data line DL1 may be located in the source-drain metal layer, which is the third metal layer located in a vertically higher layer than the first metal layer.

Referring to FIGS. 26 to 28, in some embodiments, the touch shield structure included in the display panel 110 of the transparent touch display device 100 may further include the second upper touch shield UTS2 disposed over the second touch line TL2, and overlapping at least a portion of the second touch line TL2.

Referring to FIGS. 26 to 28, in some embodiments, the display panel 110 of the transparent touch display device 100 may include first to sixth upper touch shields UTS1 to UTS6 respectively overlapping the first to sixth touch lines TL1 to TL6 overlapping the display cathode electrode DCE.

Referring to FIG. 28, in some embodiments, the display panel 110 of the transparent touch display device 100 may further include the side touch shield STS to be disposed adjacent to the first touch line TL1.

Referring to FIG. 28, in some embodiments, in the display panel 110 of the transparent touch display device 100, the side touch shield STS may include the same material as the first touch line TL1. For example, the side touch shield STS and the first touch line TL1 may be disposed in the light shield metal layer, which is the first metal layer.

Referring to FIG. 28, the side touch shield STS may be located, among a first side or edge of the first touch line TL1 and a second side or edge opposite to the first side or edge, to be adjacent to the second side or edge closer to the anode electrode AE than the first side or edge. As such, as the side touch shield STS is disposed between the anode electrode AE and the first touch line TL1, coupling noise that may be formed between the anode electrode AE and the first touch line TL1 can be prevented by the side touch shield STS.

Figure 29:
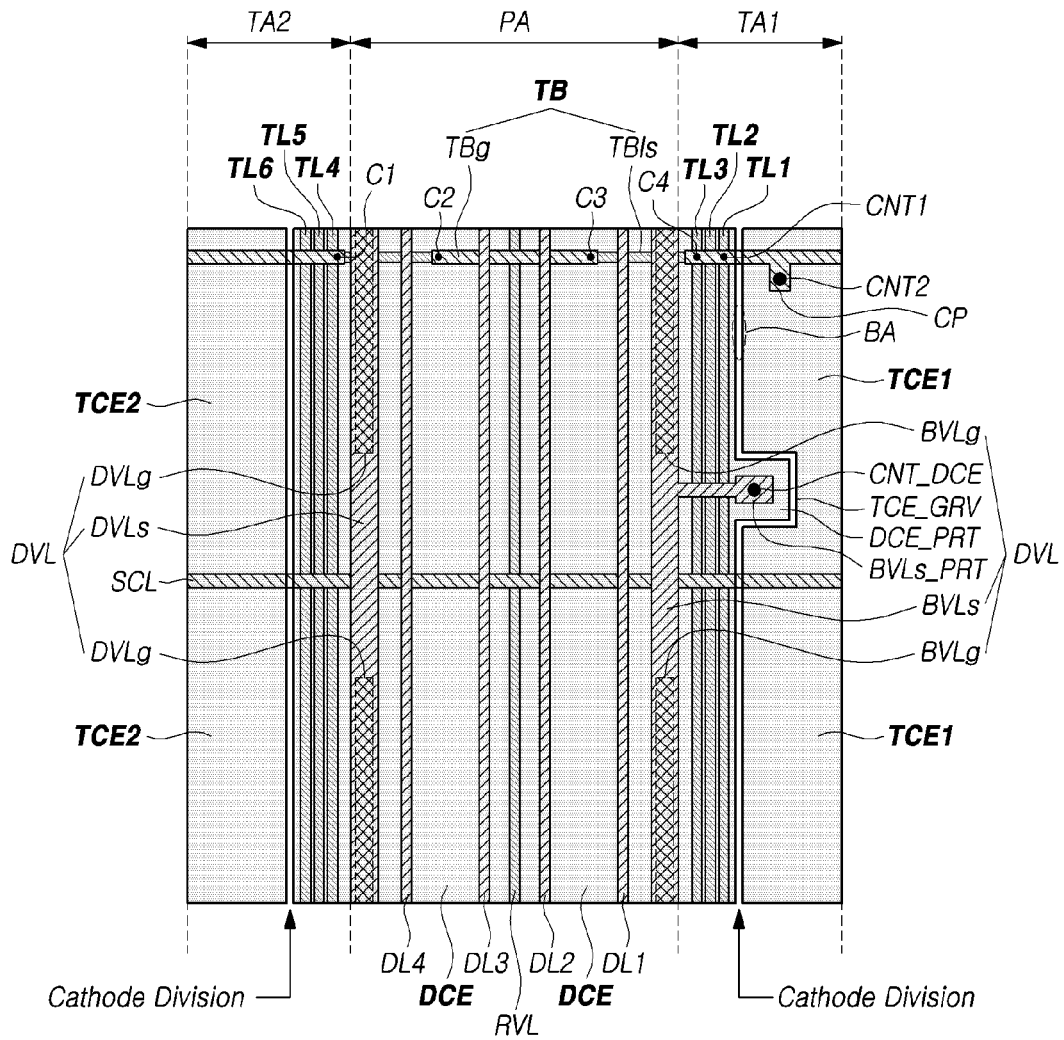
FIG. 29 is another plan view of the display panel of the transparent touch display device according to aspects of the present disclosure.

FIG. 29 is another plan view of the display panel 110 of the transparent touch display device 100 according to aspects of the present disclosure. It should be noted that the structure in the plan view of FIG. 29 is nearly the same as the structure in the plan view of FIG. 21. Only the locations of touch lines in the structure of FIG. 29 are slightly different from the locations of the touch lines in the structure of FIG. 21. Hereinafter, discussions on the structure of FIG. 29 will be conducted by focusing on features different from the structure of FIG. 21.

Referring to FIG. 29, the first touch line TL1 may include the first metal. For example, the first touch line TL1 may be disposed in the light shield metal layer, which is the first metal layer.

Referring to FIG. 29, among the first partial bridges TB1s and the second partial bridges TBg of the first touch bridge TB, the first partial bridges TB1s of the first touch bridge TB may be disposed in the light shield metal layer, which is the first metal layer. Accordingly, the first partial bridges TB1s of the first touch bridge TB disposed in the first metal layer cannot cross over and overlap the first touch line TL1 disposed in the first metal layer.

Referring to FIG. 29, among the first partial bridges TB1s and the second partial bridges TBg of the first touch bridge TB, the second partial bridge TBg may be disposed in the gate metal layer, which is the second metal layer. Accordingly, the second partial bridge TBg of the first touch bridge TB disposed in the second metal layer can cross over and overlap the first touch line TL1 disposed in the first metal layer.

Referring to FIG. 29, the first to sixth touch lines TL1 to TL6 may be disposed to overlap the display cathode electrode DCE.

Referring to FIG. 29, the first to third touch lines TL1 to TL3 may overlap a portion of the display cathode electrode DCE, which extends up to an inner space of the first transmission area TA1. Accordingly, it can be considered that the first to third touch lines TL1 to TL3 are disposed in the first transmission area TA1.

Referring to FIG. 29, the fourth to sixth touch lines TL4 to TL6 may overlap a portion of the display cathode electrode DCE, which extends up to an inner space of the second transmission area TA2. Accordingly, it can be considered that the fourth to sixth touch lines TL4 to TL6 are disposed in the second transmission area TA2.

Referring to FIG. 29, the reference voltage line RVL may be disposed in the pixel area PA, overlap the display cathode electrode DCE, and be located in a center area of (in the vertical or column direction) of the display cathode electrode DCE.

Referring to FIG. 29, the base voltage line BVL may be disposed in the pixel area PA, disposed to overlap a first portion of the display cathode electrode DCE, and electrically connected to the display cathode electrode DCE. The first portion of the display cathode electrode DCE may be a portion of the display cathode electrode DCE, and correspond to a partial area of a pixel area PA adjacent to the first transmission area TA1.

Referring to FIG. 29, the driving voltage line DVL may be disposed in the pixel area PA and disposed to overlap a second portion of the display cathode electrode DCE. The second portion of the display cathode electrode DCE may be a portion of the display cathode electrode DCE, and correspond to a partial area of the pixel area PA adjacent to the second transmission area TA2.

Referring to FIG. 29, the first to fourth data lines DL1 to DL4 may be disposed to overlap the display cathode electrode DCE. The first and second data lines DL1 and DL2 of the first to fourth data lines DL1 to DL4 may be disposed between the reference voltage line RVL and the base voltage line BVL, and the third and fourth data lines DL3 and DL4 may be disposed between the reference voltage line RVL and the driving voltage line DVL.

Referring to FIG. 29, the first touch lines TL1 may be disposed to overlap the display cathode electrode DCE. The first touch line TL1 may be disposed between an edge of the display cathode electrode DCE and the base voltage line BVL, or between the edge of the display cathode electrode DCE and the driving voltage line DVL.

Referring to the example of FIG. 29, the first to third touch lines TL1 to TL3 may be disposed between an edge of the display cathode electrode DCE and the base voltage line BVL, and the fourth to sixth touch lines TL4 to TL6 may be disposed between another edge of the display cathode electrode DCE and the driving voltage line DVL.

Referring to FIG. 29, the display cathode electrode DCE may include the electrode protrusion DCE_PRT, and the first touch cathode electrode TCE1 may include the electrode groove TCE_GRV to which the electrode protrusion DCE_PRT of the display cathode electrode DCE is inserted.

Referring to FIG. 29, the base voltage line BVL may include the line protrusion BVLs_PRT overlapping the electrode protrusion DCE_PRT of the display cathode electrode DCE. The line protrusion BVLs_PRT of the base voltage line BVL may be electrically connected to the electrode protrusion DCE_PRT of the display cathode electrode DCE.

Referring to FIG. 29, the line protrusion BVLs_PRT of the base voltage line BVL may overlap the first to third touch lines TL1 to TL3. The first to third touch lines TL1 to TL3 may also overlap the first scan signal line SCL.

Referring to FIG. 29, the first to third touch lines TL1 to TL3 may include the light shield metal, which is the first metal, and the line protrusion BVLs_PRT of the base voltage line BVL may include the source-drain metal, which is the third metal. Accordingly, even when the line protrusion BVLs_PRT of the base voltage line BVL overlaps the first to third touch lines TL1 to TL3, the line protrusion BVLs_PRT of the base voltage line BVL may be electrically disconnected with the first to third touch lines TL1 to TL3.

Figure 30:
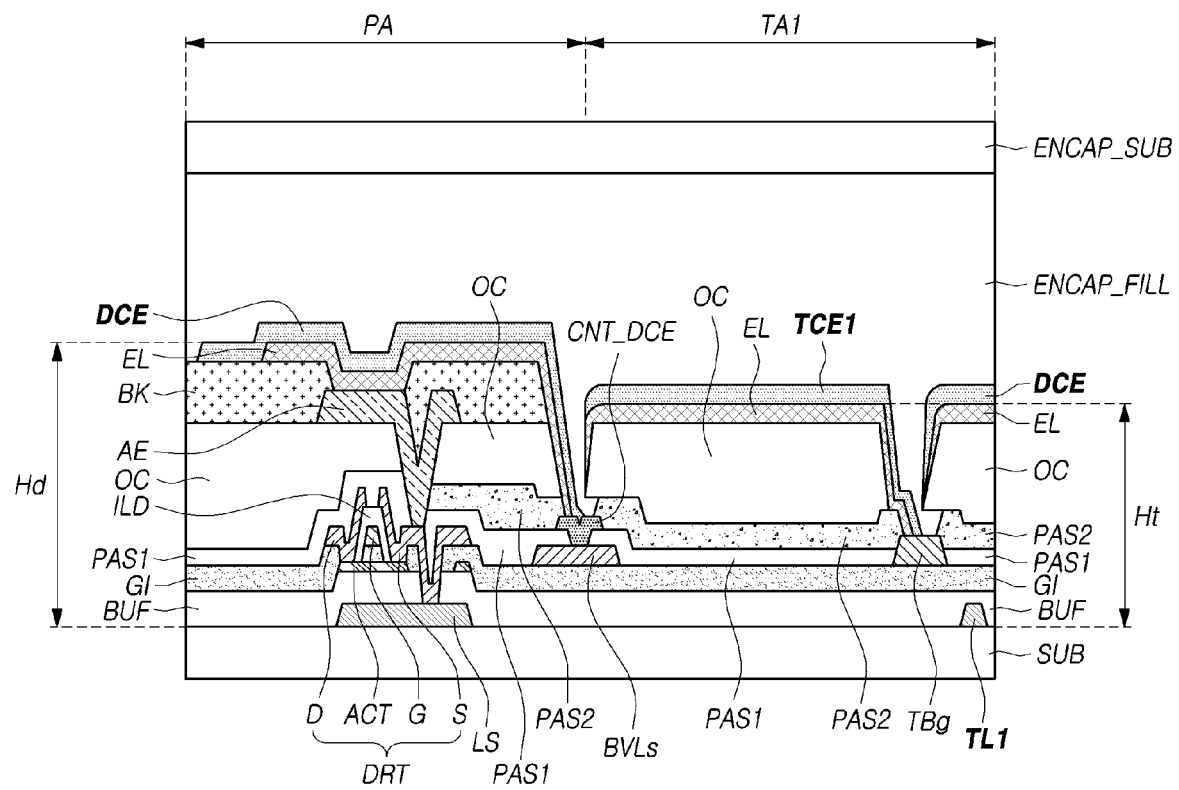
FIG. 30 is further another plan view of the display panel of the transparent touch display device according to aspects of the present disclosure.

FIG. 30 is another plan view of the display panel 110 of the transparent touch display device 100 according to aspects of the present disclosure. It should be noted that the vertical structure in the plan view of FIG. 30 is nearly the same as the vertical structure in the plan view of FIG. 23. Only the locations of touch lines in the vertical structure of FIG. 30 are slightly different from the locations of the touch lines in the vertical structure of FIG. 23. Hereinafter, discussions on the structure of FIG. 30 will be conducted by focusing on features different from the structure of FIG. 23.

Referring to FIG. 30, the first touch line TL1 may be located, for example, in the first metal layer (the light shield metal layer) in which the light shield LS is disposed.

In another example, the first touch line TL1 may be located in the fourth metal layer different from the first metal layer. The fourth metal layer may be a metal layer located between the third metal layer (the source-drain metal layer) in which the source electrode or drain electrode of the driving transistor DRT is located and the pixel electrode layer in which the anode electrode AE is located.

Referring to FIGS. 30 and 29 together, the first touch line TL1 may overlap the display cathode electrode DCE and be disposed in the first transmission area TA1. In comparison to this, the first touch line TL1 in FIG. 23 may overlap the display cathode electrode DCE and be disposed in the pixel area PA.

Figure 31:
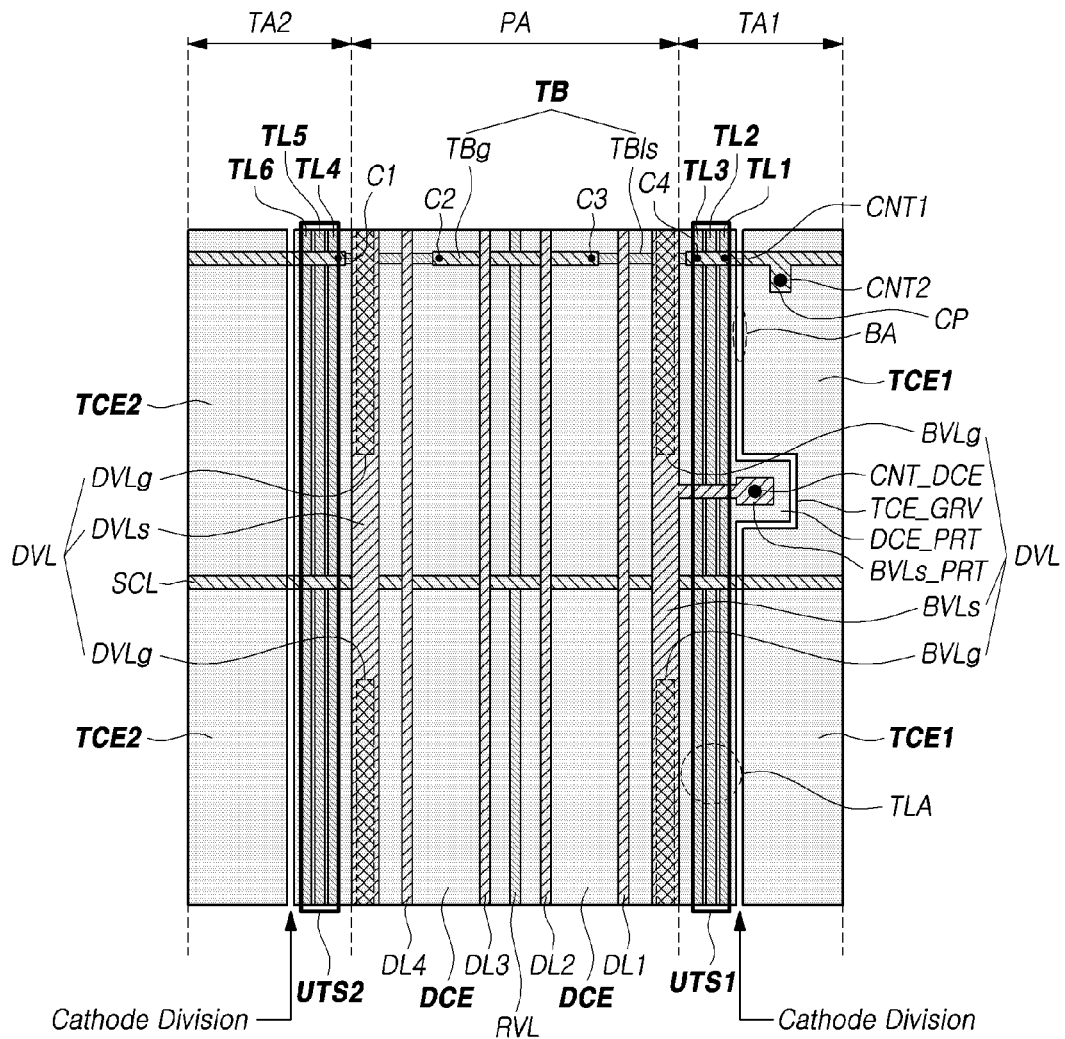
FIG. 31 is a plan view of the display panel in a case where a touch shield structure is applied to the display panel of FIG. 29.
Figure 32:
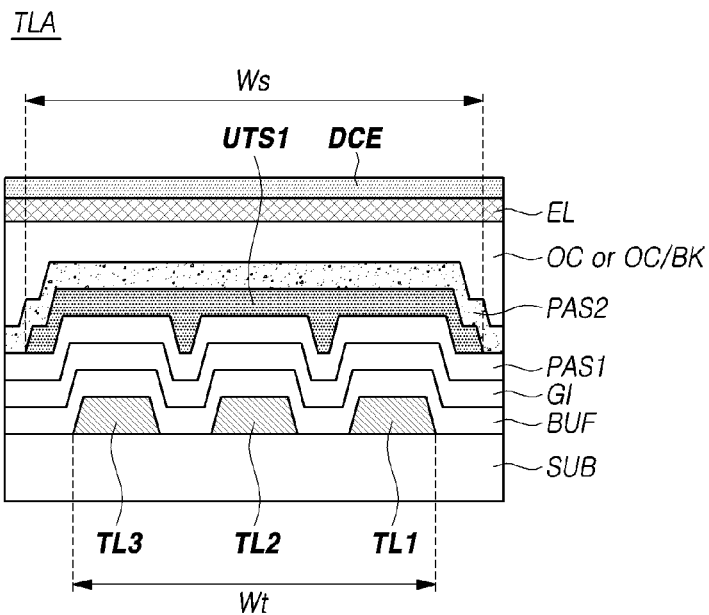
FIG. 32 is a cross-sectional view of a column line area of the display panel of FIG. 31.
Figure 33:
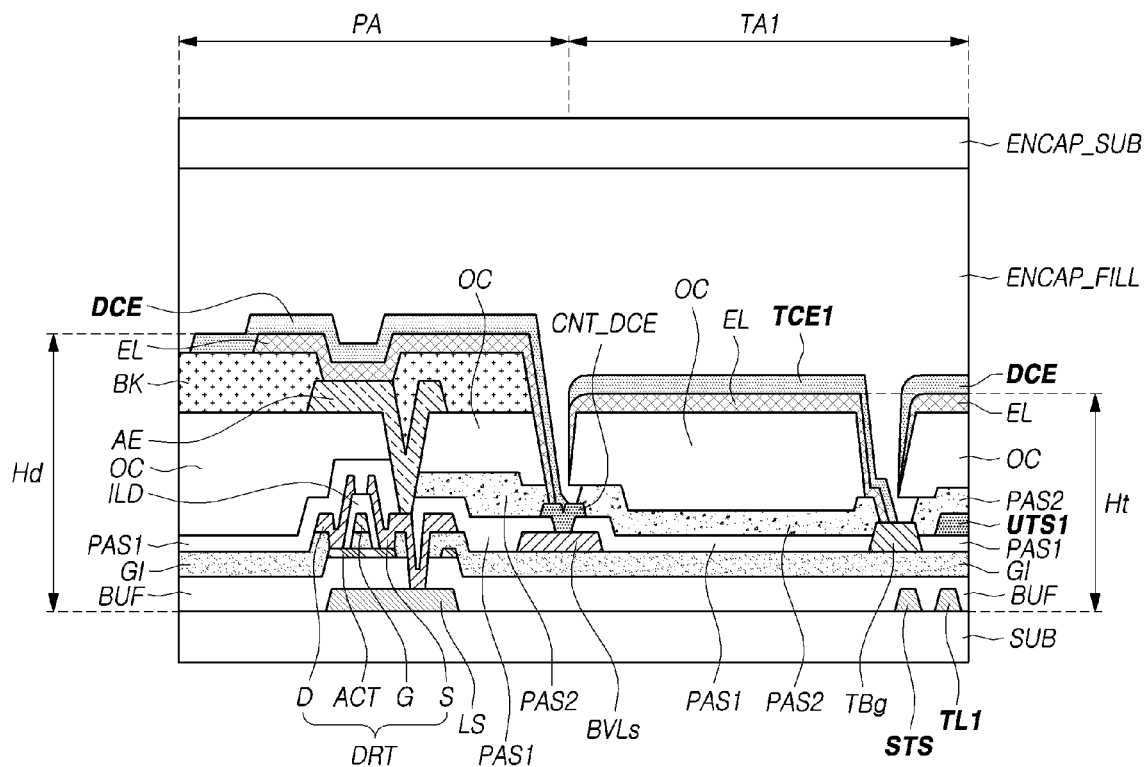
FIG. 33 is a cross-sectional view of the display panel of FIG. 31.

FIG. 31 is a plan view of the display pane 110 in a case where a touch shield structure is applied to the display panel 110 of FIG. 29. FIG. 32 is a cross-sectional view of a column line area of the display panel 110 of FIG. 31. FIG. 33 is a cross-sectional view of the display panel 110 of FIG. 31.

Referring to FIGS. 31 to 33, in some embodiments, the touch shield structure included in the display panel 110 of the transparent touch display device 100 may include the first upper touch shield UTS1 disposed over the first to third touch lines TL1 to TL3.

Referring to FIGS. 31 to 33, in some embodiments, the touch shield structure included in the display panel 110 of the transparent touch display device 100 may further include the second upper touch shield UTS2 disposed on the fourth to sixth touch lines TL4 to TL6.

Referring to FIGS. 31 to 33, the first upper touch shield UTS1 may overlap the first to third touch lines TL1 to TL3, which are classified into a first group. The second upper touch shield UTS2 may overlap the fourth to sixth touch lines TL4 to TL6, which are classified into a second group.

Referring to FIGS. 31 to 33, the first to third touch lines TL1 to TL3 and the first upper touch shield UTS1 may overlap the display cathode electrode DCE. Referring to FIGS. 31 to 33, the fourth to sixth touch lines TL4 to TL6 and the second upper touch shield UTS2 may overlap the display cathode electrode DCE.

Referring to FIG. 31, in some embodiments, the display panel 110 of the transparent touch display device 100 may include the driving voltage line DVL disposed in the pixel area PA and overlapping the display cathode electrode DCE, and the base voltage line BVL disposed in the pixel area PA, overlapping the display cathode electrode DCE, and electrically connected to the display cathode electrode DCE.

Referring to FIG. 31, the first touch line TL1 and the first upper touch shield UTS1 may be disposed between the base voltage line BVL and a first side or edge of the display cathode electrode DCE, or between the driving voltage line DVL and a second side or edge of the display cathode electrode DCE.

Referring to FIG. 31, in some embodiments, in the display panel 110 of the transparent touch display device 100, the first upper touch shield UTS1 and the second upper touch shield UTS2 may overlap at least a portion of the display cathode electrode DCE.

Referring to FIG. 31, the plurality of touch lines TL1 to TL6 overlapping the display cathode electrode DCE may be classified into the first group and the second group. All of the two or more touch lines (TL1, TL2, TL3) classified into the first group among the plurality of touch lines TL1 to TL6 may overlap the first upper touch shield UTS1. All of the two or more touch lines (TL4, TL5, TL6) classified into the second group among the plurality of touch lines TL1 to TL6 may overlap the second upper touch shield UTS2.

Referring to FIG. 31, the two or more touch lines (TL1, TL2, TL3) classified into the first group may be disposed between the base voltage line BVL and the first side or edge of the display cathode electrode DCE. The two or more touch lines (TL4, TL5, TL6) classified into the second group may be disposed between the driving voltage line DVL and the second side or edge of the display cathode electrode DCE.

Referring to FIGS. 31 and 32, a line width Ws of the first upper touch shield UTS1 may be greater than a width Wt of an area in which the two or more touch lines (TL1, TL2, TL3) classified into the first group are disposed. A line width of the second upper touch shield UTS2 may be greater than a width Wt of an area in which the two or more touch lines (TL4, TL5, TL6) classified into the second group are disposed.

Referring to FIG. 33, in some embodiments, in the display panel 110 of the transparent touch display device 100, the side touch shield STS may include the same material as the first touch line TL1. For example, the side touch shield STS and the first touch line TL1 may be disposed in the light shield metal layer, which is the first metal layer.

Referring to FIG. 33, the side touch shield STS may be located, among the first side or edge of the first touch line TL1 and the second side or edge opposite to the first side or edge, to be adjacent to the second side or edge closer to the anode electrode AE than the first side or edge. As such, as the side touch shield STS is disposed between the anode electrode AE and the first touch line TL1, coupling noise that may be formed between the anode electrode AE and the first touch line TL1 can be prevented by the side touch shield STS.

Figure 34:
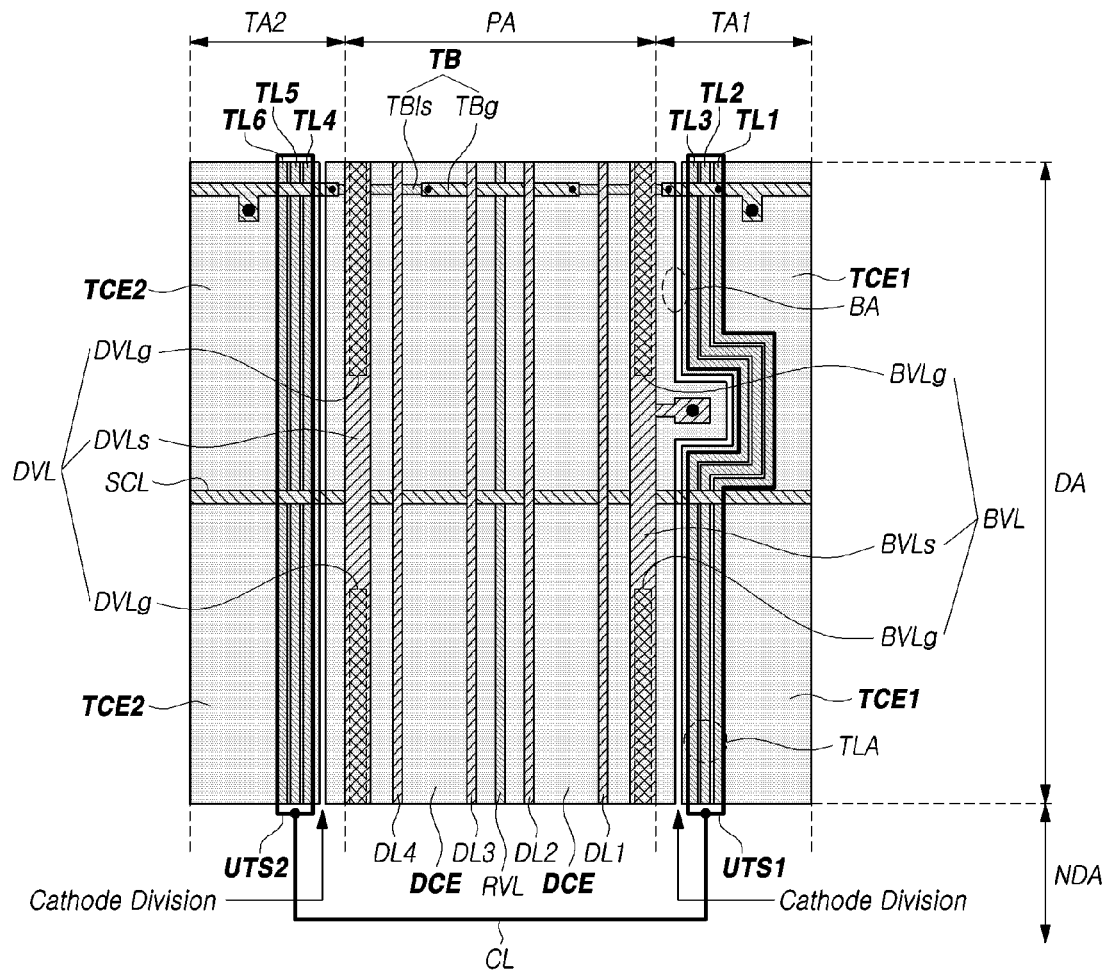
FIG. 34 illustrates an example shield driving structure of the display panel of the transparent touch display device according to aspects of the present disclosure.

FIG. 34 illustrates an example shield driving structure of the display panel of the transparent touch display device 100 according to aspects of the present disclosure. For convenience of description, the shield driving structure of FIG. 34 will be described using the structure in the plan view of FIG. 18.

Referring to FIG. 34, the display panel 110 includes the display area DA for displaying an image and the non-display area NDA located outside of the display area DA. The pixel area PA, the first transmission area TA1, and the second transmission area TA2 may be included in the display area DA.

Referring to FIG. 34, the display panel 110 may include the first upper touch shield UTS1 disposed over the first touch line TL1 and overlapping the first touch line TL1, and the second upper touch shield UTS2 disposed over another touch line (e.g., TL4 in the example of FIG. 34) different from the first touch line TL1 and overlapping the other touch line.

In the example of FIG. 34, each of the first upper touch shield UTS1 and the second upper touch shield UTS2 may overlap the plurality of touch lines. In comparison to this, each of the first upper touch shield UTS1 and the second upper touch shield UTS2 may overlap one touch line as illustrated FIG. 26. A shield driving structure and a shield driving method to be described below may be equally applied to the structure in which each of the first upper touch shield UTS1 and the second upper touch shield UTS2 overlaps one touch line.

Referring to FIG. 34, the first upper touch shield UTS1 and the second upper touch shield UTS2 may be disposed in the display area DA.

Referring to FIG. 34, the display panel 110 may further include a connection line CL for electrically connecting the first upper touch shield UTS1 and the second upper touch shield UTS2 disposed in the display area DA. The connection line CL may be disposed in the non-display area NDA.

Figure 35:
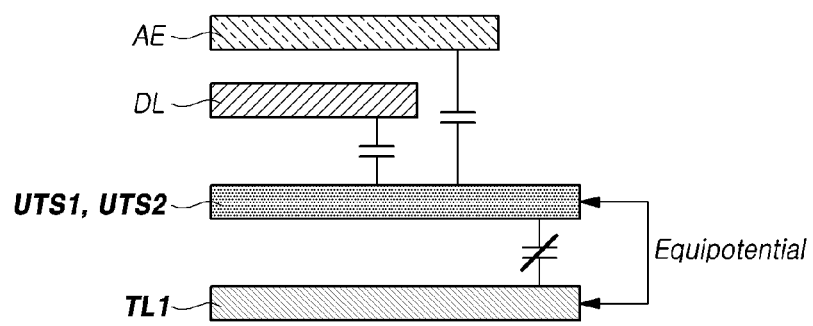
FIG. 35 illustrates shield driving of the transparent touch display device according to aspects of the present disclosure.

FIG. 35 illustrates the shield driving of the transparent touch display device 100 according to aspects of the present disclosure.

Referring to FIG. 35, in some embodiments, the transparent touch display device 100 may include the first upper touch shield UTS1 and can drive the first upper touch shield UTS1 in order to reduce coupling noise between the first touch line TL1 and one or more neighboring display driving related patterns.

Figure 37:
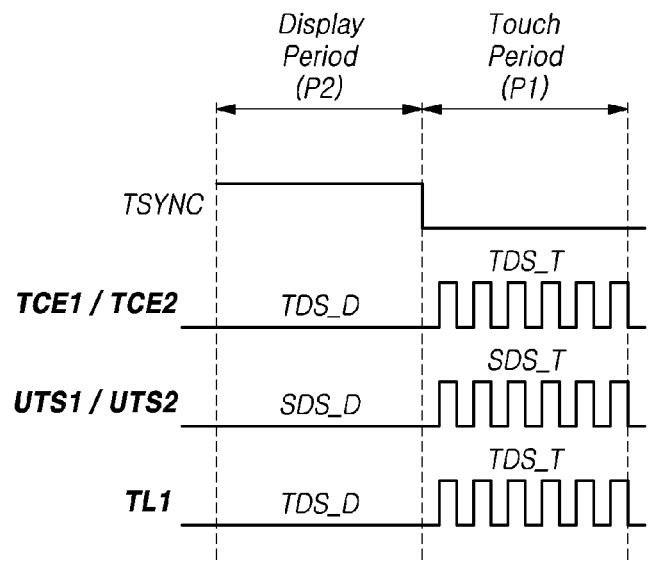
FIG. 37 is a driving timing diagram of the transparent touch display device according to aspects of the present disclosure.

In some embodiments, according to the touch shield driving of the transparent touch display device 100, the first upper touch shield UTS1 may have an equipotential with the first touch line TL1. It should be understood that having an "equipotential" includes the meaning of being biased at or carrying the same voltage. For example, as shown in FIG. 37, voltage applied to the first upper touch shield UTS1 may be the same as voltage applied to the first touch line TL1.

Since the first upper touch shield UTS1 is electrically connected to the second upper touch shield UTS2 through the connection line CL, the first upper touch shield UTS1 and the second upper touch shield UTS2 can have an equipotential with the touch line TL1.

Accordingly, parasitic capacitance between the first upper touch shield UTS1 and the first touch line TL1 cannot be formed or is drastically reduced, and parasitic capacitance between the second upper touch shield UTS2 electrically connected to the first upper touch shield UTS1 through the connection line CL and the first touch line TL1 cannot be formed or is drastically reduced. Accordingly, a resistance capacitance (RC) value of the first touch line TL1 may be reduced.

In turn, the first touch cathode electrode TCE1 and the second touch cathode electrode TCE2 electrically connected to the first touch line TL1 may also have an equipotential with the first upper touch shield UTS1 and the second upper touch shield UTS2. As a result, undesired parasitic capacitances caused by the first touch cathode electrode TCE1 and the second touch cathode electrode TCE2, which are included in one first touch electrode TE, can be reduced.

Meanwhile, the side touch shield STS located adjacent to the first touch line TL1 may have an equipotential with the first touch line TL1. The side touch shield STS may have an equipotential with the first touch cathode electrode TCE1 and the second touch cathode electrode TCE2.

Figure 36:
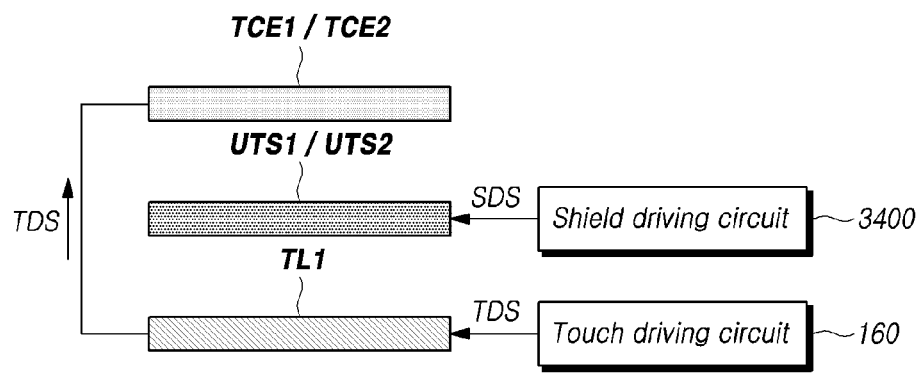
FIG. 36 illustrates a touch driving circuit and a shield driving circuit of the transparent touch display device according to aspects of the present disclosure.

FIG. 36 illustrates the touch driving circuit 160 and a shield driving circuit 3400 of the transparent touch display device 100 according to aspects of the present disclosure.

Referring to FIG. 36, in some embodiments, the transparent touch display device 100 may include the touch driving circuit 160 for driving the first touch cathode electrode TCE1 and the second touch cathode electrode TCE2 through the first touch line TL1.

The touch driving circuit 160 may be electrically connected to the first touch line TL1 and can output a touch driving signal TDS to the first touch line TL1. The touch driving signal TDS may be applied to the first touch cathode electrode TCE1 and the second touch cathode electrode TCE2 through the first touch line TL1.

Referring to FIG. 36, in some embodiments, the transparent touch display device 100 may include the touch driving circuit 3400 for driving the first upper touch shield UTS1 and the second upper touch shield UTS2 through the connection line CL.

Referring to FIG. 36, the shield driving circuit 3400 may be electrically connected to the first upper touch shield UTS1 and the second upper touch shield UTS2 through the connection line CL, and be configured to output a shield driving signal SDS to the connection line CL.

The shield driving signal SDS may be applied to the first upper touch shield UTS1 and the second upper touch shield UTS2 through the connection line CL. The shield driving signal SDS may have an equipotential with the touch driving signal TDS applied to the first touch line TL1.

The touch driving signal TDS may be a signal having a constant voltage level or a signal having a variable voltage level.

The shield driving signal SDS may be synchronized with the touch driving signal TDS.

When the touch driving signal TDS is a signal whose voltage level is constant, the shield driving signal SDS may have the same voltage value as a constant voltage value of the touch driving signal TDS.

When the touch driving signal TDS is a signal whose voltage level varies between a first voltage value and a second voltage value, the voltage level of the shield driving signal SDS may also swing between the first voltage value and the second voltage value. A timing at which a voltage level of the touch driving signal TDS varies may be synchronized with a timing at which a voltage level of the shield driving signal SDS varies.

FIG. 37 is a driving timing diagram of the transparent touch display device 100 according to aspects of the present disclosure.

Referring to FIG. 37, in some embodiments, the transparent touch display device 100 can perform display driving and touch driving in time division multi-driving.

Referring to FIG. 37, the transparent touch display device 100 can perform touch sensing during a first period P1 and perform display driving during a second period P2 different from the first period P1.

Referring to FIG. 37, the first period P1 and the second period P2 may be defined according to the touch synchronization signal TSYNC. The touch controller 170 or the display controller 140 can output the touch synchronization signal TSYNC to the display driving circuit, the touch driving circuit 160, and the shield driving circuit 3400. The display driving circuit may include, for example, the data driving circuit 120 and/or the gate driving circuit 130.

Referring to FIG. 37, the touch synchronization signal TSYNC may be a control signal swinging between a first level of voltage and a second level of voltage. For example, the first level of voltage may be a low level of voltage, and the second level of voltage may be a high level of voltage. In another example, the first level of voltage may be a high level of voltage, and the second level of voltage may be a low level of voltage.

Referring to FIG. 37, when the touch synchronization signal TSYNC is at the first level of voltage, the display driving circuit, the touch driving circuit 160, and the shield driving circuit 3400 can recognize a corresponding driving period as a first period P1 for touch sensing. When the touch synchronization signal TSYNC is at the second level of voltage, the display driving circuit, the touch driving circuit 160, and the shield driving circuit 3400 can recognize a corresponding driving period as a second period P2 for display driving.

Referring to FIG. 37, when a touch driving signal TDS_T having a variable voltage level is applied to the first touch line TL1 during the first period P1, a shield driving signal SDS_T whose voltage level varies in synchronization with the touch driving signal TDS_T, may be applied to the connection line CL. During the first period P1, the shield driving signal SDS_T applied to the connection line CL may be applied to the first upper touch shield UTS1 and the second upper touch shield UTS2.

Referring to FIG. 37, the shield driving signal SDS_T and the touch driving signal TDS_T in the first period P1 may be in an equipotential state and in an in-phase state. That is, the state where the shield driving signal SDS_T and the touch driving signal TDS_T in the first period P1 are in phase may mean that the shield driving signal SDS_T and the touch driving signal TDS_T have the same frequency and the same amplitude, and there is no phase difference between the shield driving signal SDS_T and the touch driving signal TDS_T.

Referring to FIG. 37, when a touch driving signal TDS_D having a constant voltage level is applied to the first touch line TL1 during a second period P2 different from the first period P1, a shield driving signal SDS_D having a constant voltage level may be applied to the connection line CL. During the second period P2, the shield driving signal SDS_D applied to the connection line CL may be applied to the first upper touch shield UTS1 and the second upper touch shield UTS2.

Referring to FIG. 37, since the shield driving signal SDS_D and the touch driving signal TDS_D in the second period P2 are in the equipotential state, the shield driving signal SDS_D and the touch driving signal TDS_D may have the same voltage value.

The transparent touch display device 100 according to the embodiments described herein may perform display driving and touch driving in time division multi-driving entirely or partially, or/and may simultaneously perform display driving and touch driving entirely or partially.

According to the embodiments described herein, the transparent touch display device can be provided that includes the touch sensor integrated display panel having excellent self-emissive performance and high transmittance and enabling accurate touch sensing.

According to the embodiments described herein, the transparent touch display device can be provided in which the touch sensor is configured to have two or more cathode electrodes divided in the cathode electrode layer.

According to the embodiments described herein, the transparent touch display device can be provided in which the touch sensor is integrated into the display panel without affecting the transmittance of the display panel.

According to the embodiments described herein, the transparent touch display device can be provided capable of reducing the complexity of a panel manufacturing process and reducing the thickness of the display panel.

According to the embodiments described herein, when the light emitting element and the touch sensor are disposed in the display panel, by disposing a touch line in a metal layer that is farthest away from the anode electrode of the light emitting element, the transparent touch display device can be provided that is capable of maximally reducing the effect of the driving of the light emitting element on the touch sensing.

According to the embodiments described herein, the transparent touch display device can be provided that is capable of reducing or preventing the occurrence of parasitic capacitance in touch lines disposed on the display panel.

According to the embodiments described herein, the transparent touch display device can be provided that is capable of reducing or eliminating influences between display driving and touch driving, and thereby enabling accurate touch sensing and producing high image quality, by employing the touch shield structure capable of reducing or eliminating coupling noise caused between one or more touch lines and one or more surrounding display driving related patterns.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent touch display device comprising:
    a display panel including a plurality of sub-pixels and a plurality of touch electrodes; and
    a touch driving circuit for driving the plurality of touch electrodes,
    wherein the display panel includes:
        a substrate including a pixel area in which at least one of the plurality of sub-pixels is disposed, a first transmission area located on a first side of the pixel area, and a second transmission area located on a second side of the pixel area;
        a driving transistor disposed in the pixel area;
        an anode electrode disposed in the pixel area and electrically connected to a source electrode or a drain electrode of the driving transistor;
        an emission layer located on the anode electrode;
        a display cathode electrode located on the emission layer;
        a first touch cathode electrode disposed in the first transmission area and located on a first side of the display cathode electrode;
        a second touch cathode electrode disposed in the second transmission area and located on a second side of the display cathode electrode;
        a first touch line electrically connected to at least one of the first touch cathode electrode and the second touch cathode electrode; and
        a first upper touch shield disposed over the first touch line and overlapped with at least a portion of the first touch line, wherein the first upper touch shield has an equipotential with the first touch line,
        wherein a maximum separation distance between the first touch cathode electrode and the substrate and a maximum separation distance between the second touch cathode electrode and the substrate each is shorter than a maximum separation distance between the display cathode electrode and the substrate.

2. The transparent touch display device according to claim 1, further comprising a second upper touch shield disposed over another touch line different from the first touch line and overlapped with the another touch line,
    wherein the second upper touch shield has an equipotential with the first touch line.

3. The transparent touch display device according to claim 2, wherein the display panel comprises a display area for displaying an image and a non-display area outside of the display area, and further comprises a connection line for electrically connecting the first upper touch shield and the second upper touch shield to each other, and
    wherein the first upper touch shield and the second upper touch shield are disposed in the display area, and the connection line is disposed in the non-display area.

4. The transparent touch display device according to claim 3, further comprising a shield driving circuit that is electrically connected to the first upper touch shield and the second upper touch shield through the connection line and is configured to output a shield driving signal,
    wherein the shield driving signal has an equipotential with a signal applied to the first touch line.

5. The transparent touch display device according to claim 3, wherein during a first period, a touch driving signal having a variable voltage level is applied to the first touch line, and a shield driving signal whose voltage level varies in synchronization with the touch driving signal is applied to the connection line, and
    wherein the shield driving signal and the touch driving signal are in an equipotential state and in an in-phase state.

6. The transparent touch display device according to claim 1, wherein the first upper touch shield is disposed in a metal layer between a source-drain metal layer in which a source electrode or a drain electrode of the driving transistor is disposed and a pixel electrode layer in which the anode electrode is disposed.

7. The transparent touch display device according to claim 1, wherein the first touch line and the first upper touch shield overlap the display cathode electrode.

8. The transparent touch display device according to claim 7, further comprising:
    a driving voltage line disposed in the pixel area and overlapped with the display cathode electrode; and
    a base voltage line disposed in the pixel area, overlapped with the display cathode electrode, and electrically connected to the display cathode electrode,
    wherein the first touch line and the first upper touch shield are disposed between the driving voltage line and the base voltage line.

9. The transparent touch display device according to claim 8, further comprising:
    a second touch line overlapped with the display cathode electrode;
    a display line disposed between the first touch line and the second touch line and located in a different layer from the first touch line and the second touch line; and
    a second upper touch shield disposed over the second touch line and overlapped with the second touch line.

10. The transparent touch display device according to claim 7, further comprising:
    a driving voltage line disposed in the pixel area and overlapped with the display cathode electrode; and
    a base voltage line disposed in the pixel area, overlapped with the display cathode electrode, and electrically connected to the display cathode electrode,
    wherein the first touch line and the first upper touch shield are disposed between the base voltage line and a first edge of the display cathode electrode, or disposed between the driving voltage line and a second edge of the display cathode electrode.

11. The transparent touch display device according to claim 10, further comprising:
    a second upper touch shield different from the first touch line; and
    a plurality of touch lines overlapped with the display cathode electrode,
    wherein the plurality of touch lines includes a first group and a second group, and all of touch lines of the first group among the plurality of touch lines overlap the first upper touch shield, and all of touch lines of the second group among the plurality of touch lines overlap the second upper touch shield, and wherein a line width of the first upper touch shield is greater than a width of an area in which two or more touch lines of first group are disposed, and a line width of the second upper touch shield is greater than a width of an area in which two or more touch lines of the second group are disposed.

12. The transparent touch display device according to claim 1, further comprising a first touch bridge that runs across the pixel area and electrically connects the first touch cathode electrode and the second touch cathode electrode,
wherein the first touch bridge overlaps the first touch line and is electrically connected to the first touch line.

13. The transparent touch display device according to claim 1, wherein the display cathode electrode includes an electrode protrusion, the first touch cathode electrode includes an electrode groove in which the electrode protrusion of the display cathode electrode is inserted.

14. The transparent touch display device according to claim 1, wherein a portion of a first edge of the display cathode electrode extends up to an inside space of the first transmission area, and a portion of a second edge of the display cathode electrode extends up to an inside space of the second transmission area.

15. The transparent touch display device according to claim 1, further comprising a reference voltage line disposed in the pixel area, overlapping the display cathode electrode and disposed in a center area of the display cathode electrode and a dummy line overlapping the display cathode electrode,
wherein the first touch line is disposed between a first side of the display cathode electrode and the reference voltage line, and the dummy line is disposed between a second side of the display cathode electrode and the reference voltage line, and
wherein the dummy line has a different electrical state from the first touch line.

16. The transparent touch display device according to claim 1, wherein the first touch line overlaps the emission layer.

17. A transparent touch display device comprising:
a display panel including a plurality of sub-pixels and a plurality of touch electrodes; and
a touch driving circuit for driving the plurality of touch electrodes,
wherein the display panel includes:
  a substrate including a pixel area in which at least one of the plurality of sub-pixels is disposed, a first transmission area located on a first side of the pixel area, and a second transmission area located on a second side of the pixel area;
  a driving transistor disposed in the pixel area;
  an anode electrode disposed in the pixel area and electrically connected to a source electrode or a drain electrode of the driving transistor;
  an emission layer located on the anode electrode;
  a display cathode electrode located on the emission layer;
  a first touch cathode electrode disposed in the first transmission area and located on a first side of the display cathode electrode;
  a second touch cathode electrode disposed in the second transmission area and located on a second side of the display cathode electrode;
  a first touch line electrically connected to at least one of the first touch cathode electrode and the second touch cathode electrode;
  a first upper touch shield disposed over the first touch line and overlapped with at least a portion of the first touch line, wherein the first upper touch shield has an equipotential with the first touch line; and
  a side touch shield located adjacent to the first touch line,
wherein the side touch shield includes a same material as the first touch line, and
wherein the side touch shield is located between a first side surface of the first touch line and a second side surface opposite to the first side surface and is positioned to be adjacent to the second side surface closer to the anode electrode than the first side surface.

18. A transparent touch display device comprising:
a display panel including a plurality of sub-pixels and a plurality of touch electrodes; and
a touch driving circuit for driving the plurality of touch electrodes,
wherein the display panel includes:
  a substrate including a pixel area in which at least one of the plurality of sub-pixels is disposed, a first transmission area located on a first side of the pixel area, and a second transmission area located on a second side of the pixel area;
  a driving transistor disposed in the pixel area;
  an anode electrode disposed in the pixel area and electrically connected to a source electrode or a drain electrode of the driving transistor;
  an emission layer located on the anode electrode;
  a display cathode electrode located on the emission layer;
  a first touch cathode electrode disposed in the first transmission area and located on a first side of the display cathode electrode;
  a second touch cathode electrode disposed in the second transmission area and located on a second side of the display cathode electrode;
  a first touch line electrically connected to at least one of the first touch cathode electrode and the second touch cathode electrode;
  a first upper touch shield disposed over the first touch line and overlapped with at least a portion of the first touch line, wherein the first upper touch shield has an equipotential with the first touch line; and
  a lower layer located under the display cathode electrode,
wherein the lower layer has an under-cut structure in which a lower portion of the lower layer is recessed inwardly or inwardly and downwardly,
wherein at a point where the lower layer has the under-cut structure, the display cathode electrode and the first touch cathode electrode are electrically disconnected, and
wherein at another point where the lower layer has the under-cut structure, the display cathode electrode and the second touch cathode electrode are electrically disconnected.

19. A transparent touch display device comprising:
a display panel including a plurality of sub-pixels and a plurality of touch electrodes; and
a touch driving circuit for driving the plurality of touch electrodes,
wherein the display panel includes:

a substrate including a pixel area in which at least one of the plurality of sub-pixels is disposed, a first transmission area located on a first side of the pixel area, and a second transmission area located on a second side of the pixel area;

a driving transistor disposed in the pixel area;

an anode electrode disposed in the pixel area and electrically connected to a source electrode or a drain electrode of the driving transistor;

an emission layer located on the anode electrode;

a display cathode electrode located on the emission layer;

a first touch cathode electrode disposed in the first transmission area and located on a first side of the display cathode electrode;

a second touch cathode electrode disposed in the second transmission area and located on a second side of the display cathode electrode;

a first touch line electrically connected to at least one of the first touch cathode electrode and the second touch cathode electrode;

a first upper touch shield disposed over the first touch line and overlapped with at least a portion of the first touch line, wherein the first upper touch shield has an equipotential with the first touch line; and a dummy line overlapping the second touch cathode electrode, wherein the dummy line has a different electrical state from the first touch line.

20. A transparent touch display device comprising:

a substrate including a pixel area, a first transmission area located on a first side of the pixel area, and a second transmission area located on a second side of the pixel area;

a display cathode electrode to which a base voltage for display driving is applied;

a first touch cathode electrode located on a first side of the display cathode electrode and including a same material as the display cathode electrode;

a second touch cathode electrode located on a second side of the display cathode electrode and including the same material as the display cathode electrode;

a first touch bridge that runs across the pixel area and electrically connects the first touch cathode electrode and the second touch cathode electrode to each other;

a first touch line overlapping the first touch bridge and electrically connected to at least one of the first touch cathode electrode and the second touch cathode electrode;

a first contact hole, the first touch line being connected to the first touch bridge through the first contact hole; and a first upper touch shield disposed over the first touch line and overlapped with at least a portion of the first touch line, wherein the first upper touch shield has an equipotential with the first touch line.

* * * * *